US010651181B2

(12) United States Patent
Masuoka et al.

(10) Patent No.: US 10,651,181 B2
(45) Date of Patent: May 12, 2020

(54) METHOD FOR PRODUCING PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP); Hiroki Nakamura, Tokyo (JP); Phillipe Matagne, Leuven (BE); Yoshiaki Kikuchi, Leuven (BE)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/372,717

(22) Filed: Apr. 2, 2019

(65) Prior Publication Data
US 2019/0237367 A1 Aug. 1, 2019

Related U.S. Application Data

(63) Continuation of application No. PCT/JP2017/046000, filed on Dec. 21, 2017.

(30) Foreign Application Priority Data

Dec. 28, 2016 (WO) .................. PCT/JP2016/089129

(51) Int. Cl.
*H01L 29/417* (2006.01)
*H01L 29/49* (2006.01)
(Continued)

(52) U.S. Cl.
CPC ...... *H01L 27/1104* (2013.01); *H01L 21/2018* (2013.01); *H01L 21/2253* (2013.01);
(Continued)

(58) Field of Classification Search
None
See application file for complete search history.

(56) References Cited

U.S. PATENT DOCUMENTS 9,385,195 B1 * 7/2016 Zhang ................. H01L 29/0676
9,613,955 B1 * 4/2017 Anderson ........... H01L 27/0886
(Continued)

FOREIGN PATENT DOCUMENTS

JP H02-188966 A 7/1990
JP 2011-029469 2/2011
(Continued)

OTHER PUBLICATIONS

Takato et al., "Impact of Surrounding Gate Transistor (SGT) for Ultra-High-Density LSI's": IEEE Transaction on Electron Devices, vol. 38, No. 3, pp. 573-578 (1991).
(Continued)

*Primary Examiner* — Evren Seven
(74) *Attorney, Agent, or Firm* — Brinks Gilson & Lione

(57) ABSTRACT

The method for producing a pillar-shaped semiconductor device includes a step of forming a tubular $SiO_2$ layer that surrounds side surfaces of a $P^+$ layer 38a and $N^+$ layers 38b and 8c formed on a Si pillar 6b by epitaxial crystal growth, forming an AlO layer 51 on a periphery of the $SiO_2$ layer, forming a tubular contact hole by etching the tubular $SiO_2$ layer using the AlO layer 51 as a mask, and filling the contact hole with W layers 52c, 52d, and 52e to form tubular W layers 52c, 52d, and 52e (including a buffer conductor layer) that have an equal width when viewed in plan and are in contact with side surfaces of the tops of the $P^+$ layer 38a and the $N^+$ layers 38b and 8c.

24 Claims, 28 Drawing Sheets

(51) Int. Cl.
| | |
|---|---|
| H01L 21/308 | (2006.01) |
| H01L 21/8238 | (2006.01) |
| H01L 29/16 | (2006.01) |
| H01L 29/51 | (2006.01) |
| H01L 21/311 | (2006.01) |
| H01L 23/532 | (2006.01) |
| H01L 27/11 | (2006.01) |
| H01L 23/485 | (2006.01) |
| H01L 29/423 | (2006.01) |
| H01L 21/768 | (2006.01) |
| H01L 23/522 | (2006.01) |
| H01L 29/66 | (2006.01) |
| H01L 29/78 | (2006.01) |
| H01L 21/20 | (2006.01) |
| H01L 21/225 | (2006.01) |
| H01L 21/28 | (2006.01) |
| H01L 21/285 | (2006.01) |
| H01L 21/76 | (2006.01) |
| H01L 21/764 | (2006.01) |
| H01L 21/822 | (2006.01) |
| H01L 21/8234 | (2006.01) |
| H01L 23/528 | (2006.01) |
| H01L 29/04 | (2006.01) |
| H01L 29/06 | (2006.01) |
| H01L 29/10 | (2006.01) |
| H01L 29/40 | (2006.01) |

(52) U.S. Cl.
CPC ...... *H01L 21/2255* (2013.01); *H01L 21/2257* (2013.01); *H01L 21/28088* (2013.01); *H01L 21/28114* (2013.01); *H01L 21/28123* (2013.01); *H01L 21/28132* (2013.01); *H01L 21/28518* (2013.01); *H01L 21/28568* (2013.01); *H01L 21/3086* (2013.01); *H01L 21/76* (2013.01); *H01L 21/764* (2013.01); *H01L 21/7684* (2013.01); *H01L 21/76831* (2013.01); *H01L 21/76834* (2013.01); *H01L 21/76877* (2013.01); *H01L 21/76897* (2013.01); *H01L 21/76898* (2013.01); *H01L 21/8221* (2013.01); *H01L 21/823418* (2013.01); *H01L 21/823456* (2013.01); *H01L 21/823475* (2013.01); *H01L 21/823481* (2013.01); *H01L 21/823487* (2013.01); *H01L 21/823807* (2013.01); *H01L 21/823828* (2013.01); *H01L 21/823871* (2013.01); *H01L 23/485* (2013.01); *H01L 23/528* (2013.01); *H01L 23/5226* (2013.01); *H01L 23/5283* (2013.01); *H01L 27/11* (2013.01); *H01L 29/04* (2013.01); *H01L 29/0657* (2013.01); *H01L 29/1037* (2013.01); *H01L 29/16* (2013.01); *H01L 29/401* (2013.01); *H01L 29/41741* (2013.01); *H01L 29/4238* (2013.01); *H01L 29/42356* (2013.01); *H01L 29/42376* (2013.01); *H01L 29/42392* (2013.01); *H01L 29/4966* (2013.01); *H01L 29/517* (2013.01); *H01L 29/66666* (2013.01); *H01L 29/66787* (2013.01); *H01L 29/7827* (2013.01); *H01L 21/31111* (2013.01); *H01L 21/31116* (2013.01); *H01L 21/76805* (2013.01); *H01L 21/76829* (2013.01); *H01L 23/53257* (2013.01); *H01L 29/665* (2013.01)

(56) References Cited

U.S. PATENT DOCUMENTS

| | | | | |
|---|---|---|---|---|
| 9,711,618 | B1* | 7/2017 | Cheng | H01L 29/66545 |
| 9,780,215 | B2* | 10/2017 | Masuoka | H01L 21/02532 |
| 9,972,494 | B1* | 5/2018 | Bentley | H01L 29/66742 |
| 10,431,667 | B2* | 10/2019 | Cheng | H01L 29/7827 |
| 2007/0004149 | A1* | 1/2007 | Tews | H01L 29/66666 438/268 |
| 2010/0219483 | A1* | 9/2010 | Masuoka | H01L 27/0207 257/369 |
| 2010/0301402 | A1* | 12/2010 | Masuoka | H01L 21/26586 257/288 |
| 2011/0291190 | A1* | 12/2011 | Xiao | B82Y 10/00 257/347 |
| 2013/0228833 | A1* | 9/2013 | Xiao | B82Y 10/00 257/288 |
| 2014/0225184 | A1* | 8/2014 | Colinge | H01L 29/7827 257/329 |
| 2015/0129831 | A1* | 5/2015 | Colinge | H01L 29/0676 257/9 |
| 2015/0318288 | A1* | 11/2015 | Lim | H01L 27/1104 257/329 |
| 2017/0323977 | A1* | 11/2017 | Cheng | H01L 29/7827 |
| 2017/0352742 | A1* | 12/2017 | Cheng | H01L 29/66666 |
| 2018/0069131 | A1* | 3/2018 | Balakrishnan | H01L 29/42392 |
| 2018/0083136 | A1* | 3/2018 | Xie | H01L 29/7827 |
| 2018/0090388 | A1* | 3/2018 | Anderson | H01L 29/785 |

FOREIGN PATENT DOCUMENTS

| | | |
|---|---|---|
| WO | WO 2014/203304 | 12/2014 |
| WO | WO 2016/163045 | 10/2016 |

OTHER PUBLICATIONS

Shibata et al., "A New Field Isolation Technology for High Density MOS LSI", Japanese Journal of Applied Physics, vol. 18, pp. 263-267 (1979).
Morimoto et al. "Self-Aligned Nickel-Mono-Silicide Technology for High-Speed Deep Submicrometer Logic CMOS ULSI" IEEE Transaction on Electron Devices, vol. 42, No. 5, pp. 915-922 (1995).
International Preliminary Report on Patentability for International Application No. PCT/JP2017/04600, dated Feb. 20, 2018, 10 pages.
English Translation of the International Preliminary Report on Patentability for Application No. PCT/JP2017/046000, dated Jul. 11, 2019, 9 pages.

* cited by examiner

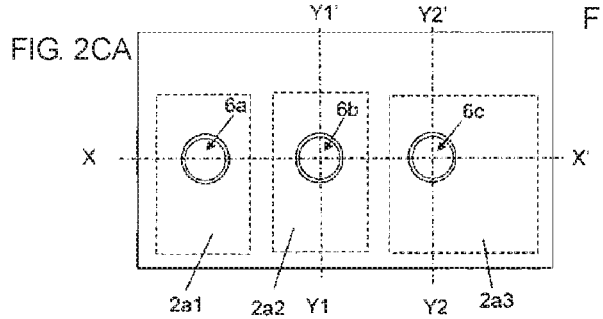
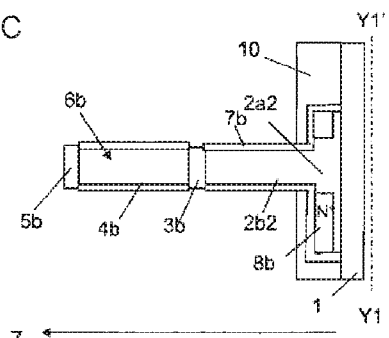
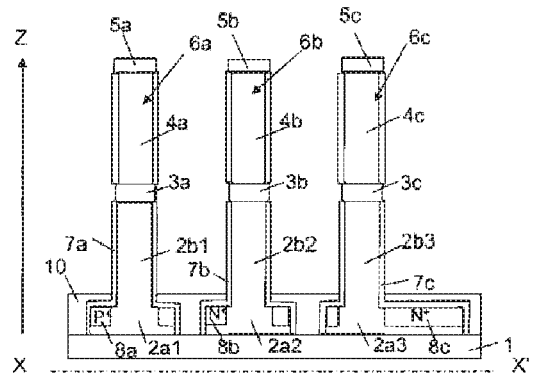
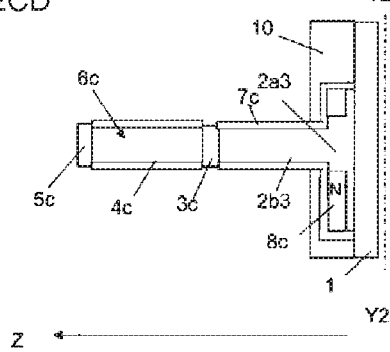
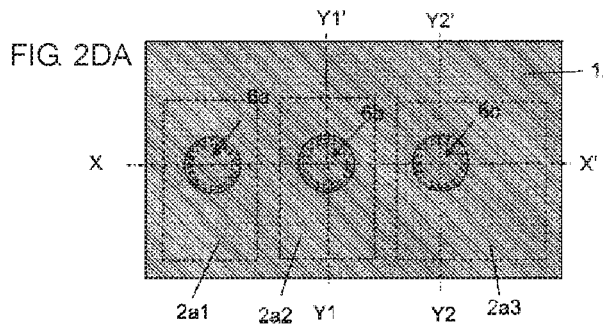
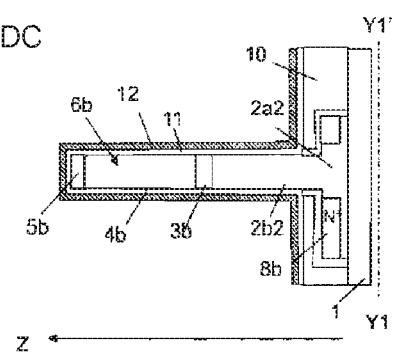
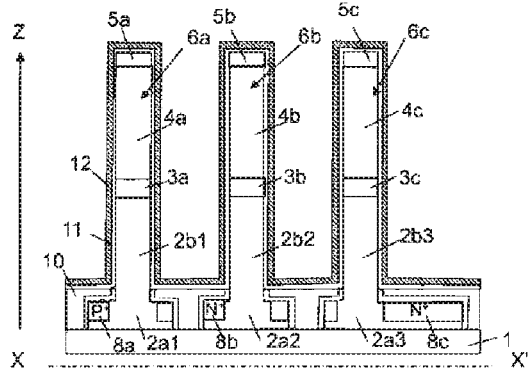
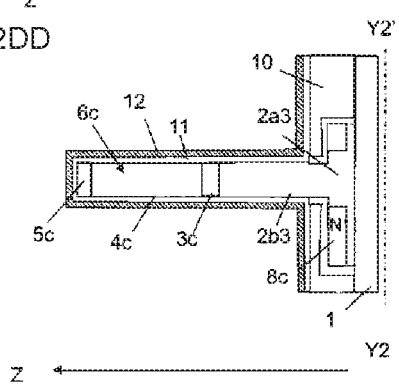

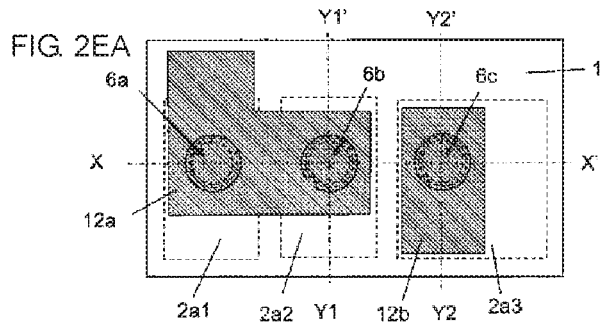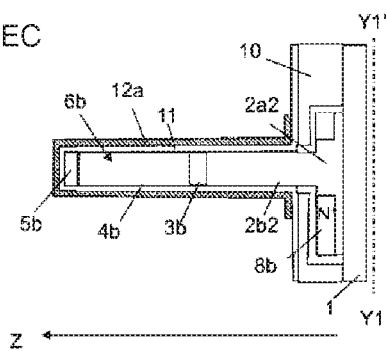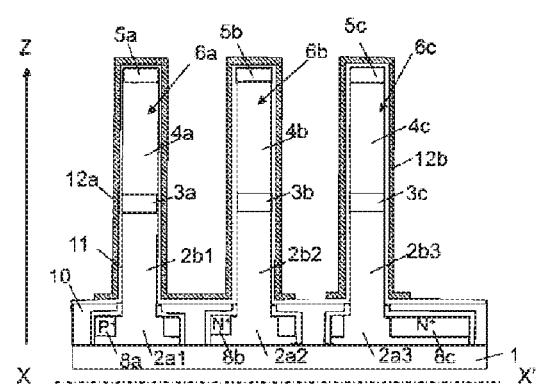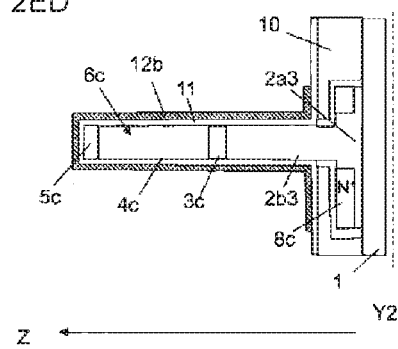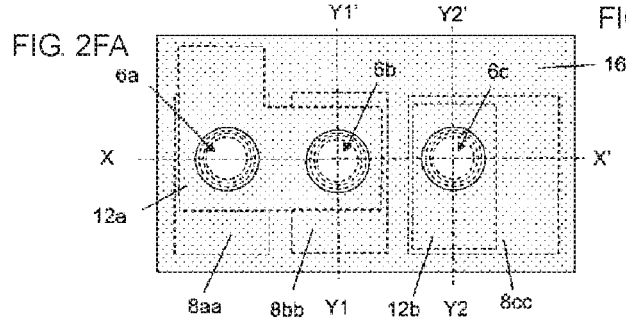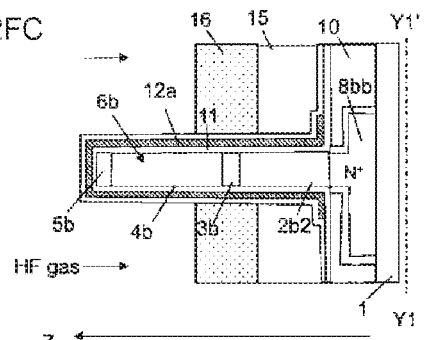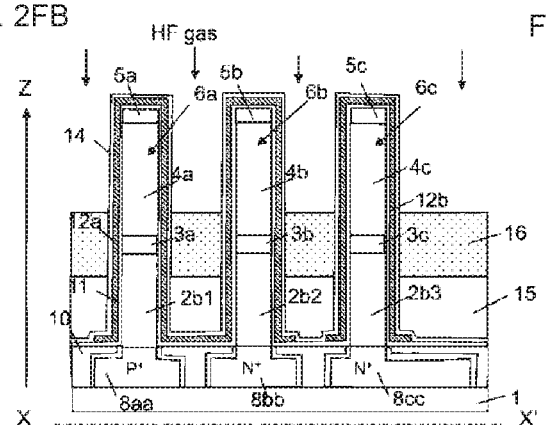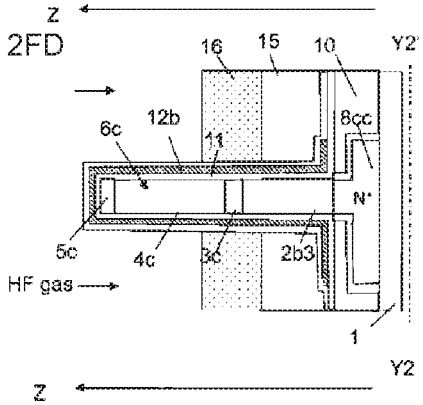

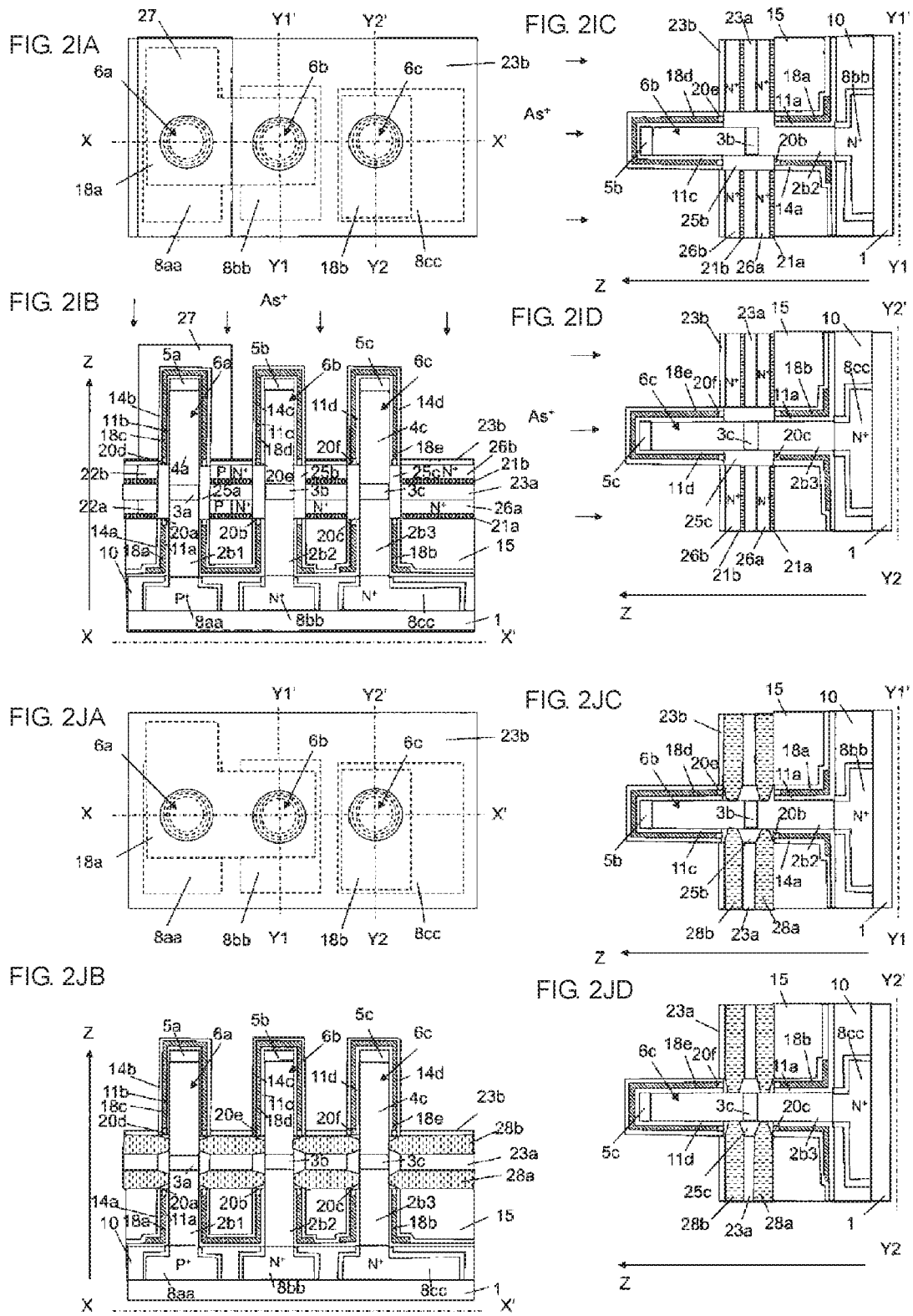

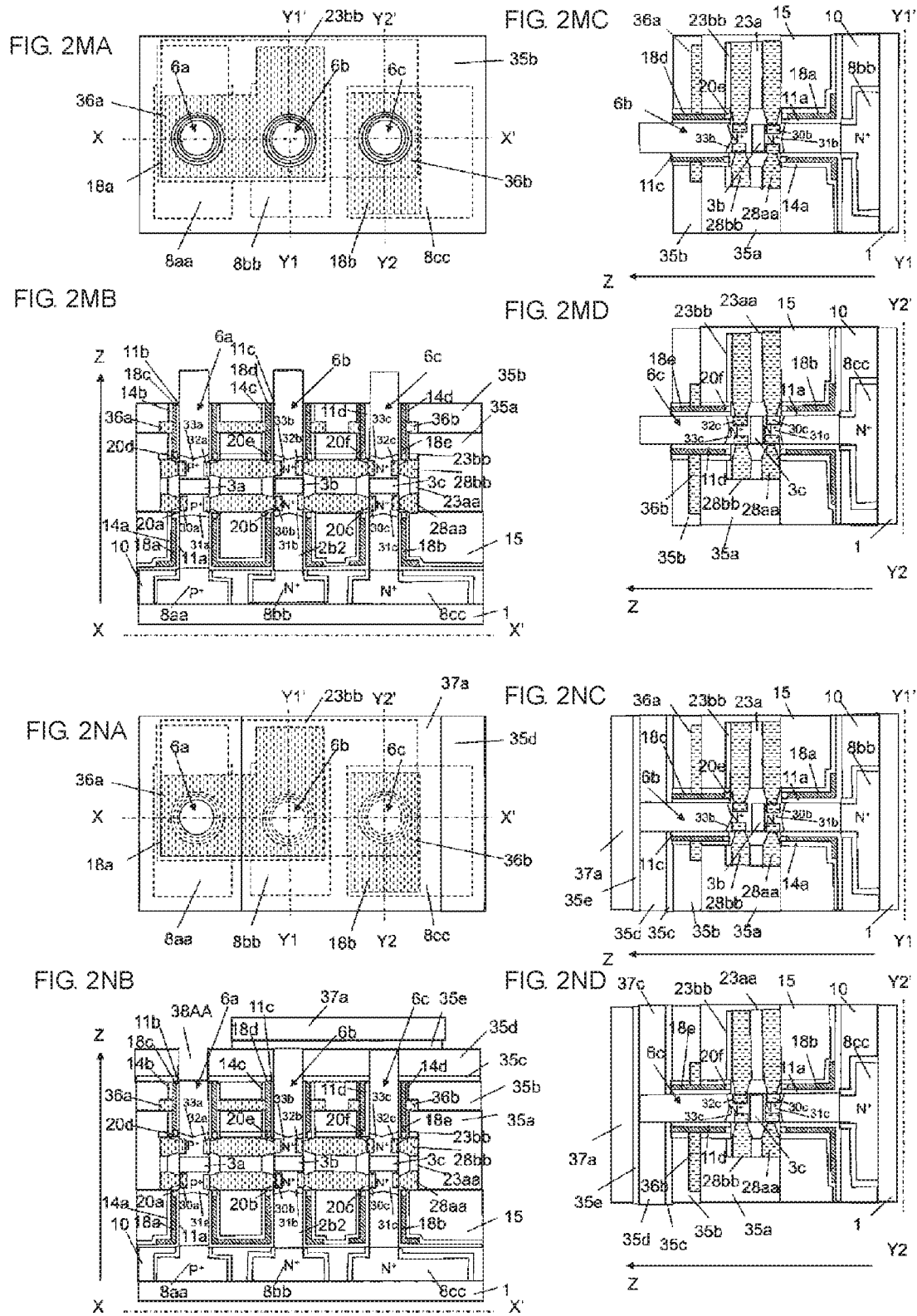

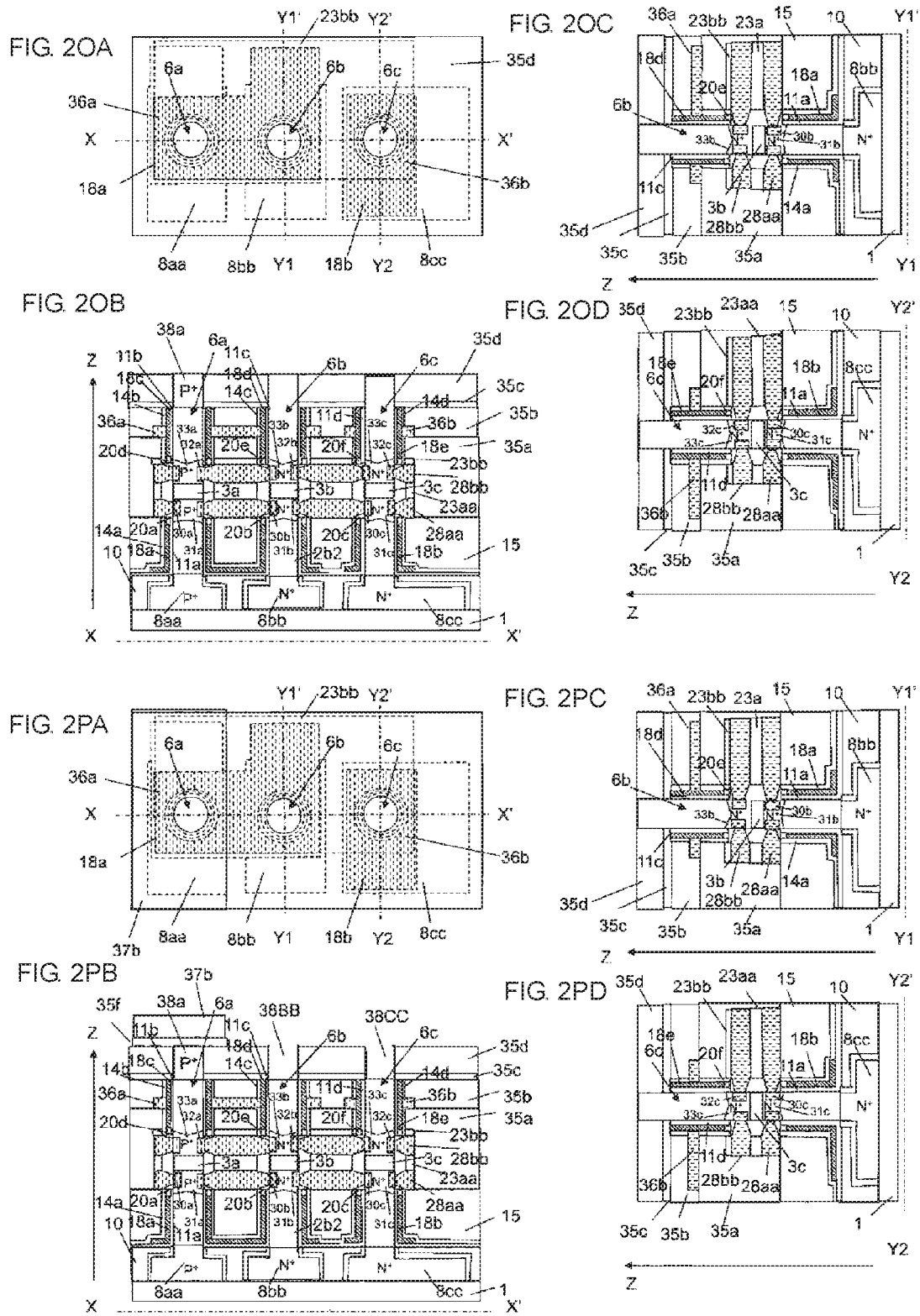

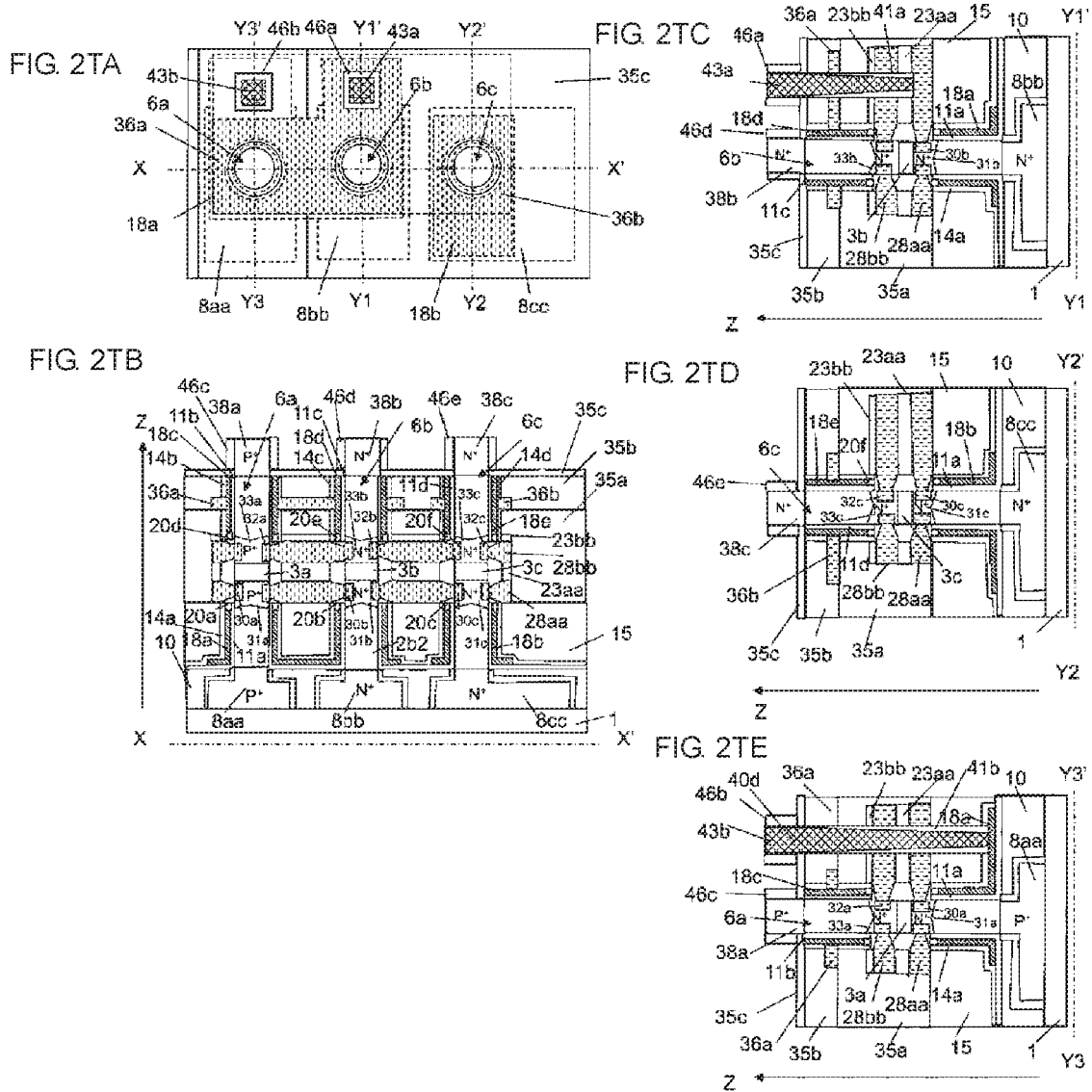

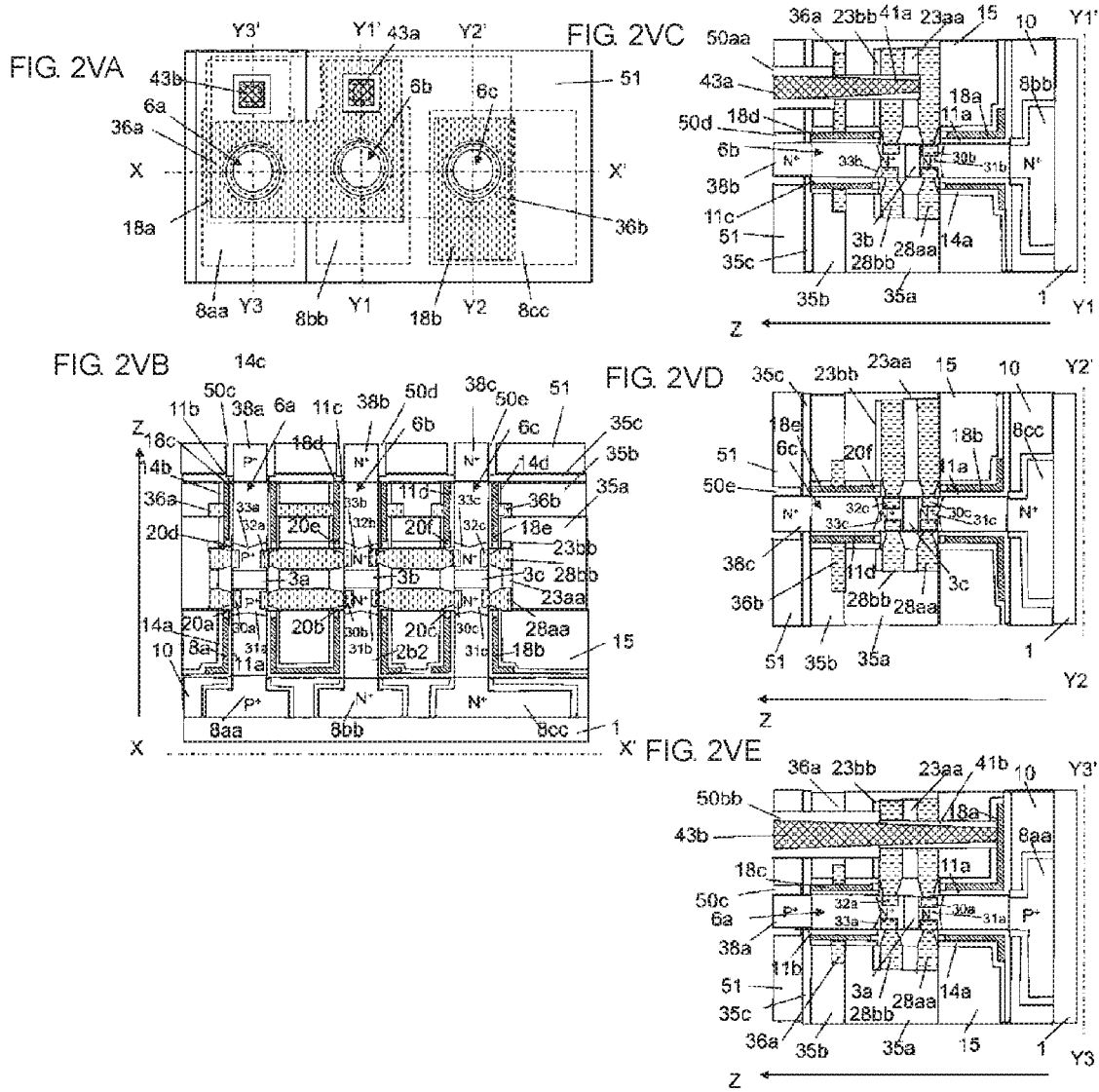

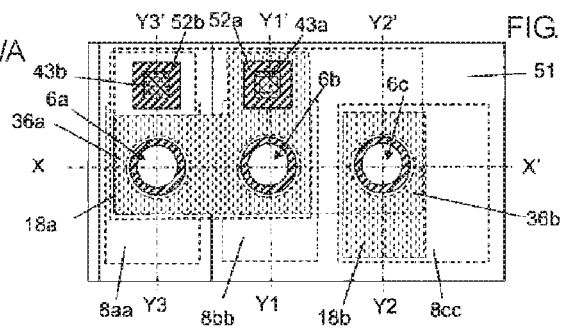
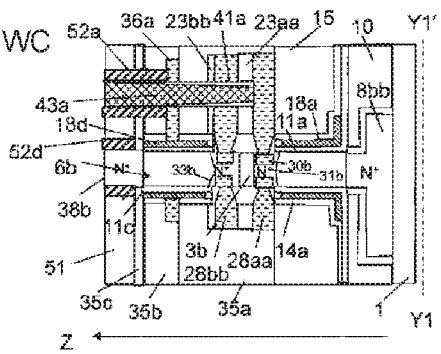
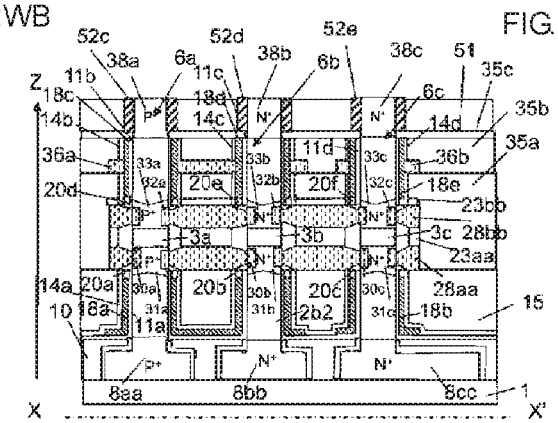
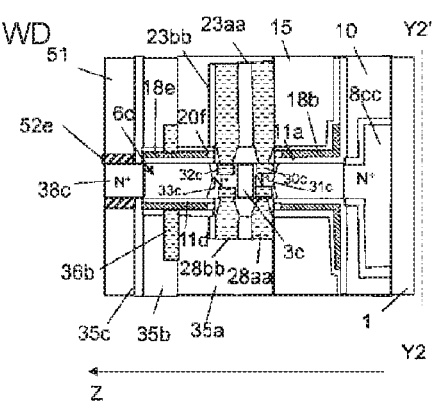
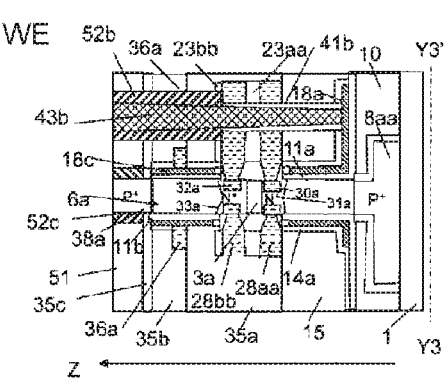

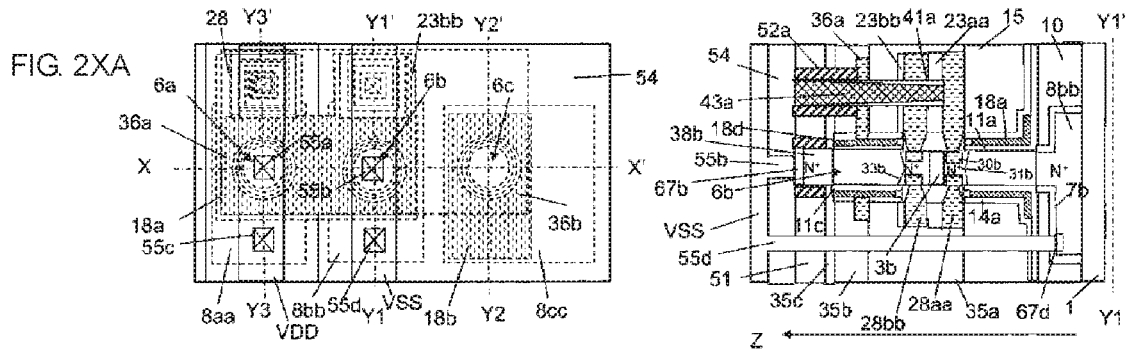
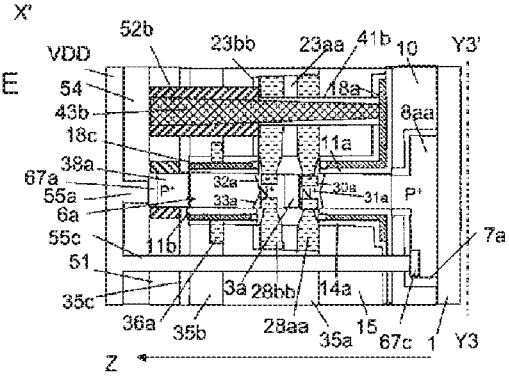
FIG. 2XA  FIG. 2XB  FIG. 2XC  FIG. 2XD  FIG. 2XE

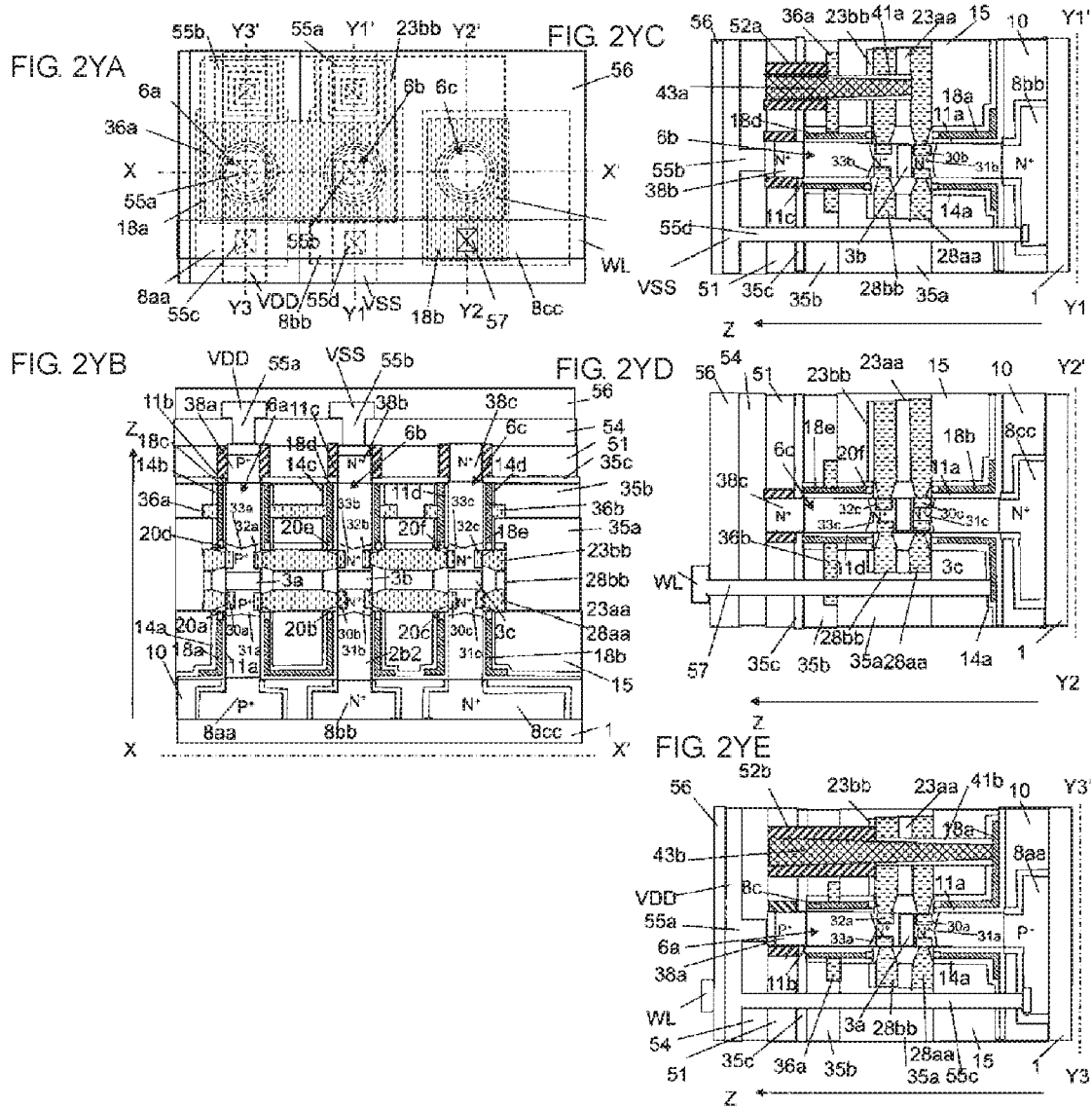

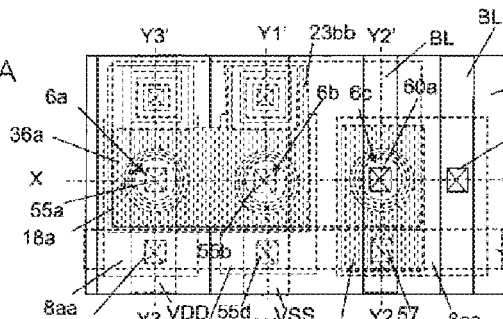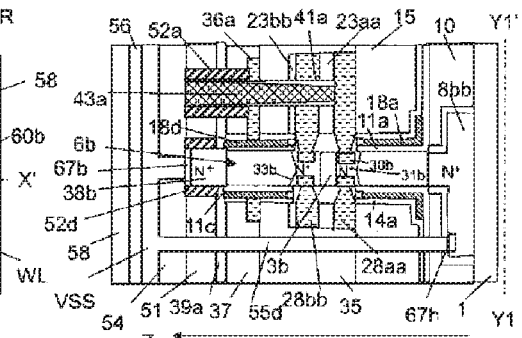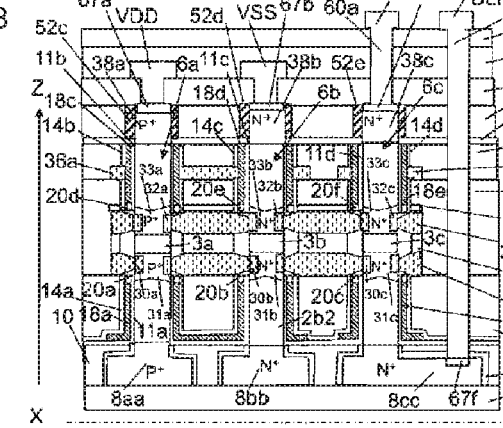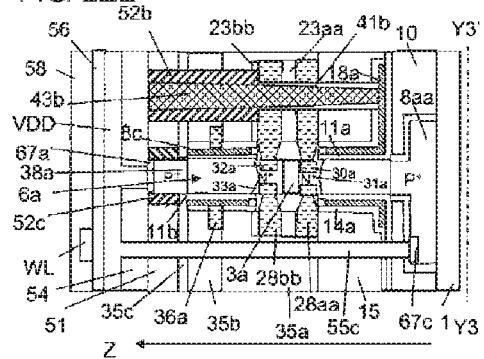
FIG. 2ZA FIG. 2ZB FIG. 2ZC FIG. 2ZD FIG. 2ZE

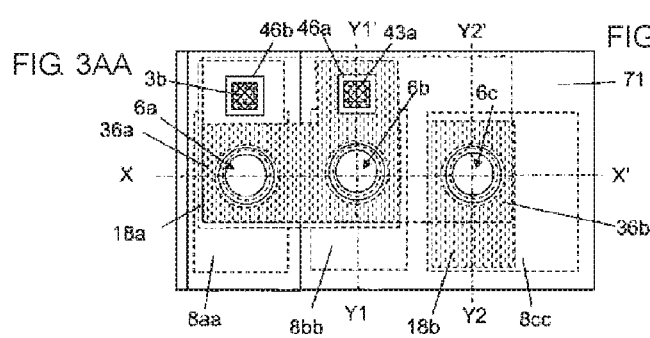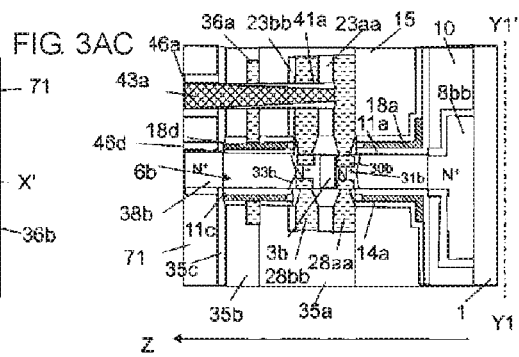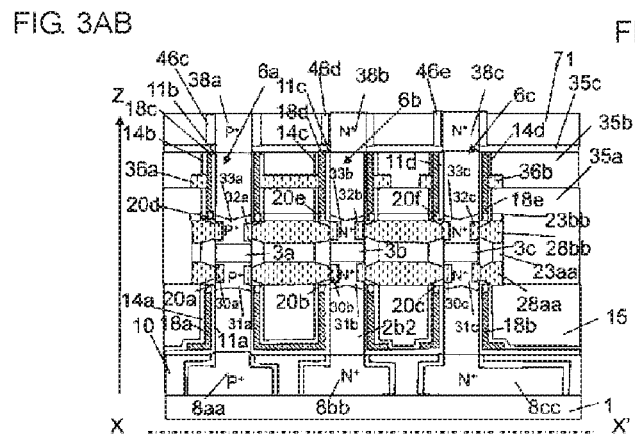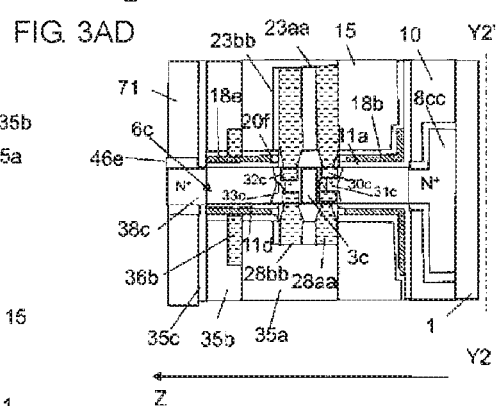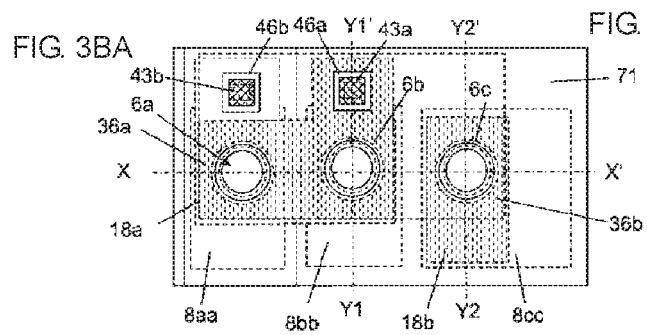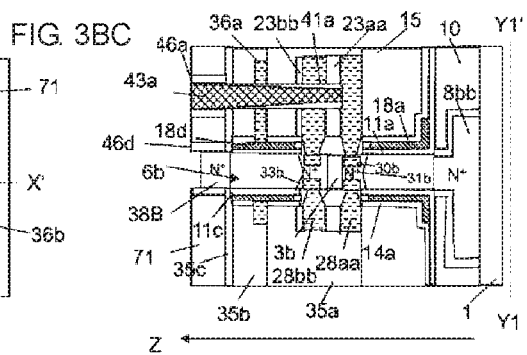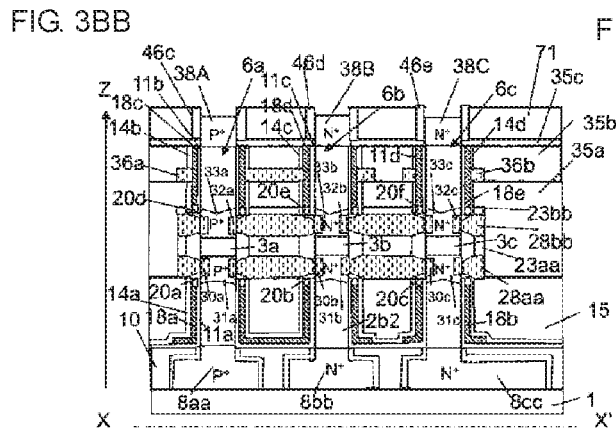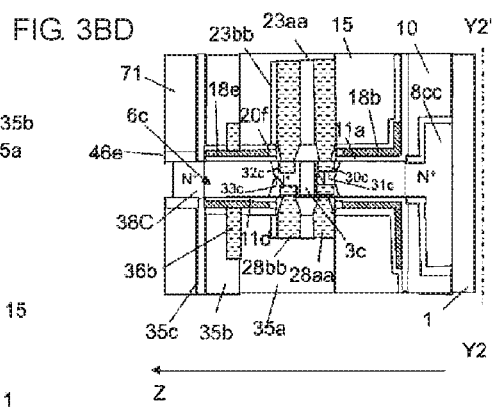

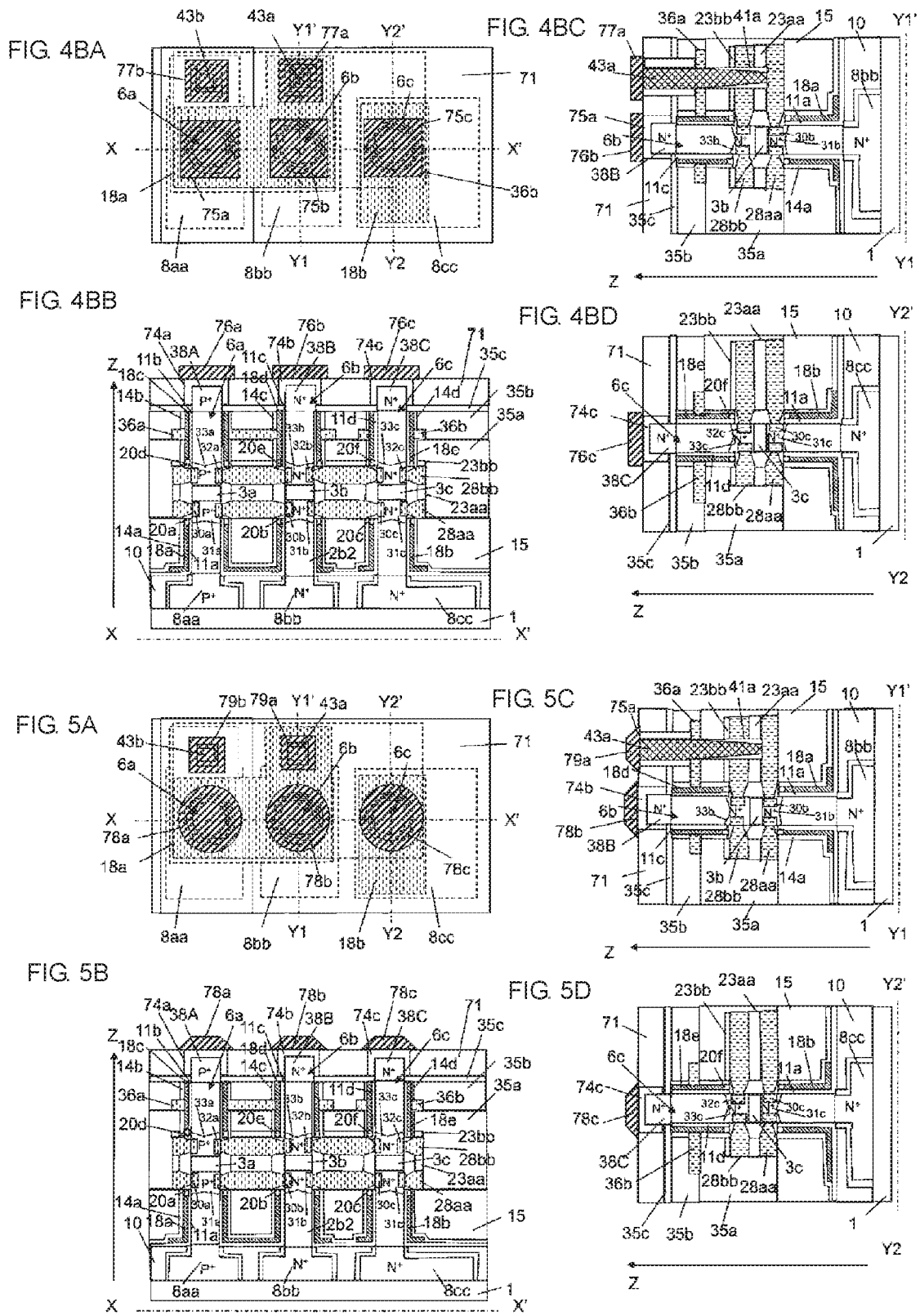

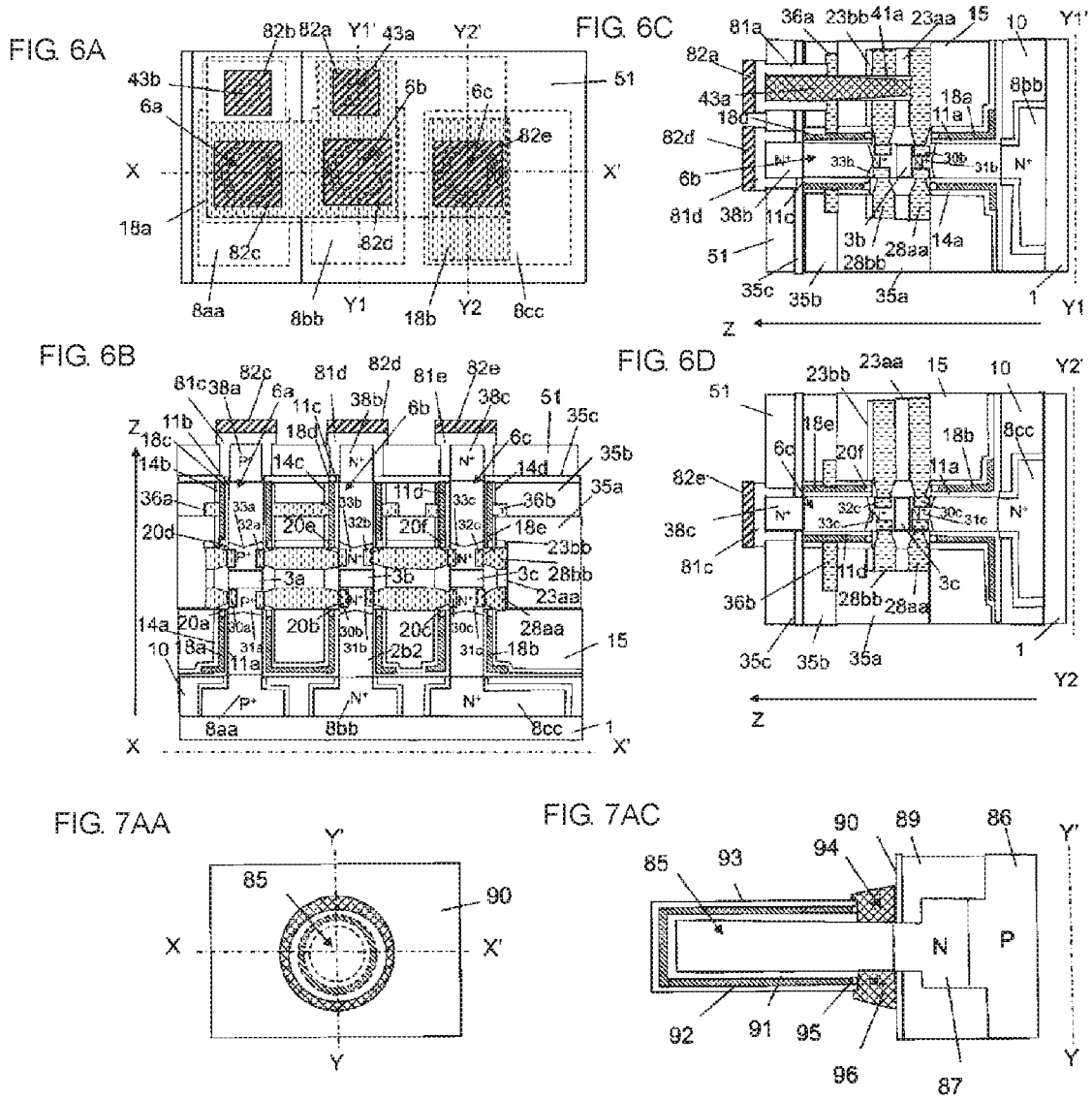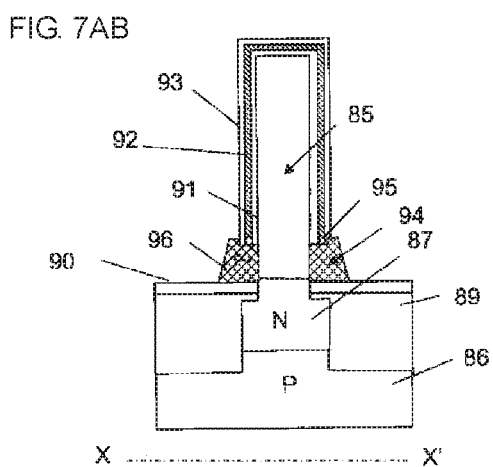

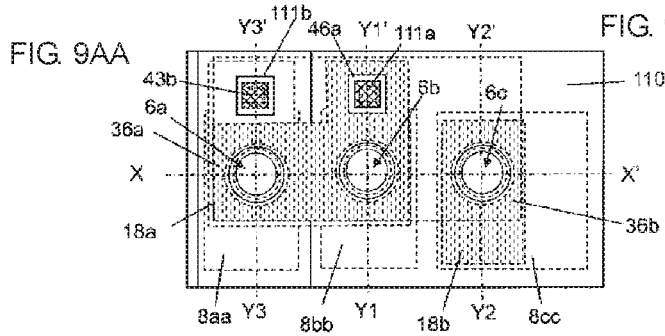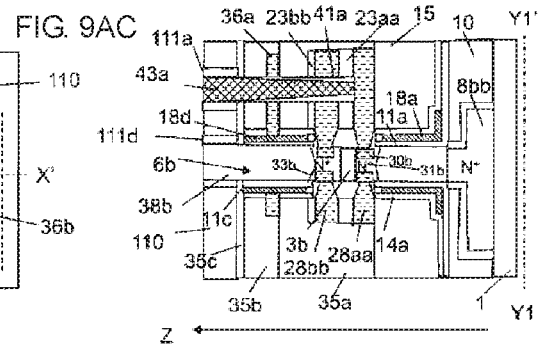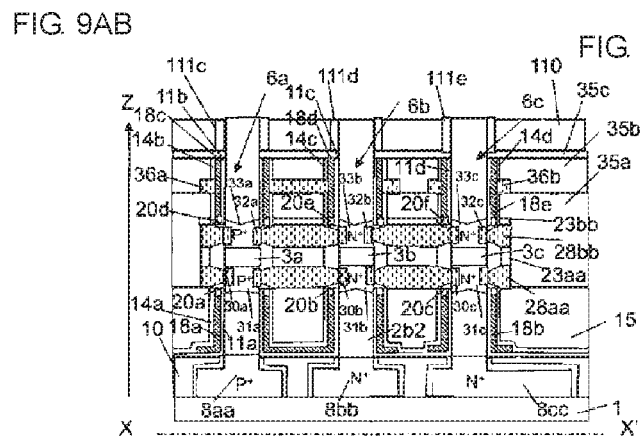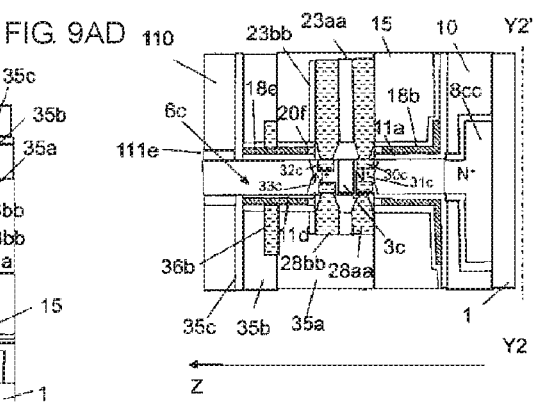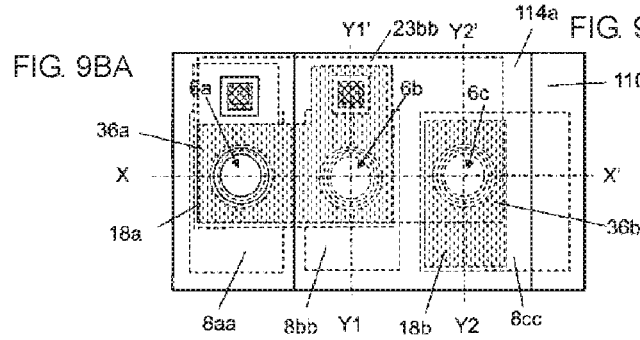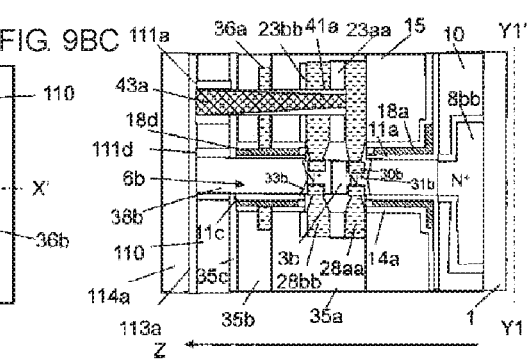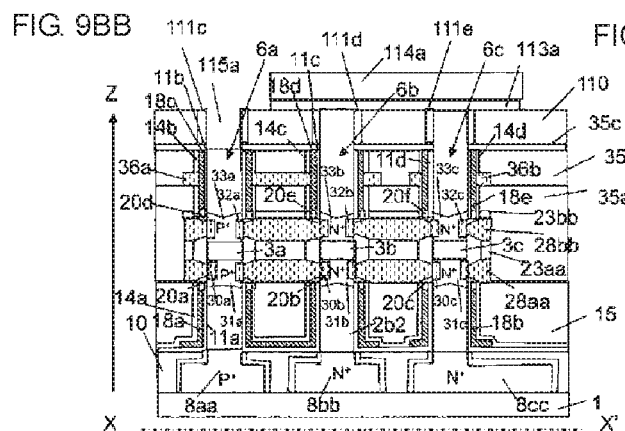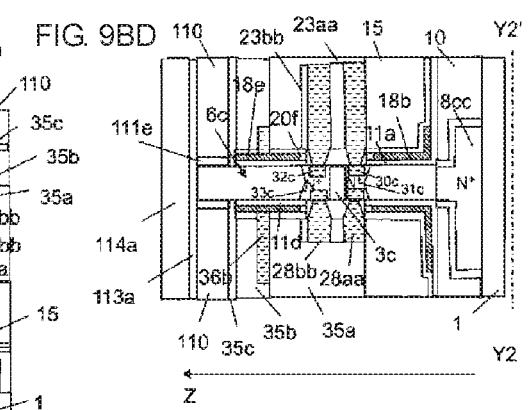

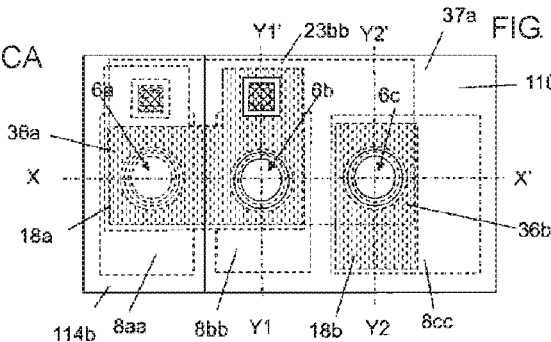
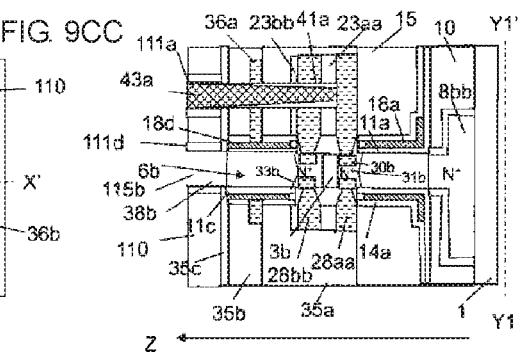
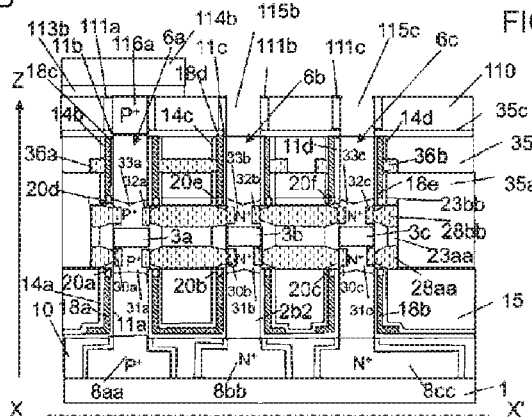
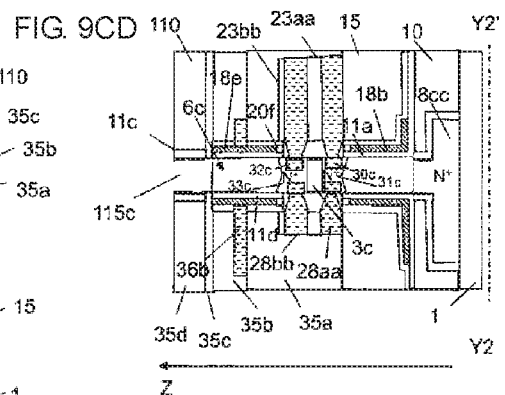
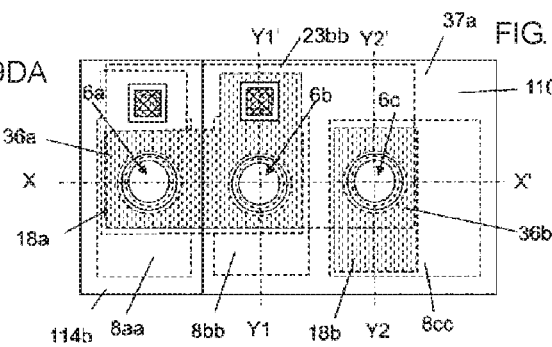
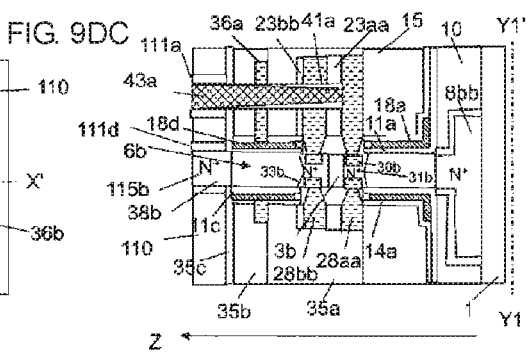
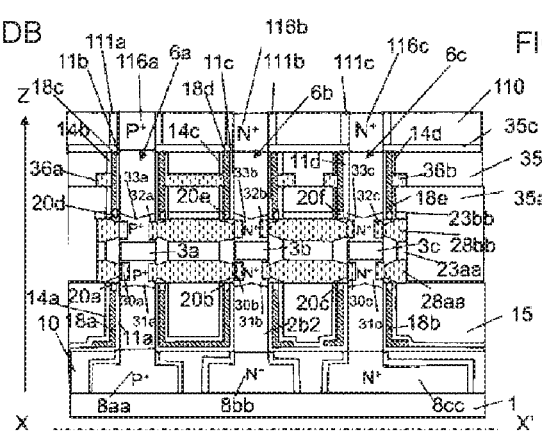
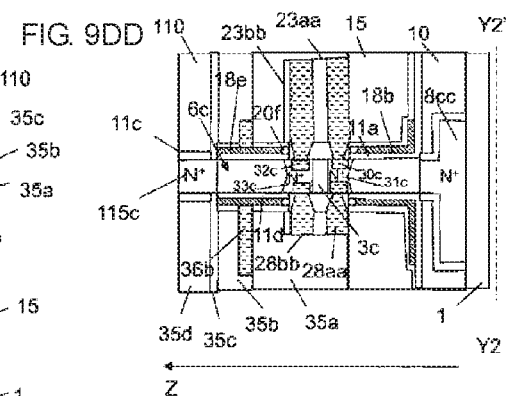

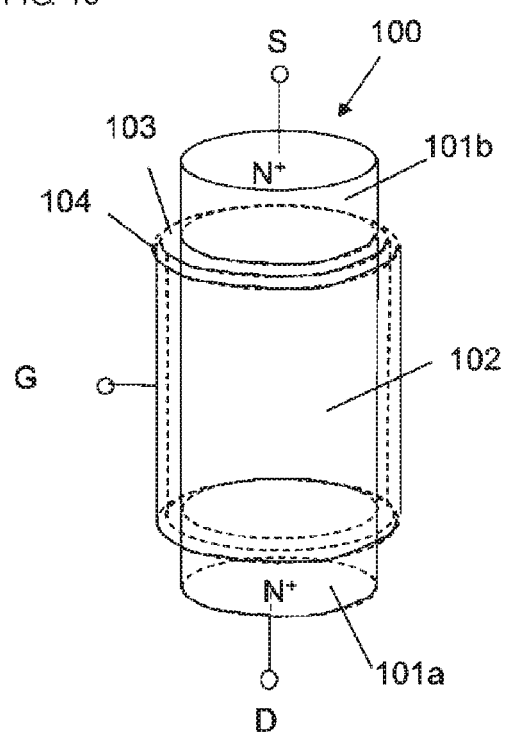

METHOD FOR PRODUCING PILLAR-SHAPED SEMICONDUCTOR DEVICE

CROSS REFERENCES TO RELATED APPLICATIONS

The present application is a continuation application of PCT/JP2017/046000, filed Dec. 21, 2017, which claims priority to PCT/JP2016/089129, filed Dec. 28, 2016. The contents of these applications are incorporated herein by reference in their entirety.

BACKGROUND OF THE INVENTION

1. Field of the Invention

The present invention relates to a method for producing a pillar-shaped semiconductor device.

2. Description of the Related Art

In recent years, three-dimensional transistors have been used for LSI (Large Scale Integration). In such three-dimensional transistors, SGTs (Surrounding Gate Transistors), which are pillar-shaped semiconductor devices, have received attention as semiconductor elements used for highly integrated semiconductor devices. A further increase in the packing density and a further improvement in the performance of semiconductor devices including SGTs have been required.

Ordinary planar MOS transistors have a channel that extends in a horizontal direction parallel to the upper surface of a semiconductor substrate. In contrast, SGTs have a channel that extends in a direction perpendicular to the upper surface of the semiconductor substrate (e.g., refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 10 illustrates a schematic structure of an N-channel SGT. A Si pillar 100 of a P or i (intrinsic) conductivity type (hereafter, silicon semiconductor pillars are referred to as "Si pillars") has, in its upper and lower portions, $N^+$ layers 101a and 101b (hereafter, semiconductor regions containing a donor impurity in a high concentration are referred to as "$N^+$ layers"). When one of the $N^+$ layers 101a and 101b functions as a source, the other functions as a drain. A portion of the Si pillar 100 between the $N^+$ layers 101a and 101b, which function as a source and a drain, functions as a channel region 102. A gate insulating layer 103 is formed so as to surround the channel region 102. A gate conductor layer 104 is formed so as to surround the gate insulating layer 103. In the SGT, the $N^+$ layers 101a and 101b functioning as the source and the drain, the channel region 102, the gate insulating layer 103, and the gate conductor layer 104 are formed in a pillar shape as a whole. Thus, in plan view, the area occupied by the SGT corresponds to the area occupied by a single source-or-drain $N^+$ layer of a planar MOS transistor. Therefore, a further reduction in the size of the chip can be achieved in SGT-including circuit chips compared with in circuit chips including a planar MOS transistor.

In the SGT illustrated in FIG. 10, a reduction in the resistance of the $N^+$ layers 100a and 100b functioning as a source and a drain has been required. By reducing the resistance of the $N^+$ layers 100a and 100b, a reduction in the power consumption and an increase in the speed of circuits including an SGT are achieved.

SUMMARY OF THE INVENTION

An increase in the density, a reduction in the power consumption, and an increase in the speed of pillar-shaped semiconductor devices have been required.

A method for producing a pillar-shaped semiconductor device including a substrate according to a first aspect of the present invention includes:

a step of forming a first semiconductor pillar that extends in a direction vertical to the substrate;

a step of forming a first gate insulating layer that surrounds a periphery of the first semiconductor pillar;

a step of forming a first gate conductor layer that surrounds the first gate insulating layer;

a step of forming a first impurity region that is in contact with an inside or a side surface of the first semiconductor pillar, the first impurity region having an upper end positioned at a lower end of the first gate insulating layer in the vertical direction;

a step of forming a first insulating layer having an upper surface positioned higher than an upper end of the first gate conductor layer and lower than a top of the first semiconductor pillar in the vertical direction;

a step of forming a first material layer that surrounds a side surface of an upper portion of the first semiconductor pillar, the upper portion being exposed at a position higher than an upper surface of the first insulating layer;

a step of forming a recess by etching a top portion of the first semiconductor pillar using the first material layer as a mask;

a step of forming, in the recess, a second impurity region containing a donor or acceptor impurity by epitaxial crystal growth;

a step of removing the first material layer;

a step of forming a second material layer that surrounds a side surface of the second impurity region positioned higher than the first insulating layer;

a step of forming a third material layer on a periphery of the second material layer;

a step of forming a first contact hole having a bottom on the first insulating layer by etching the second material layer using the third material layer and the second impurity region as etching masks; and a step of filling the first contact hole with a first conductor material layer having electrical conductivity and having a single-layer structure or a multilayer structure.

The method preferably includes:

a step of forming the second impurity region such that an upper surface of the second impurity region is positioned lower than an upper surface of the second material layer; and a step of forming a second conductor material layer having electrical conductivity and having a single-layer structure or a multilayer structure such that the second conductor material layer fills the first contact hole and covers a side surface and an upper surface of the second impurity region.

The method preferably includes:

a step of forming a third conductor material layer having electrical conductivity and having a single-layer structure or a multilayer structure such that the third conductor material layer fills the first contact hole and covers a side surface and an upper surface of the second impurity region and an upper surface of the third material layer;

a step of polishing the third conductor material layer such that an upper surface of the third conductor material layer is flush with an upper surface of the second material layer; and a step of forming a first wiring conductor layer connected to the third conductor material layer.

The method preferably includes:

a step of forming a fourth conductor material layer on the second conductor material layer by performing selective growth.

The method preferably includes:

a step of forming the second conductor material layer by performing selective growth.

The method preferably includes:

a step of forming a fifth conductor material layer having electrical conductivity and having a single-layer structure or a multilayer structure such that the fifth conductor material layer fills the first contact hole, covers a side surface and an upper surface of the second impurity region, and has an upper surface positioned higher than an upper surface of the third material layer; and a step of forming a second wiring conductor layer on the fifth conductor material layer.

The method preferably includes:

a step of forming a second insulating layer that surrounds the first gate conductor layer;

a step of forming an opening that extends through the second insulating layer, the gate conductor layer, and the gate insulating layer at a lower part of the first semiconductor pillar;

a step of forming a third insulating layer that covers at least an end face of the gate conductor layer, the end face facing the opening, before or after the opening is formed; and a step of forming, by selective epitaxial crystal growth, a first impurity region that contains a donor or acceptor impurity and extends in a horizontal direction so as to be in contact with a side surface of the first semiconductor pillar in the opening.

The method preferably includes:

a step of forming the first impurity region such that a periphery of the first impurity region protrudes more outward than a periphery of the second insulating layer when viewed in plan.

In the method, at least one of the first impurity region and the second impurity region is preferably formed of a semiconductor base different from a semiconductor base for the first semiconductor pillar.

The method preferably further includes:

a step of forming a second semiconductor pillar that stands next to the first semiconductor pillar on the substrate, a second gate insulating layer that surrounds a periphery of the second semiconductor pillar, and a second gate conductor layer that surrounds the second gate insulating layer;

a step of forming, on the second semiconductor pillar, a third impurity region containing a donor or acceptor impurity by performing epitaxial crystal growth using the same step as the step of forming a second impurity region;

a step of forming, at a lower part of the first semiconductor pillar, a fourth impurity region inside the first semiconductor pillar or a fourth impurity region connected to a side surface of the first semiconductor pillar;

a step of forming, at a lower part of the second semiconductor pillar, a fifth impurity region inside the second semiconductor pillar or a fifth impurity region connected to a side surface of the second semiconductor pillar;

a step of providing a stacked structure including a second wiring conductor layer, a third wiring conductor layer, and a fourth wiring conductor layer that are each connected to different parts selected from the first gate conductor layer, the second gate conductor layer, the first impurity region, the third impurity region, the fourth impurity region, and the fifth impurity region, that extend in a direction horizontal to the substrate, that at least partly overlap each other when viewed in plan, and that are present in this order from above;

a step of forming a second contact hole that extends from an upper surface of the third material layer to an upper surface or an inside of the fourth wiring conductor layer through the second wiring conductor layer and the third wiring conductor layer;

a step of forming a first tubular insulating layer on a side surface of the third wiring conductor layer, the side surface being exposed in the second contact hole;

a step of filling the second contact hole with a sixth conductive material layer having electrical conductivity;

a step of exposing a side surface of an upper portion of the sixth conductive material layer, wherein the step of forming a second material layer includes a step of forming a fourth material layer that surrounds a side surface of the sixth conductive material layer, and the step of forming a third material layer includes a step of forming a fifth material layer that surrounds the fourth material layer;

a step of forming a third contact hole that extends to an upper surface of the second conductor material layer by etching the fourth material layer using the fifth material layer as an etching mask; and a step of forming a seventh conductor material layer having electrical conductivity in the third contact hole.

The method preferably further includes:

a step of forming a fourth contact hole that is present at a place where the first contact hole, the second contact hole, and the third contact hole are not formed when viewed in plan, that is connected to a fifth wiring conductor layer extending in a horizontal direction so as to be connected to any one of the first gate conductor layer, the second gate conductor layer, the fourth impurity region, and the fifth impurity region, and that extends downward from a surface of the third material layer; and a step of filling the fourth contact hole with an eighth conductive material layer.

In the method, a side surface of the third wiring conductor layer facing the second contact hole protrudes more outward than a side surface of the second wiring conductor layer when viewed in plan.

A method for producing a pillar-shaped semiconductor device according to a second aspect of the present invention include:

a step of forming a first semiconductor pillar that extends in a direction vertical to the substrate;

a step of forming a first gate insulating layer that surrounds a periphery of the first semiconductor pillar;

a step of forming a first gate conductor layer that surrounds the first gate insulating layer;

a step of forming a first impurity region that is in contact with an inside or a side surface of the first semiconductor pillar, the first impurity region having an upper end positioned at a lower end of the first gate insulating layer in the direction vertical to the substrate;

a step of forming a first insulating layer having an upper surface positioned higher than an upper end of the first gate conductor layer and lower than a top of the first semiconductor pillar in the vertical direction;

a step of forming a first material layer that surrounds a side surface of an upper portion of the semiconductor pillar with an equal width when viewed in plan, the upper portion being exposed at a position higher than an upper surface of the first insulating layer;

a step of forming a second material layer that surrounds the first material layer;

a step of forming a recess by etching a top portion of the semiconductor pillar using the first material layer and the second material layer as masks;

a step of forming, in the recess, a second impurity region containing a donor or acceptor impurity by epitaxial crystal growth;

a step of forming a first contact hole that is present between the second material layer and the second impurity region and has a bottom on the first insulating layer by etching the first material layer; and a step of filling the first contact hole with a first conductor material layer having electrical conductivity and having a single-layer structure or a multilayer structure.

The method preferably further includes:

a step of forming the second impurity region such that an upper surface of the second impurity region is positioned lower than an upper surface of the first material layer; and a step of forming a second conductor material layer having electrical conductivity and having a single-layer structure or a multilayer structure such that the second conductor material layer fills the first contact hole and covers a side surface and an upper surface of the second impurity region.

The method preferably further includes:

a step of forming a third conductor material layer having electrical conductivity and having a single-layer structure or a multilayer structure such that the third conductor material layer fills the first contact hole and covers a side surface and an upper surface of the second impurity region and an upper surface of the second material layer;

a step of polishing the third conductor material layer such that an upper surface of the third conductor material layer is flush with an upper surface of the second material layer; and a step of forming a first wiring conductor layer connected to the third conductor material layer.

The method preferably further includes:

a step of forming a fourth conductor material layer on the second conductor material layer by performing selective growth.

The method preferably further includes:

a step of forming the second conductor material layer by performing selective growth.

The method preferably further includes:

a step of forming a fifth conductor material layer having electrical conductivity and having a single-layer structure or a multilayer structure such that the fifth conductor material layer fills the first contact hole, covers a side surface and an upper surface of the second impurity region, and has an upper surface positioned higher than an upper surface of the second material layer; and a step of forming a second wiring conductor layer on the fifth conductor material layer.

The method preferably further includes:

a step of forming a second insulating layer that surrounds the first gate conductor layer;

a step of forming an opening that extends through the second insulating layer, the gate conductor layer, and the gate insulating layer at a lower part of the first semiconductor pillar;

a step of forming a third insulating layer that covers at least an end face of the gate conductor layer before or after the opening is formed; and a step of forming, by selective epitaxial crystal growth, a first impurity region that contains a donor or acceptor impurity and extends in a horizontal direction so as to be in contact with a side surface of the first semiconductor pillar in the opening.

The method preferably further includes:

a step of forming the first impurity region such that a periphery of the first impurity region protrudes more outward than a periphery of the second insulating layer when viewed in plan.

In the method, at least one of the first impurity region and the second impurity region is preferably formed of a semiconductor base different from a semiconductor base for the first semiconductor pillar.

The method preferably further includes:

a step of forming a second semiconductor pillar that stands next to the first semiconductor pillar on the substrate, a second gate insulating layer that surrounds a periphery of the second semiconductor pillar, and a second gate conductor layer that surrounds the second gate insulating layer;

a step of forming, on the second semiconductor pillar, a third impurity region containing a donor or acceptor impurity by performing epitaxial crystal growth using the same step as the step of forming a second impurity region;

a step of forming, at a lower part of the first semiconductor pillar, a fourth impurity region inside the first semiconductor pillar or a fourth impurity region connected to a side surface of the first semiconductor pillar;

a step of forming, at a lower part of the second semiconductor pillar, a fifth impurity region inside the second semiconductor pillar or a fifth impurity region connected to a side surface of the second semiconductor pillar;

a step of providing a stacked structure including a second wiring conductor layer, a third wiring conductor layer, and a fourth wiring conductor layer that are each connected to different parts selected from the first gate conductor layer, the second gate conductor layer, the second impurity region, the third impurity region, the fourth impurity region, and the fifth impurity region, that extend in a direction horizontal to the substrate, that at least partly overlap each other when viewed in plan, and that are present in this order from above;

a step of forming a second contact hole that extends from an upper surface of the second material layer to an upper surface or an inside of the fourth wiring conductor layer through the second wiring conductor layer and the third wiring conductor layer;

a step of forming a first tubular insulating layer on a side surface of the third wiring conductor layer, the side surface being exposed in the second contact hole;

a step of filling the second contact hole with a sixth conductor material layer having electrical conductivity;

a step of exposing a side surface of an upper portion of the sixth conductor material layer, wherein the step of forming a first material layer includes a step of forming a third material layer that surrounds a side surface of the sixth conductor material layer, and the step of forming a second material layer includes a step of forming a fourth material layer that surrounds the third material layer;

a step of forming a third contact hole that extends to an upper surface of the second wiring conductor layer and an upper surface of the sixth conductor material layer by etching the third material layer using the fourth material layer as an etching mask; and a step of forming a seventh conductor material layer having electrical conductivity in the third contact hole.

The method preferably further includes:

a step of forming a fourth contact hole that is present at a place where the first contact hole, the second contact hole, and the third contact hole are not formed when viewed in plan, that is connected to a fifth wiring conductor layer extending in a horizontal direction so as to be connected to any one of the first gate conductor layer, the second gate conductor layer, the fourth impurity region, and the fifth impurity region, and that extends downward from a surface of the second material layer; and a step of filling the fourth contact hole with an eighth conductor material layer.

In the method, a side surface of the third wiring conductor layer facing the second contact hole protrudes more outward than a side surface of the second wiring conductor layer when viewed in plan.

The present invention provides a high-density, low-consumption, high-speed pillar-shaped semiconductor device.

BRIEF DESCRIPTION OF THE DRAWINGS

FIGS. 2CA to 2CD are a plan view and sectional views for describing a method for producing a pillar-shaped semiconductor device including an SGT according to the first embodiment.

FIGS. 2DA to 2DD are a plan view and sectional views for describing a method for producing a pillar-shaped semiconductor device including an SGT according to the first embodiment.

FIGS. 2EA to 2ED are a plan view and sectional views for describing a method for producing a pillar-shaped semiconductor device including an SGT according to the first embodiment.

FIGS. 2FA to 2FD are a plan view and sectional views for describing a method for producing a pillar-shaped semiconductor device including an SGT according to the first embodiment.

FIGS. 2IA to 2ID are a plan view and sectional views for describing a method for producing a pillar-shaped semiconductor device including an SGT according to the first embodiment.

FIGS. 2JA to 2JD are a plan view and sectional views for describing a method for producing a pillar-shaped semiconductor device including an SGT according to the first embodiment.

FIGS. 2MA to 2MD are a plan view and sectional views for describing a method for producing a pillar-shaped semiconductor device including an SGT according to the first embodiment.

FIGS. 2NA to 2ND are a plan view and sectional views for describing a method for producing a pillar-shaped semiconductor device including an SGT according to the first embodiment.

FIGS. 2OA to 2OD are a plan view and sectional views for describing a method for producing a pillar-shaped semiconductor device including an SGT according to the first embodiment.

FIGS. 2PA to 2PD are a plan view and sectional views for describing a method for producing a pillar-shaped semiconductor device including an SGT according to the first embodiment.

FIGS. 2TA to 2TE are a plan view and sectional views for describing a method for producing a pillar-shaped semiconductor device including an SGT according to the first embodiment.

FIGS. 2VA to 2VE are a plan view and sectional views for describing a method for producing a pillar-shaped semiconductor device including an SGT according to the first embodiment.

FIGS. 2WA to 2WE are a plan view and sectional views for describing a method for producing a pillar-shaped semiconductor device including an SGT according to the first embodiment.

FIGS. 2XA to 2XE are a plan view and sectional views for describing a method for producing a pillar-shaped semiconductor device including an SGT according to the first embodiment.

FIGS. 2YA to 2YE are a plan view and sectional views for describing a method for producing a pillar-shaped semiconductor device including an SGT according to the first embodiment.

FIGS. 2ZA to 2ZE are a plan view and sectional views for describing a method for producing a pillar-shaped semiconductor device including an SGT according to the first embodiment.

FIGS. 3AA to 3AD are a plan view and sectional views for describing a method for producing a pillar-shaped semiconductor device including an SGT according to a second embodiment of the present invention.

FIGS. 3BA to 3BD are a plan view and sectional views for describing a method for producing a pillar-shaped semiconductor device including an SGT according to the second embodiment.

FIGS. 4BA to 4BD are a plan view and sectional views for describing a method for producing a pillar-shaped semiconductor device including an SGT according to the third embodiment.

FIGS. 5A to 5D are a plan view and sectional views for describing a method for producing a pillar-shaped semiconductor device including an SGT according to a fourth embodiment of the present invention.

FIGS. 6A to 6D are a plan view and sectional views for describing a method for producing a pillar-shaped semiconductor device including an SGT according to a fifth embodiment of the present invention.

FIGS. 7AA to 7AC are a plan view and sectional views for describing a method for producing a pillar-shaped semiconductor device including an SGT according to a sixth embodiment of the present invention.

FIGS. 9AA to 9AD are a plan view and sectional views for describing a method for producing a pillar-shaped semiconductor device including an SGT according to an eighth embodiment of the present invention.

FIGS. 9BA to 9BD are a plan view and sectional views for describing a method for producing a pillar-shaped semiconductor device including an SGT according to the eighth embodiment.

FIGS. 9CA to 9CD are a plan view and sectional views for describing a method for producing a pillar-shaped semiconductor device including an SGT according to the eighth embodiment.

FIGS. 9DA to 9DD are a plan view and sectional views for describing a method for producing a pillar-shaped semiconductor device including an SGT according to the eighth embodiment.

FIG. 10 illustrates a schematic structure of a known SGT.

DESCRIPTION OF THE PREFERRED EMBODIMENTS

Hereafter, a method for producing a pillar-shaped semiconductor device according to an embodiment of the present invention will be described with reference to the attached drawings.

First Embodiment

Hereafter, a method for producing a pillar-shaped semiconductor device including an SGT according to the first embodiment of the present invention will be described with reference to FIG. 1A, FIG. 1B, and FIG. 2AA to FIG. 2ZE.

Figure 1A:
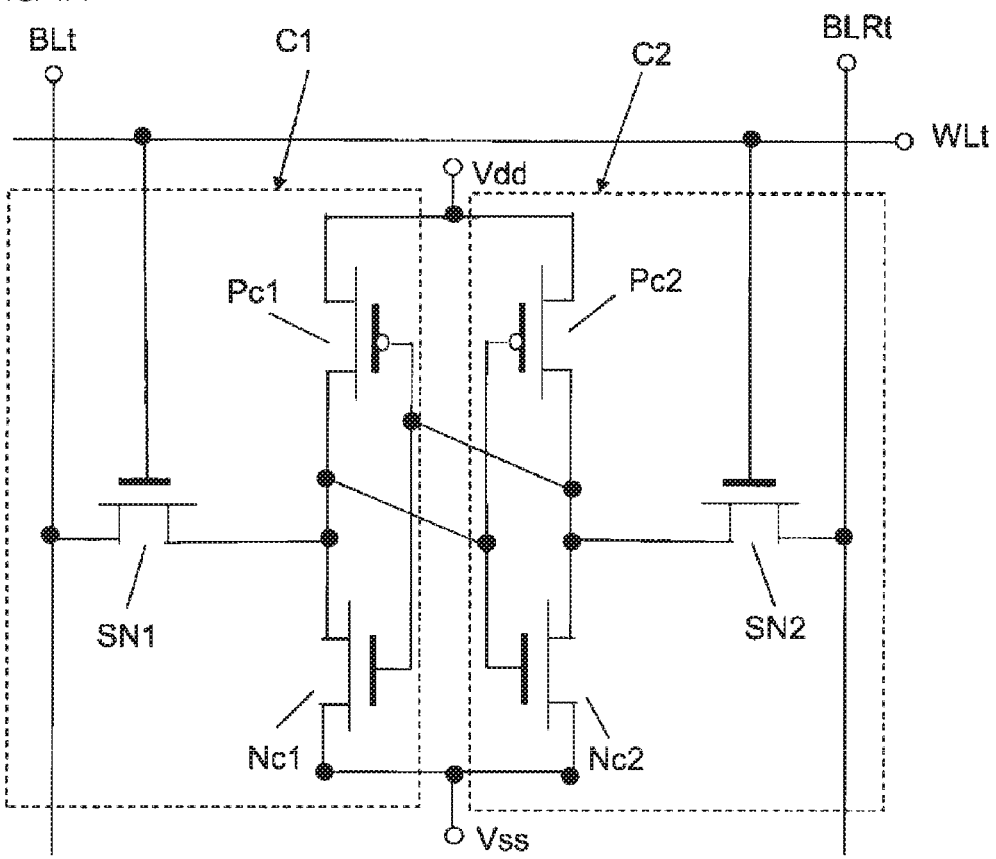
FIG. 1A is an SRAM cell circuit diagram for describing a pillar-shaped semiconductor device including an SGT according to a first embodiment of the present invention.

FIG. 1A is an equivalent circuit diagram of an SRAM cell structure using an SGT, which is a pillar-shaped semiconductor device according to this embodiment. The SRAM cell circuit includes two inverter circuits. One inverter circuit includes a P-channel SGT_Pc1 serving as a load transistor and an N-channel SGT_Nc1 serving as a drive transistor. The other inverter circuit includes a P-channel SGT_Pc2 serving as a load transistor and an N-channel SGT_Nc2 serving as a drive transistor. The gate of the P-channel SGT_Pc1, the gate of the N-channel SGT_Nc1, the drain of the P-channel SGT_Pc2, and the drain of the N-channel SGT_Nc2 are connected to each other. The gate of the P-channel SGT_Pc2, the gate of the N-channel SGT_Nc2, the drain of the P-channel SGT_Pc1, and the drain of the N-channel SGT_Nc1 are connected to each other.

As illustrated in FIG. 1A, the sources of the P-channel SGTs_Pc1 and Pc2 are connected to a power supply terminal Vdd. The sources of the N-channel SGTs_Nc1 and Nc2 are connected to a ground terminal Vss. Selection N-channel SGTs_SN1 and SN2 are disposed on both sides of the two inverter circuits. The gates of the selection N-channel SGTs_SN1 and SN2 are connected to a word line terminal WLt. The source and drain of the selection N-channel SGT_SN1 are connected to a bit line terminal BLt and the drains of the N-channel SGT_Nc1 and the P-channel SGT_Pc1, respectively. The source and drain of the selection N-channel SGT_SN2 are connected to an inverted bit line terminal BLRt and the drains of the N-channel SGT_Nc2 and the P-channel SGT_Pc2, respectively. Thus, the cell including an SRAM cell (hereafter referred to as an "SRAM cell circuit") according to this embodiment is constituted by a total of six SGTs that are two P-channel SGTs_Pc1 and Pc2 and four N-channel SGTs_Nc1, Nc2, SN1, and SN2. The SRAM cell circuit is constituted by a circuit region C1 including the P-channel SGT_Pc1 and the N-channel SGTs_Nc1 and SN1 and a circuit region C2 including the P-channel SGT_Pc2 and the N-channel SGTs_Nc2 and SN2.

Figure 1B:
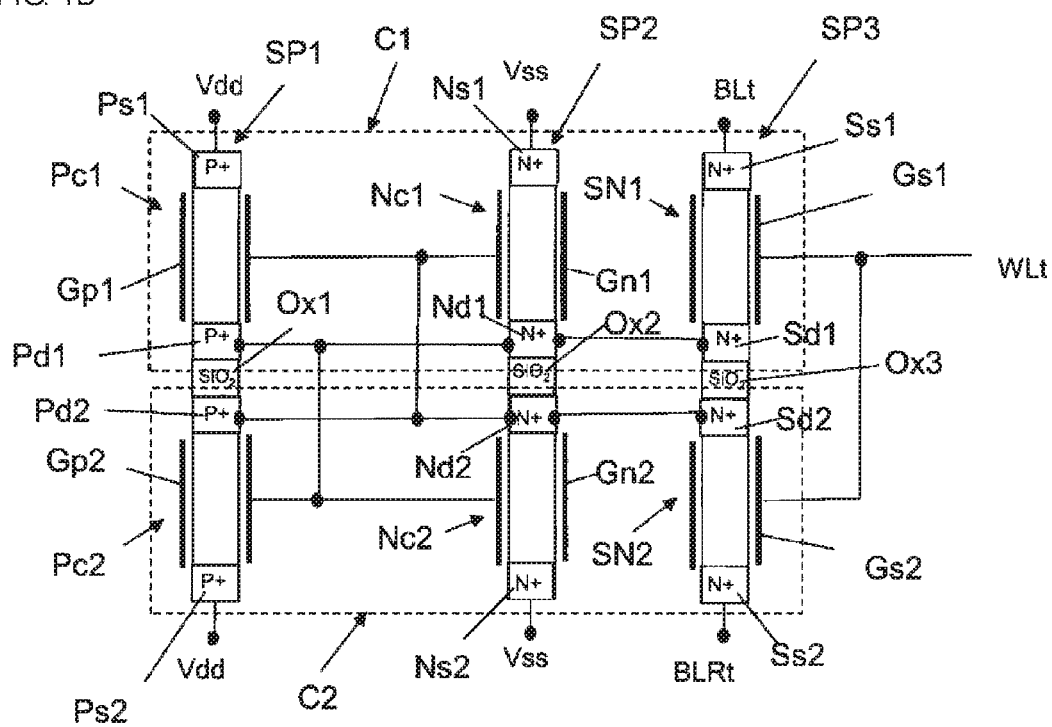
FIG. 1B illustrates a schematic structure of an SRAM cell for describing the pillar-shaped semiconductor device including an SGT according to the first embodiment.

FIG. 1B illustrates a schematic structure of the SRAM cell circuit according to the first embodiment. The SRAM cell circuit is constituted by three Si pillars SP1, SP2, and SP3. In known SRAM cells in which a single SGT is formed in a single Si pillar, six Si pillars need to be formed on a substrate to form a single SRAM cell. However, in the SRAM cell illustrated in FIG. 1B, an SRAM cell is formed using three Si pillars. Thus, an increase in the packing density of the circuit can be achieved.

The Si pillar SP1 has an upper portion in which the P-channel SGT_Pc1 in FIG. 1A is formed and a lower portion in which the P-channel SGT_Pc2 is formed. The P-channel SGTs_Pc1 and Pc2 are separated from each other by an SiO$_2$ layer Ox1 located in the middle of the Si pillar SP1. The P-channel SGT_Pc1 is constituted by a part of the Si pillar SP1 serving as a channel, a gate Gp1 surrounding the part of the Si pillar SP1, a drain P$^+$ layer Pd1 located below the gate Gp1 in the Si pillar SP1, and a source P$^+$ layer Ps1 located above the gate Gp1 in the Si pillar SP1. The P-channel SGT_Pc2 is constituted by a part of the Si pillar SP1 serving as a channel, a gate Gp2 surrounding the part of the Si pillar SP1, a drain P$^+$ layer Pd2 located above the gate Gp2 in the Si pillar SP1, and a source P$^+$ layer Ps2 located below the gate Gp2 in the Si pillar SP1.

The Si pillar SP2 has an upper portion in which the N-channel SGT_Nc1 in FIG. 1A is formed and a lower portion in which the N-channel SGT_Nc2 is formed. The N-channel SGTs_Nc1 and Nc2 are separated from each other by an SiO$_2$ layer Ox2 located in the middle of the Si pillar SP2. The N-channel SGT_Nc1 is constituted by a part of the Si pillar SP2 serving as a channel, a gate Gn1 surrounding the part of the Si pillar SP2, a drain N$^+$ layer Nd1 located below the gate Gn1 in the Si pillar SP2, and a source N$^+$ layer Ns1 located above the gate Gn1 in the Si pillar SP2. The N-channel SGT_Nc2 is constituted by a part of the Si pillar SP2 serving as a channel, a gate Gn2 surrounding the part of the Si pillar SP2, a drain N$^+$ layer Nd2 located above the gate Gn2 in the Si pillar SP2, and a source N$^+$ layer Ns2 located below the gate Gn2 in the Si pillar SP2.

The Si pillar SP3 has an upper portion in which the N-channel SGT_SN1 in FIG. 1A is formed and a lower portion in which the N-channel SGT_SN2 is formed. The N-channel SGTs_SN1 and SN2 are separated from each other by an SiO$_2$ layer Ox3 located in the middle of the Si pillar SP3. The N-channel SGT_SN1 is constituted by a part of the Si pillar SP3 serving as a channel, a gate Gs1 surrounding the part of the Si pillar SP3, a drain N$^+$ layer Sd1 located below the gate Gs1 in the Si pillar SP3, and a source N$^+$ layer Ss1 located above the gate Gs1 in the Si pillar SP3. The N-channel SGT_SN2 is constituted by a part of the Si pillar SP3 serving as a channel, a gate Gs2 surrounding the part of the Si pillar SP3, a drain N$^+$ layer Sd2 located above the gate Gs2 in the Si pillar SP3, and a source N$^+$ layer Ss2 located below the gate Gs2 in the Si pillar SP3.

As illustrated in FIG. 1B, the components located at the same height in the Si pillars SP1, SP2, and SP3 are connected to each other. That is, the gates Gp1 and Gn1 are connected to each other; the drain P$^+$ layer Pd1, the drain N$^+$ layer Nd1, and the drain N$^+$ layer Sd1 are connected to each other; the drain P$^+$ layer Pd2, the drain N$^+$ layer Nd2, and the drain N$^+$ layer Sd2 are connected to each other; and the gates Gp2 and Gn2 are connected to each other. Furthermore, the gates Gp1 and Gn1, the drain P$^+$ layer Pd2, the drain N$^+$ layer Nd2, and the drain N$^+$ layer Sd2 are connected to each other; and the gates Gp2 and Gn2, the drain P$^+$ layer Pd1, the drain N$^+$ layer Nd1, and the drain N$^+$ layer Sd1 are connected to each other.

As illustrated in FIG. 1B, the source P$^+$ layers Ps1 and Ps2 of the Si pillar SP1 are connected to the power supply terminal Vdd. The source N$^+$ layers Ns1 and Ns2 of the Si pillar SP2 are connected to the ground terminal Vss. The source N$^+$ layer Ss1 of the Si pillar SP3 is connected to the bit line terminal BLt. The source N$^+$ layer Ss2 of the Si pillar SP3 is connected to the inverted bit line terminal BLRt. The gates Gs1 and Gs2 of the Si pillar SP3 are connected to the word line terminal WLt.

As illustrated in FIG. 1B, the circuit region C1 of the circuit diagram in FIG. 1A is formed in the upper portions of the Si pillars SP1, SP2 and SP3, and the circuit region C2 is formed in the lower portions of the Si pillars SP1, SP2 and SP3. The components located at the same height in the Si pillars SP1, SP2, and SP3 are connected to each other without vertical connection paths of the Si pillars. That is, the gates Gp1 and Gn1 are connected to each other without vertical connection paths of the Si pillars SP1 and SP2. The drain P$^+$ layer Pd1 and the drain N$^+$ layers Nd1 and Sd1 are connected to each other without vertical connection paths of the Si pillars SP1, SP2, and SP3. The drain P$^+$ layer Pd2 and the drain N$^+$ layers Nd2 and Sd2 are connected to each other without vertical connection paths of the Si pillars SP1, SP2, and SP3. The gates Gp2 and Gn2 are connected to each other without vertical connection paths of the Si pillars SP1 and SP2. In contrast, the gates Gp1 and Gn1, the drain P$^+$ layer Pd2, and the drain N$^+$ layer Nd2 need to be connected to each other through a vertical connection wiring path. Similarly, the gates Gp2 and Gn2, the drain P$^+$ layer Pd1, and the N$^+$ layer Nd1 are connected to each other through a vertical connection wiring path.

Figure 2A:
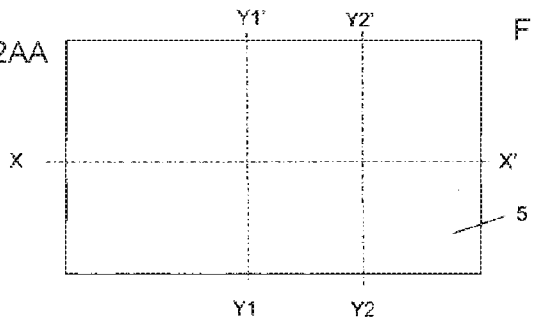
FIGS. 2AA to 2AD are a plan view and sectional views for describing a method for producing a pillar-shaped semiconductor device including an SGT according to the first embodiment.
Figure 2A:
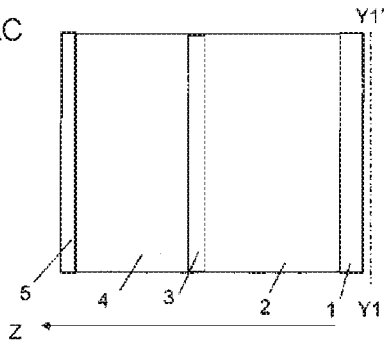
Figure 2A:
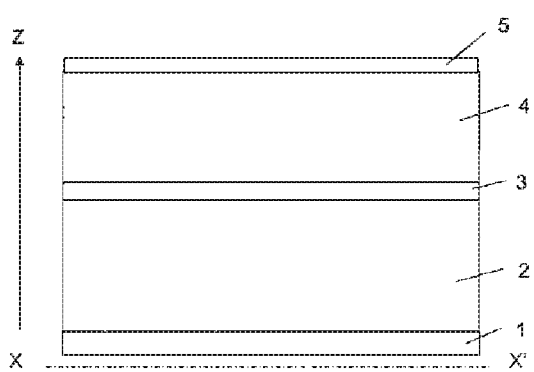
Figure 2A:
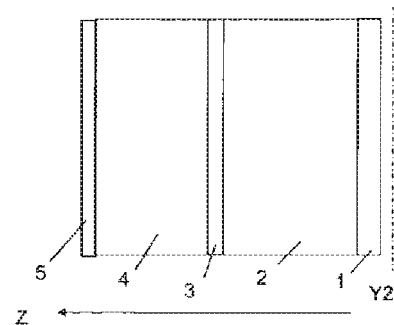

FIG. 2AA to FIG. 2AD are a plan view and sectional views for describing the production process of an SRAM cell circuit that is a pillar-shaped semiconductor device including an SGT. FIG. 2AA is a plan view, FIG. 2AB is a sectional view taken along line X-X' in FIG. 2AA, FIG. 2AC is a sectional view taken along line Y1-Y1' in FIG. 2AA, and FIG. 2AD is a sectional view taken along line Y2-Y2' in FIG. 2AA.

As illustrated in FIG. 2AA to FIG. 2AD, an i layer 2, an SiO$_2$ layer 3, an i layer 4, and an SiO$_2$ layer 5 are formed on an SiO$_2$ layer substrate 1 in a stacked manner.

Figure 2B:
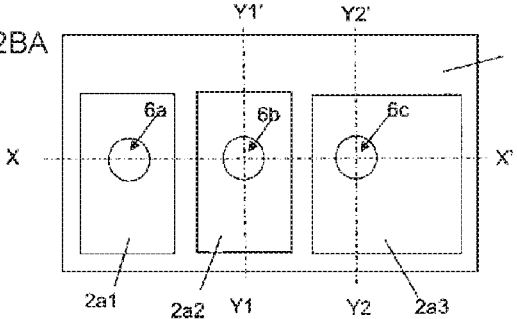
FIGS. 2BA to 2BD are a plan view and sectional views for describing a method for producing a pillar-shaped semiconductor device including an SGT according to the first embodiment.
Figure 2B:
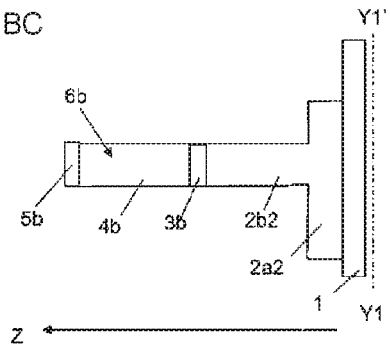
Figure 2B:
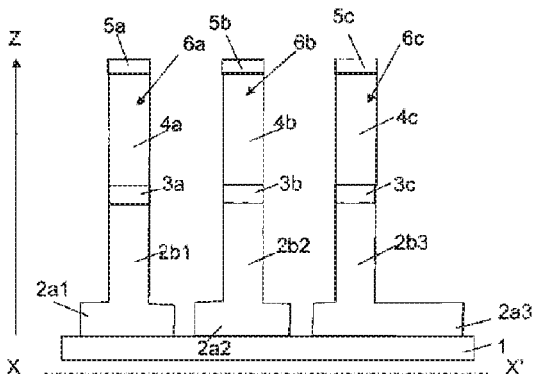
Figure 2B:
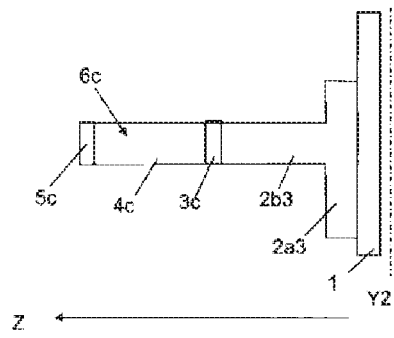

Next, as illustrated in FIG. 2BA to FIG. 2BD, SiO$_2$ layers 5a, 5b, and 5c having a circular shape when viewed in plan are formed by lithography and RIE (Reactive Ion Etching) using a resist layer (not illustrated) as a mask. Then, the i layer 4, the SiO$_2$ layer 3, and the i layer 2 are etched by RIE using the resist layer and the SiO$_2$ layers 5a, 5b, and 5c as masks to form Si pillars 6a, 6b, and 6c while a lower portion of the i layer 2 is left on the SiO$_2$ layer substrate 1. The resist layer is removed. As a result, the Si pillar 6a includes an i layer 2b1, an SiO$_2$ layer 3a, an i layer 4a, and an SiO$_2$ layer 5a. The Si pillar 6b includes an i layer 2b2, an SiO$_2$ layer 3b, an i layer 4b, and an SiO$_2$ layer 5b. The Si pillar 6c includes an i layer 2b3, an SiO$_2$ layer 3c, an i layer 4c, and an SiO$_2$ layer 5c.

Subsequently, the lower portion of the i layer 2 is etched by lithography and RIE. Thus, an i layer 2a1 is formed on the periphery of the Si pillar 6a. An i layer 2a2 is formed on the periphery of the Si pillar 6b. An i layer 2a3 is formed on the periphery of the Si pillar 6c.

Next, as illustrated in FIG. 2CA to FIG. 2CD, SiO$_2$ layers 7a, 7b, and 7c are formed on the peripheries of the Si pillars 6a, 6b, and 6c and the i layers 2a1, 2a2, and 2a3 by, for example, thermal oxidation or ALD (Atomic Layer Deposition), respectively. By using lithography and ion implantation, a P$^+$ layer 8a is formed in the i layer 2a1 on the periphery of the Si pillar 6a, an N$^+$ layer 8b is formed in the i layer 2a2 on the periphery of the Si pillar 6b, and an N$^+$ layer 8c is formed in the i layer 2a3 on the periphery of the Si pillar 6c. An SiO$_2$ layer 10 is formed so as to surround lower portions of the Si pillars 6a, 6b, and 6c and the i layers 2a1, 2a2, and 2a3.

Next, as illustrated in FIG. 2DA to FIG. 2DD, the SiO$_2$ layers 7a, 7b, and 7c above the SiO$_2$ layer 10 are removed, and then a hafnium oxide (HfO$_2$) layer 11 and a titanium nitride (TiN) layer 12 are sequentially formed by, for example, ALD so as to cover the Si pillars 6a, 6b, and 6c and the SiO$_2$ layer 10. In the end, the HfO$_2$ layer 11 serves as a gate insulating layer of an SGT and the TiN layer 12 serves as a gate conductor layer of an SGT.

Next, as illustrated in FIG. 2EA to FIG. 2ED, a TiN layer 12a that surrounds the Si pillars 6a and 6b and a TiN layer 12b that surrounds the Si pillar 6c are formed by lithography and RTE.

Next, as illustrated in FIG. 2FA to FIG. 2FD, an SiO$_2$ layer 14 is entirely formed. Then, heat treatment is performed to thermally diffuse a donor or acceptor impurity atom of the P$^+$ layer 8a and the N$^+$ layers 8b and 8c into the entire i layers 2a1, 2a2, and 2a3. Thus, a P$^+$ layer 8aa and N$^+$ layers 8bb and 8cc are formed. Then, a silicon nitride (SiN) layer 15 is formed on the peripheries of the Si pillars 6a, 6b, and 6c. Then, a resist layer 16 is formed on the SiN layer 15 such that the positions of the SiO$_2$ layers 3a, 3b, and 3c in a vertical direction are in the middle of the resist layer 16. The resist layer 16 is formed by applying a resist material onto an upper surface of the SiN layer 15 and then performing heat treatment to increase the flowability of the resist material so that the resist material uniformly accumulates on the SiN layer 15 outside the Si pillars 6a, 6b, and 6c. Then, a hydrogen fluoride gas (hereafter, referred to as an "HF gas") is entirely supplied. The HF gas is ionized by moisture contained in the resist layer 16, and thus a hydrogen fluoride ion (HF$_2^+$) (hereafter, referred to as an "HF ion") is generated. The HF ion diffuses through the resist layer 16, which etches the SiO$_2$ layer 14 that is in contact with the resist layer 16 (refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979) for the etching mechanism herein). On the other hand, most of the SiO$_2$ layer 14 that is not in contact with the resist layer 16 is left without being etched. Then, the resist layer 16 is removed.

Figure 2G:
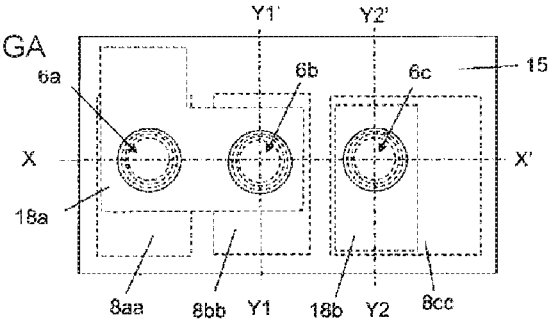
FIGS. 2GA to 2GD are a plan view and sectional views for describing a method for producing a pillar-shaped semiconductor device including an SGT according to the first embodiment.
Figure 2G:
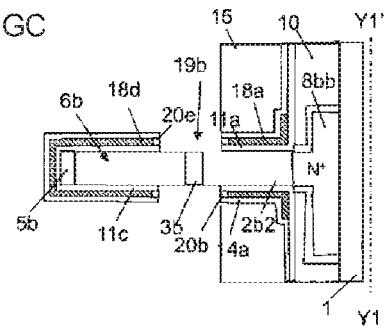
Figure 2G:
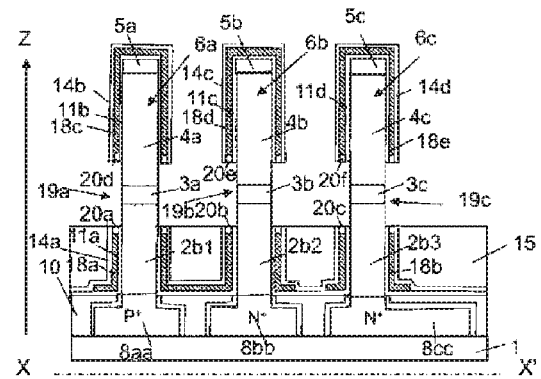
Figure 2G:
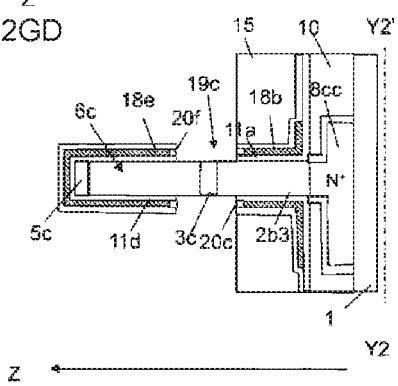

Consequently, as illustrated in FIG. 2GA to FIG. 2GD, the SiO$_2$ layer 14 is divided into a SiO$_2$ layer 14a covered with the SiN layer 15 and SiO$_2$ layers 14b, 14c, and 14d located in upper regions of the Si pillars 6a, 6b, and 6c. Then, the TiN layers 12a and 12b are etched using the SiO$_2$ layers 14a, 14b, 14c, and 14d and the SiN layer 15 as masks. Thus, the TiN layer 12a is divided into a TiN layer 18a covered with the SiN layer 15 in lower regions of the Si pillars 6a and 6b, a TiN layer 18c covered with the SiO$_2$ layer 14b, and a TiN layer 18d covered with the SiO$_2$ layer 14c. The TiN layer 12b is divided into a TiN layer 18b covered with the SiN layer 15 in a lower region of the Si pillar 6c and a TiN layer 18e covered with the SiO$_2$ layer 14d. Subsequently, the HfO$_2$ layer 11 is etched using the SiO$_2$ layers 14a, 14b, and 14c and the TiN layers 18a, 18b, 18c, 18d, and 18e as masks to form openings 19a, 19b, and 19c. Thus, the HfO$_2$ layer 11 is divided into a HfO$_2$ layer 11a covered with the TiN layers 18a and 18b in the lower regions of the Si pillars 6a, 6b, and 6c and HfO$_2$ layers 11b, 11c, and 11d respectively covered with the TiN layers 18c, 18d, and 18e in the upper regions of the Si pillars 6a, 6b, and 6c. Then, an exposed portion of the TiN layer 18a on the Si pillar 6a side, an exposed portion of the TiN layer 18a on the Si pillar 6b side, and exposed portions of the TiN layer 18b, 18c, 18d, and 18e are oxidized to form TiO (titanium oxide) layers 20a, 20b, 20c, 20d, 20e, and 20f. Then, SiO$_2$ layers (not illustrated) that have been formed on the side surfaces of the Si pillars 6a, 6b, and 6c in the formation of the TiO layers 20a, 20b, 20c, 20d, 20e, and 20f are removed.

Figure 2H:
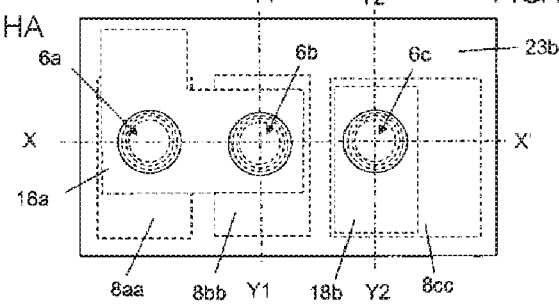
FIGS. 2HA to 2HD are a plan view and sectional views for describing a method for producing a pillar-shaped semiconductor device including an SGT according to the first embodiment.
Figure 2H:
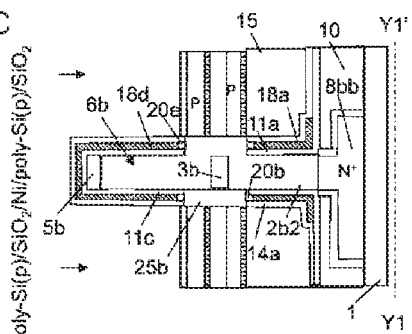
Figure 2H:
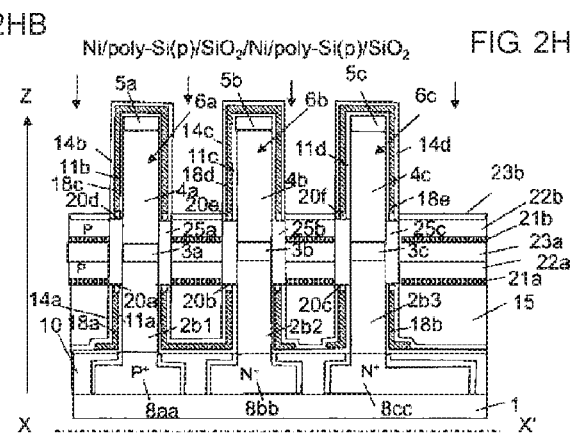
Figure 2H:
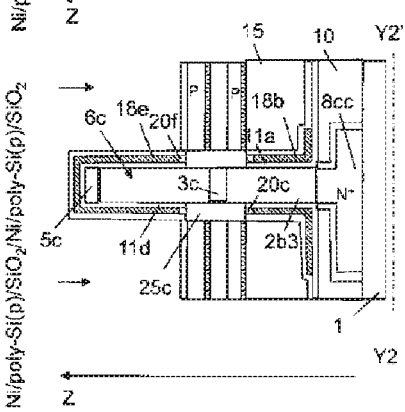

Next, as illustrated in FIG. 2HA to FIG. 2HD, a Ni layer 21a is formed on the SiN layer 15 through, for example, bias sputtering by causing Ni atoms to vertically enter the upper surface of the SiO$_2$ layer substrate 1. The bias sputtering is performed as follows. That is, a substrate metal plate on which the SiO$_2$ layer substrate 1 is disposed and a facing metal plate spaced from the substrate metal plate are provided, a direct voltage is applied to the substrate metal plate, and an RF voltage is applied to the two parallel metal plates, whereby atoms of the facing metal plate are sputtered and deposited on the SiO$_2$ layer substrate 1. Similarly, a P-type poly-Si layer 22a containing a boron (B) impurity, an SiO$_2$ layer 23a, a Ni layer 21b, a P-type poly-Si layer 22b, and an SiO$_2$ layer 23b are sequentially stacked by bias sputtering. Herein, the SiO$_2$ layer 23b is formed such that the upper surface of the SiO$_2$ layer 23b is in contact with the SiO$_2$ layers 14b, 14c, and 14d that cover the upper portions of the Si pillars 6a, 6b, and 6c, respectively. Since Ni atoms, poly-Si atoms, and SiO$_2$ atoms are caused to vertically enter the upper surface of the SiO$_2$ layer substrate 1, enclosed spaces 25a, 25b, and 25c are formed between the peripheral side surfaces of the Si pillars 6a, 6b, and 6c and the Ni layers 21a and 21b, the P-type poly-Si layers 22a and 22b, and the SiO$_2$ layers 23a and 23b. Then, multilayer films (not illustrated) formed on the tops of the Si pillars 6a, 6b, and 6c simultaneously with the Ni layers 21a and 21b, the P-type poly-Si layers 22a and 22b, and the SiO$_2$ layers 23a and 23b deposited on the SiN layer 15 are removed.

Next, as illustrated in FIG. 2IA to FIG. 2ID, a resist layer 27 is formed so as to cover the Si pillar 6a. Then, P-type poly-Si layers 22a and 22b on the peripheries of the Si pillars 6b and 6c are converted into N$^+$ layers by performing ion implantation of arsenic (As) atoms from the upper surface of the SiO$_2$ layer substrate 1 to form N$^+$-type poly-Si layers 26a and 26b. Then, the resist layer 27 is removed.

Next, as illustrated in FIG. 2JA to FIG. 2JD, Ni atoms of the Ni layers 21a and 21b are diffused into the P-type poly-Si layers 22a and 22b and the N$^+$-type poly-Si layers 26a and 26b by performing, for example, heat treatment at 550° C. to form nickel silicide (NiSi) layers 28a and 28b. The NiSi layers 28a and 28b expand such that the NiSi layer 28a has a larger volume than the P-type poly-Si layer 22a and the N$^+$-type poly-Si layer 26a and the NiSi layer 28b has a larger volume than the P-type poly-Si layer 22b and the N$^+$-type poly-Si layer 26b (refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995) for the volume expansion). Since the P-type poly-Si layer 22a and the N$^+$-type poly-Si layer 26a are sandwiched between the SiN layer 15 and the SiO$_2$ layer 23a and the P-type poly-Si layer 22b and the N$^+$-type poly-Si layer 26b are sandwiched between the SiO$_2$ layers 23a and 23b, the NiSi layers 28a and 28b mainly expand into the spaces 25a, 25b, and 25c. The As atoms contained in the N$^+$-type poly-Si layers 26a and 26b and the B atoms contained in the P-type poly-Si layers 22a and 22b are forced toward the outside of the NiSi layers 28a and 28b (refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995) for the forcing phenomenon). By producing the impurity atom forcing effect, protrusions (not illustrated) containing a large number of impurity atoms are formed in side surface layers of the NiSi layers 28a and 28b that have expanded into the spaces 25a, 25b, and 25c. The side surfaces of the protrusions come into contact with the surfaces of the Si pillars 6a, 6b, and 6c.

Figure 2K:
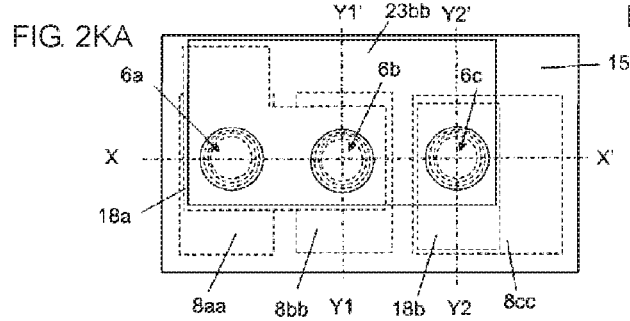
FIGS. 2KA to 2KD are a plan view and sectional views for describing a method for producing a pillar-shaped semiconductor device including an SGT according to the first embodiment.
Figure 2K:
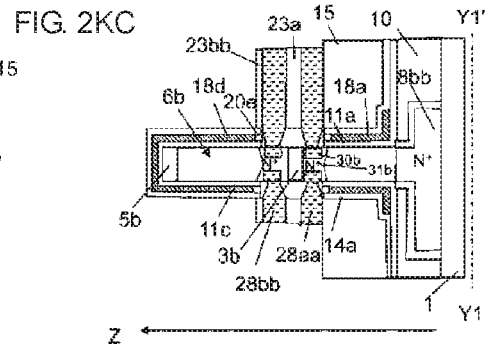
Figure 2K:
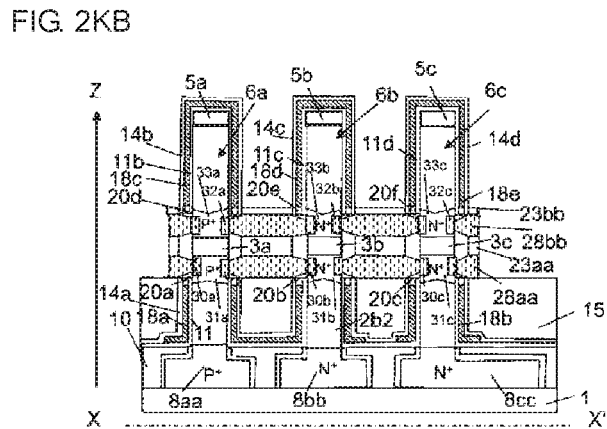
Figure 2K:
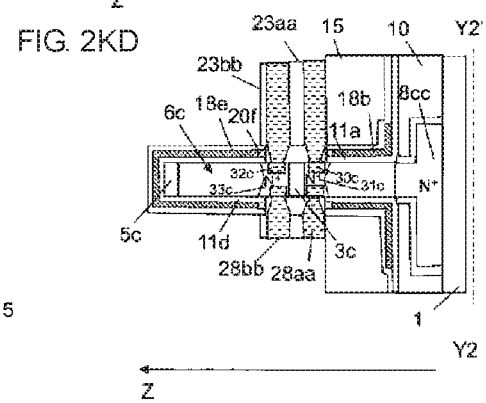

Next, as illustrated in FIG. 2KA to FIG. 2KD, heat treatment is performed to promote the silicidation of the NiSi layers 28a and 28b, and also the As atoms are diffused into the Si pillars 6b and 6c and the B atoms are diffused into the Si pillar 6a through the protrusions formed due to the impurity forcing effect. Thus, NiSi layers 30a, 30b, and 30c are formed in the side surface layers of the Si pillars 6a, 6b, and 6c in contact with the NiSi layer 28a, respectively. At the same time, the B atoms are diffused into the Si pillar 6a and the As atoms are diffused into the Si pillars 6b and 6c due to the impurity forcing effect to form a $P^+$ layer 31a and $N^+$ layers 31b and 31c containing high-concentration acceptor or donor impurities inside the Si pillar 6a and the Si pillars 6b and 6c, respectively. Similarly, NiSi layers 32a, 32b, and 32c are formed in the side surface layers of the Si pillars 6a, 6b, and 6c in contact with the NiSi layer 28b, respectively. At the same time, the B atoms are diffused into the Si pillar 6a and the As atoms are diffused into the Si pillars 6b and 6c due to the impurity forcing effect to form a $P^+$ layer 33a and $N^+$ layers 33b and 33c containing high-concentration acceptor or donor impurities inside the Si pillar 6a and the Si pillars 6b and 6c, respectively. In the $SiO_2$ layers 3a, 3b, and 3c, the thermal diffusion of donor and acceptor impurity atoms is suppressed and the silicidation is also suppressed. Therefore, the $P^+$ layer 31a and the $P^+$ layer 33a, the $N^+$ layer 31b and the $N^+$ layer 33b, and the $N^+$ layer 31c and the $N^+$ layer 33c are separated by the $SiO_2$ layers 3a, 3b, and 3c, respectively. Then, the NiSi layers 28a and 28b and the $SiO_2$ layers 23a and 23b are patterned by lithography and RIE so as to be left on the peripheries of the Si pillars 6a, 6b, and 6c. Thus, NiSi layers 28aa and 28bb and $SiO_2$ layers 23aa and 23bb are formed.

Figure 2L:
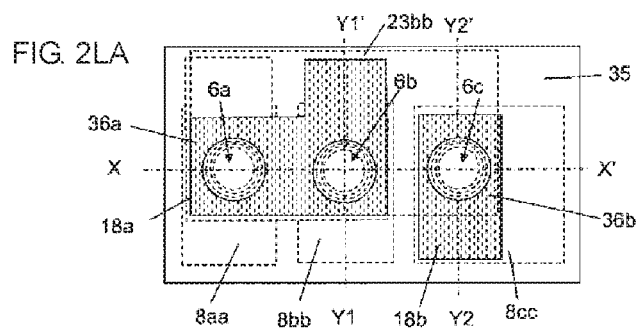
FIGS. 2LA to 2LD are a plan view and sectional views for describing a method for producing a pillar-shaped semiconductor device including an SGT according to the first embodiment.
Figure 2L:
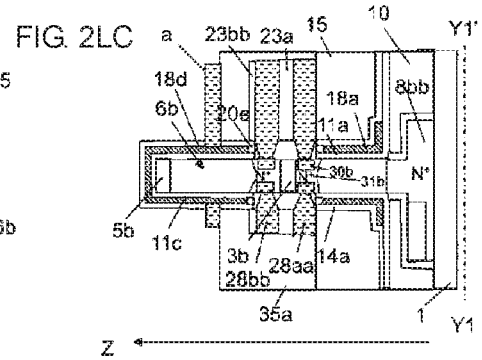
Figure 2L:
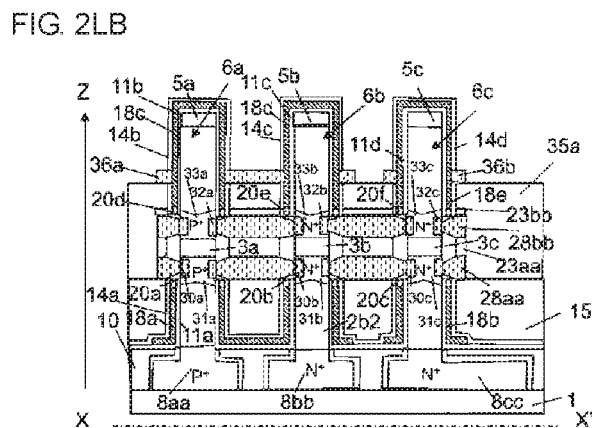
Figure 2L:
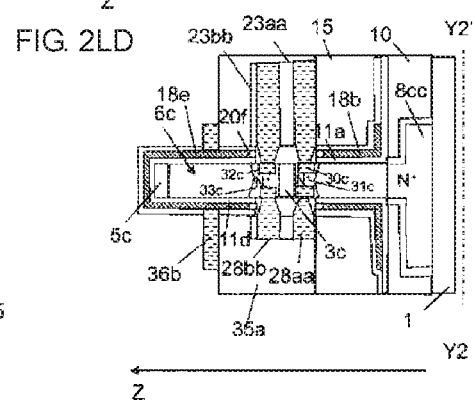

Next, as illustrated in FIG. 2LA to FIG. 2LD, an SiN layer 35a is formed by the same method as that used to form the SiN layer 15 such that the upper surface of the SiN layer 35a is located in the middle of the height of the TiN layers 18c, 18d, and 18e. Then, openings are formed on the peripheries of the TiN layers 18c, 18d, and 18e by the same method as that used to form the spaces 25a, 25b, and 25c. Then, an NiSi layer 36a in contact with the TiN layers 18c and 18d and an NiSi layer 36b in contact with the TiN layer 18e are formed.

Next, as illustrated in FIG. 2MA to FIG. 2MD, an $SiO_2$ layer 35b is formed such that the upper surface of the $SiO_2$ layer 35b is positioned higher than the surfaces of the NiSi layer 36a and 36b and lower than the tops of the Si pillars 6a, 6b, and 6c. Then, the $SiO_2$ layers 14b, 14c, and 14d, the TiN layers 18c, 18d, and 18e, and the $HfO_2$ layers 11b, 11c, and 11d located around the tops of the Si pillars 6a, 6b, and 6c are etched using the $SiO_2$ layer 35b as a mask.

Next, as illustrated in FIG. 2NA to FIG. 2ND, an SiN layer 35c is formed on the $SiO_2$ layer 35b on the peripheries of the Si pillars 6a, 6b, and 6c. An $SiO_2$ film (not illustrated) is entirely formed, and then an $SiO_2$ layer 35d which has a flat surface and whose upper surface is flush with the tops of the Si pillars 6a, 6b, and 6c is formed by CMP. An $SiN/SiO_2$ layer (not illustrated) including an SiN layer as a lower layer and an $SiO_2$ layer as an upper layer is entirely formed. An $SiN/SiO_2$ layer 35e is formed below a resist layer 37a by lithography and RIE. The resist layer 37a is then removed. The top portion of the Si pillar 6a is etched using the $SiO_2$ layer 35d and the $SiN/SiO_2$ layer 35e as etching masks to form a recess 38AA. The recess 38AA is formed so as to have a bottom at the same height as that of the lower surface of the SiN layer 35c. When viewed in plan, the recess 38AA has the same shape as the Si pillar 6a and is formed in a self-aligned manner. The formation in a self-aligned manner means that the recess 38AA is formed without using lithography and is formed without causing misalignment between the Si pillar 6a and the mask that occurs when lithography is used.

Next, as illustrated in FIG. 2OA to FIG. 2OD, a $P^+$ layer (not illustrated) such as a Si or SiGe layer containing an acceptor impurity in a high concentration is formed on the Si pillar 6a at the bottom of the recess 38 by epitaxial crystal growth until the top of the $P^+$ layer is positioned higher than the upper surface of the $SiO_2$ layer 35d. The top of the $P^+$ layer and the $SiN/SiO_2$ layer 35e are removed by CMP to form a $P^+$ layer 38a having an upper surface that is flush with the upper surface of the $SiO_2$ layer 35d. Alternatively, a $P^+$ layer 38a may be formed by a selective epitaxial method so as to have an upper surface that is positioned near the $SiO_2$ layer 35d. In this case, the top of the $P^+$ layer 38a is not necessarily polished by CMP. Thus, the $P^+$ layer 38a is formed in a self-aligned manner for the Si pillar 6a.

Next, as illustrated in FIG. 2PA to FIG. 2PD, a resist layer 37b and an $SiN/SiO_2$ layer 35f are formed by the same method as that described in FIG. 2NA to FIG. 2ND so as to cover the Si pillar 6a in plan view. The resist layer 37b is then removed. The tops of the Si pillars 6b and 6c are etched using the $SiO_2$ layer 35d and the $SiN/SiO_2$ layer 35f as etching masks to form recesses 38BB and 38CC. As in the case of the recess 38AA, the recesses 38BB and 38CC are formed so as to have a bottom at the same height as that of the lower surface of the SiN layer 35c. Thus, the recesses 38BB and 38CC are formed in a self-aligned manner for the Si pillars 6b and 6c as in the case of the recess 38AA.

Figure 2Q:
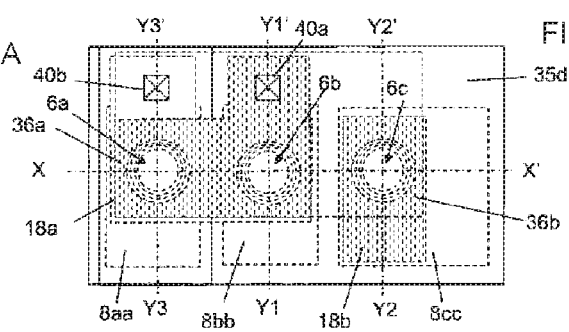
FIGS. 2QA to 2QE are a plan view and sectional views for describing a method for producing a pillar-shaped semiconductor device including an SGT according to the first embodiment.
Figure 2Q:
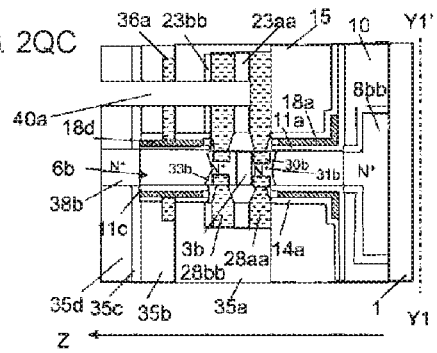
Figure 2Q:
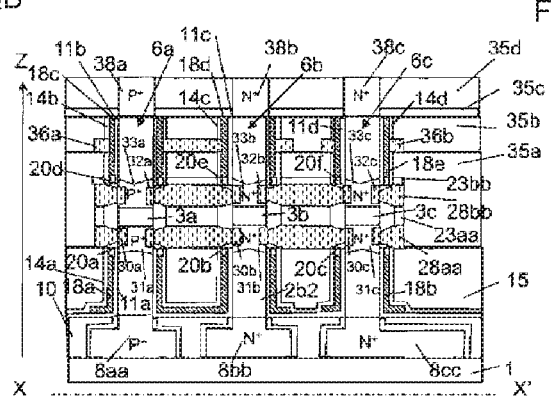
Figure 2Q:
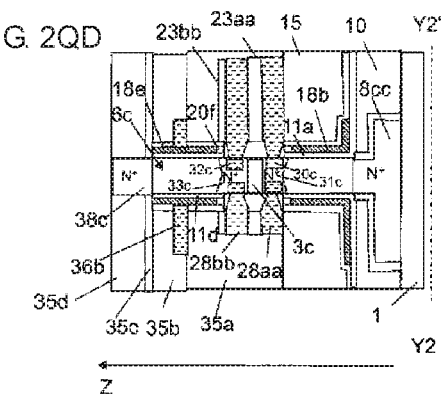
Figure 2Q:
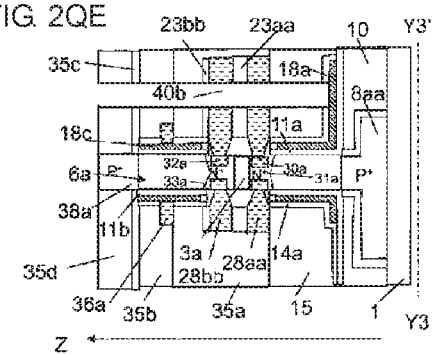

FIG. 2QA to FIG. 2QE illustrate the subsequent process. FIG. 2QE is a sectional view taken along line Y3-Y3' in FIG. 2QA. As illustrated in FIG. 2QA to FIG. 2QE, in the same manner as described in FIG. 2OA to FIG. 2OD, an $N^+$ layer (not illustrated) such as a Si or SiGe layer containing a donor impurity is formed on the Si pillars 6b and 6c at the bottoms of the recesses 38BB and 38CC by epitaxial crystal growth until the upper surface of the $N^+$ layer is positioned higher than the upper surface of the $SiO_2$ layer 35d. The top of the $N^+$ layer and the $SiN/SiO_2$ layer 35f are removed by CMP to form $N^+$ layers 38b and 38c each having an upper surface that is flush with the upper surface of the $SiO_2$ layer 35d. Thus, the $N^+$ layers 38b and 38c are formed in a self-aligned manner for the Si pillars 6b and 6c. Subsequently, a contact hole 40a is formed on the NiSi layer 28aa by lithography and RIE so as to extend through the $SiO_2$ layer 35d, the SiN layer 35c, the $SiO_2$ layer 35b, the NiSi layer 36a, the SiN layer 35a, the $SiO_2$ layer 23bb, the NiSi layer 28bb, and the $SiO_2$ layer 23aa. Similarly, a contact hole 40b is formed on the TiN layer 18a by lithography and RIE so as to extend through the $SiO_2$ layer 35d, the SiN layer 35c, the $SiO_2$ layer 35b, the SiN layer 35a, the $SiO_2$ layer 23bb, the NiSi layer 28bb, the $SiO_2$ layer 23aa, the NiSi layer 28aa, the SiN layer 15, and the $SiO_2$ layer 14a.

Figure 2R:
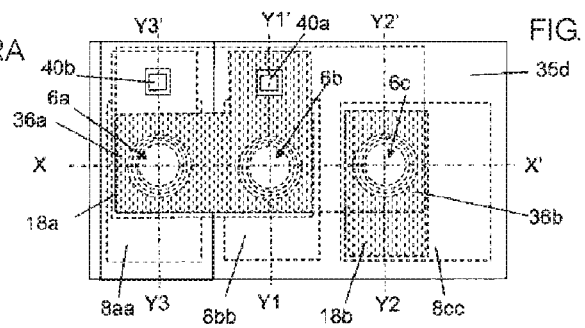
FIGS. 2RA to 2RE are a plan view and sectional views for describing a method for producing a pillar-shaped semiconductor device including an SGT according to the first embodiment.
Figure 2R:
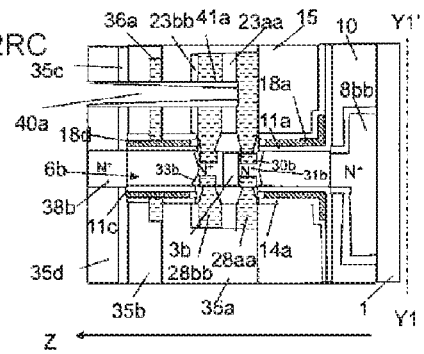
Figure 2R:
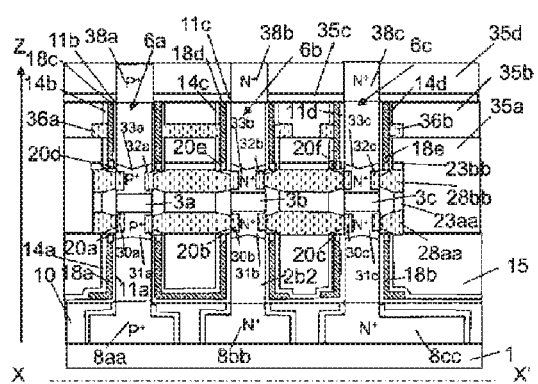
Figure 2R:
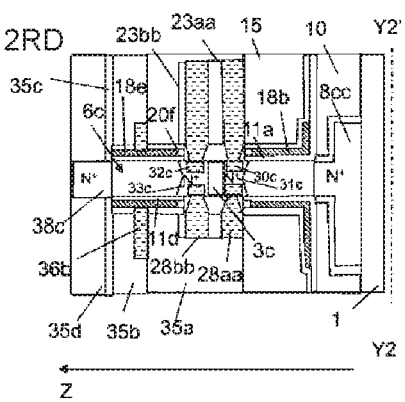
Figure 2R:
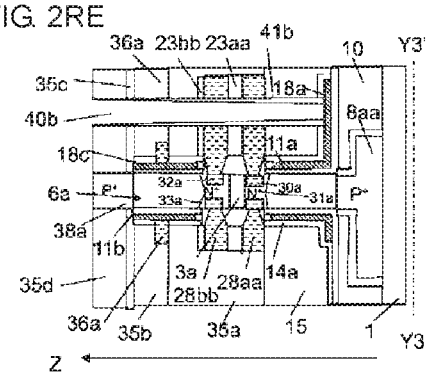

Next, an $SiO_2$ layer (not illustrated) is entirely deposited by ALD. As illustrated in FIG. 2RA to FIG. 2RE, the $SiO_2$ layer on the NiSi layer 28aa is removed by RIE while an $SiO_2$ layer 41a is left on the side surface of the contact hole 40a. Similarly, the $SiO_2$ layer on the TiN layer 18a is removed while an $SiO_2$ layer 41b is left on the side surface of the contact hole 40b.

Figure 2S:
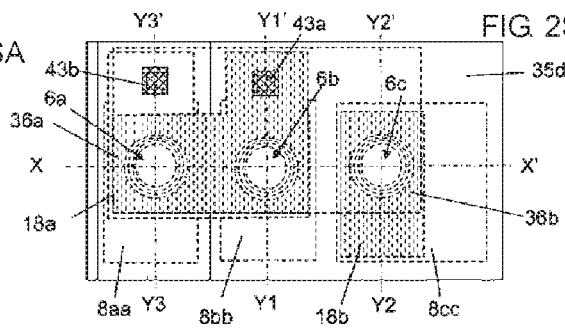
FIGS. 2SA to 2SE are a plan view and sectional views for describing a method for producing a pillar-shaped semiconductor device including an SGT according to the first embodiment.
Figure 2S:
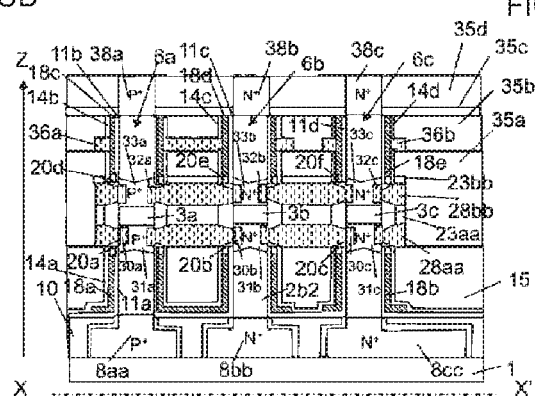
Figure 2S:
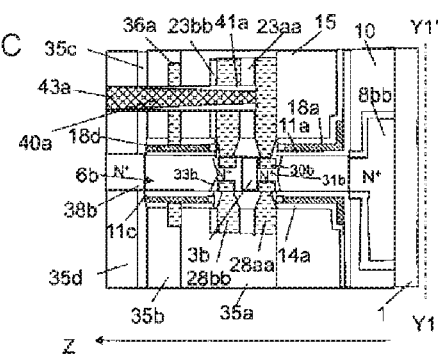
Figure 2S:
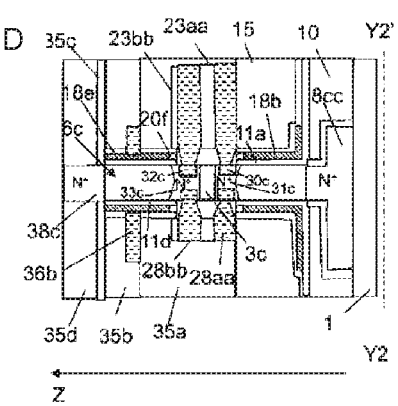
Figure 2S:
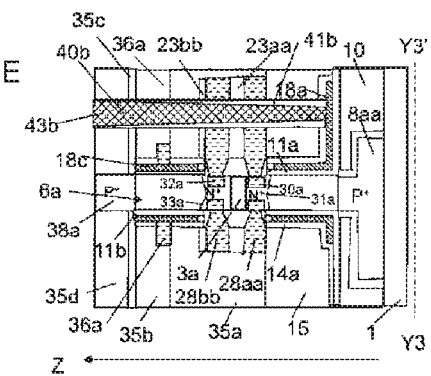

Next, a tungsten (W) layer (not illustrated) is entirely deposited inside the contact holes 40a and 40b and on the NiSi layer 28aa by ALD. As illustrated in FIG. 2SA to FIG. 2SE, the surface of the W layer is polished by MCP to form W layers 43a and 43b each having an upper surface that is flush with the tops of the P⁺ layer 38a and the N⁺ layers 38b and 38c and the upper surface of the SiO₂ layer 35d.

Next, the SiO₂ layer 35d is removed to expose portions of the P⁺ layer 38a, the N⁺ layers 38b and 38c, and the W layers 43a and 43b above the upper surface of the SiN layer 35c. An SiO₂ layer (not illustrated) is entirely deposited by CVD. As illustrated in FIG. 2TA to FIG. 2TE, the SiO₂ layer is etched to the upper surface of the SiN layer 35c by RIE. Thus, SiO₂ layers 46a and 46b are left on the side surfaces of the W layers 43a and 43b, respectively. At the same time, SiO₂ layers 46c, 46d, and 46e are left on the side surfaces of the P⁺ layer 38a and the N⁺ layers 38b and 38c, respectively. Thus, the SiO₂ layers 46a to 46e are formed without using lithography so as to surround the tops of the N⁺ layers 38b and 38c and the W layers 43a and 43b in a tubular shape when viewed in plan. Thus, the SiO₂ layers 46a to 46e are formed in a self-aligned manner for the tops of the N⁺ layers 38b and 38c and the W layers 43a and 43b. As a result of the self-alignment, the SiO₂ layers 46a to 46e that are fine layers in plan view are formed with certainty. Herein, the SiO₂ layers 46a to 46e that surround the tops of the N⁺ layers 38b and 38c and the W layers 43a and 43b in a tubular shape may be formed by another method. The SiO₂ layers 46a to 46e may have any shape when viewed in plan as long as they surround the side surfaces of the P⁺ layer 38a, the N⁺ layers 38b and 38c, and the W layers 43a and 43b.

Figure 2U:
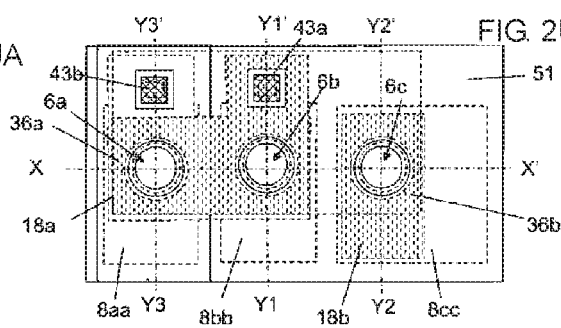
FIGS. 2UA to 2UE are a plan view and sectional views for describing a method for producing a pillar-shaped semiconductor device including an SGT according to the first embodiment.
Figure 2U:
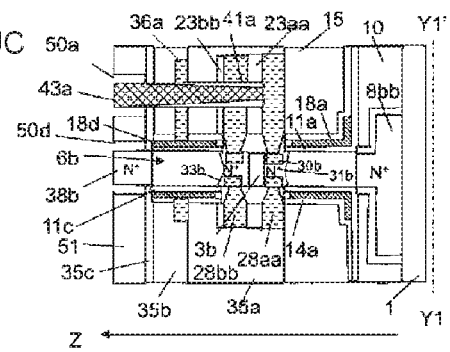
Figure 2U:
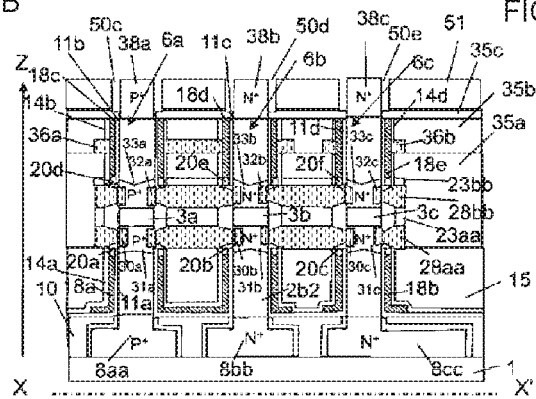
Figure 2U:
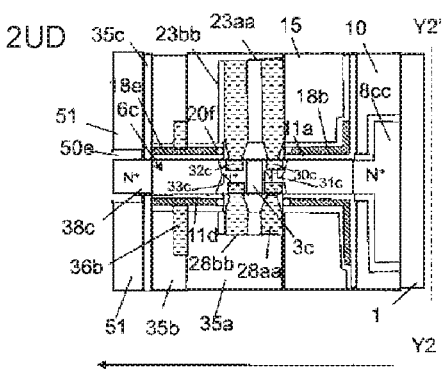
Figure 2U:
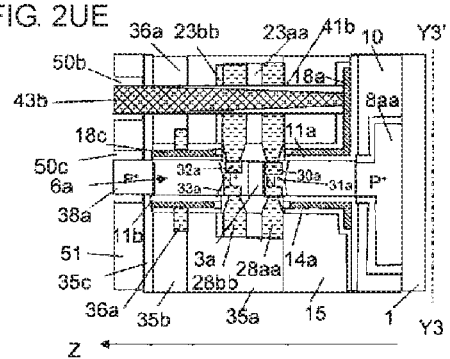

Next, for example, an aluminum oxide (AlO) insulating layer (not illustrated) is entirely deposited by CVD. As illustrated in FIG. 2UA to FIG. 2UE, the AlO layer is polished by CMP to form a flat AlO layer 51 having an upper surface that is flush with the tops of the P⁺ layer 38a and the N⁺ layers 38b and 38c and the upper surfaces of the W layers 43a and 43b. The SiO₂ layers 46a, 46b, 46c, 46d, and 46e on the side surfaces of the P⁺ layer 38a, the N⁺ layers 38b and 38c, and the W layers 43a and 43b are then removed. Thus, contact holes 50a, 50b, 50c, 50d, and 50e are formed so as to surround the tops of the P⁺ layer 38a and the N⁺ layers 38b and 38c and the W layers 43a and 43b in a tubular shape with an equal width when viewed in plan. Since the SiO₂ layers 46a to 46e are formed in a self-aligned manner for the N⁺ layers 38b and 38c and the W layers 43a and 43b, the contact holes 50a, 50b, 50c, 50d, and 50e are formed in a self-aligned manner for the P⁺ layer 38a, the N⁺ layers 38b and 38c, and the W layers 43a and 43b.

Next, a resist layer (not illustrated) is formed so as to cover the contact holes 50c, 50d, and 50e. As illustrated in FIG. 2VA to FIG. 2VE, the SiN layer 35c and the SiO₂ layer 35b on the periphery of the W layer 43a are etched by RIE using the resist layer and the AlO layer 51 as masks to form a contact hole 50aa on the NiSi layer 36a. Similarly, the SiN layer 35c, the SiO₂ layer 35b, the SiN layer 35a, and the SiO₂ layer 23bb and the SiO₂ layer 41b in contact with the foregoing layers on the periphery of the W layer 43b are etched using the resist layer and the AlO layer 51 as masks to form a contact hole 50bb on the NiSi layer 28bb. Thus, the contact holes 50aa and 50bb are formed in a self-aligned manner for the W layers 43a and 43b.

Next, a W layer (not illustrated, a thin barrier conductor layer made of, for example, Ti may be formed first to decrease the contact resistance between the P⁺ layer 38a and the W layer and between the N⁺ layers 38b and 38c and the W layer) is deposited inside the contact holes 50c, 50d, 50e, 50aa, and 50bb and on the AlO layer 51 by ALD. As illustrated in FIG. 2WA to FIG. 2WE, the W layer is polished by CMP so as to have an upper surface that is flush with the tops of the P⁺ layer 38a and the N⁺ layers 38b and 38c, and the W layers 43a and 43b. Thus, W layers 52a, 52b, 52c, 52d, and 52e are formed inside the contact holes 50aa, 50bb, 50c, 50d, and 50e so as to surround the side surfaces of the W layers 43a and 43b, the side surface of the P⁺ layer 38a, and the side surfaces of the N⁺ layers 38b and 38c, respectively. Thus, the W layers 52a, 52b, 52c, 52d, and 52e have the same shapes as the contact holes 50aa, 50bb, 50c, 50d, and 50e, respectively. The contact holes 50aa, 50bb, 50c, 50d, and 50e are formed in a self-aligned manner for the W layers 43a and 43b, the P⁺ layer 38a, and the N⁺ layers 38b and 38c, respectively. Therefore, the W layers 52a, 52b, 52c, 52d, and 52e are formed in a self-aligned manner for the W layers 43a and 43b, the P⁺ layer 38a, and the N⁺ layers 38b and 38c, respectively. Thus, the widths of the SiO₂ layers 46a, 46b, 46c, 46d, and 46e in plan view can be decreased compared with the case where lithography is used because there is no need to leave margins for mask alignment in lithography. The W layers 52a, 52b, 52c, 52d, and 52e may each be, for example, another metal layer, an alloy layer, a semiconductor layer containing a donor or acceptor impurity atom in a high concentration. These layers may be conductor material layers having a single-layer structure or a multi-layer structure.

Next, as illustrated in FIG. 2XA to FIG. 2XE, an SiO₂ layer 54 is entirely formed. A contact hole 55a is formed on the P⁺ layer 38a so as to extend through the SiO₂ layer 54. A contact hole 55b is formed on the N⁺ layer 38b so as to extend through the SiO₂ layer 54. A contact hole 55c is formed on the P⁺ layer 8aa so as to extend through the SiO₂ layer 54, the AlO layer 51, the SiN layer 35c, the SiO₂ layer 35b, the SiN layers 35a and 15, the SiO₂ layer 14a, the HfO₂ layer 11b, and the SiO₂ layers 10 and 7a. A contact hole 55d is formed on the N⁺ layer 8bb so as to extend through the SiO₂ layer 54, the AlO layer 51, the SiN layer 35c, the SiO₂ layer 35b, the SiN layers 35a and 15, the SiO₂ layer 14a, the HfO₂ layer 11a, and the SiO₂ layers 10 and 7b. Then, silicide layers are formed. That is, NiSi layers 67a and 67b are formed in the top portions of the Si pillars 6a and 6b, respectively; an NiSi layer 67c is formed in an upper portion of the P⁺ layer 8aa at the bottom of the contact hole 55c; and an NiSi layer 67d is formed in an upper portion of the N⁺ layer 8bb at the bottom of the contact hole 55c. The NiSi layers 67a and 67b are desirably formed so as to extend to the peripheries of the Si pillars 6a and 6b when viewed in plan. A power supply wiring metal layer VDD connected to the P⁺ layers 38a and 8aa through the contact holes 55a and 55c and a ground wiring metal layer VSS connected to the N⁺ layers 38b and 8bb through the contact holes 55b and 55d are formed.

Next, as illustrated in FIG. 2YA to FIG. 2YE, an SiO₂ layer 56 is entirely formed by CVD and CMP. Then, a contact hole 57 is formed on the TiN layer 18b so as to extend through the SiO₂ layers 56 and 54, the AlO layer 51, the SiN layer 35c, the SiO₂ layer 35b, the SiN layer 35a, the SiN layer 15, and the SiO₂ layer 14a. A word-line wiring metal layer WL connected to the TiN layer 18b through the contact hole 57 is formed.

Next, as illustrated in FIG. 2ZA to FIG. 2ZE, an SiO₂ layer 58 is entirely formed by CVD and CMP. Then, a contact hole 60a is formed on the N⁺ layer 38c on the top of the Si pillar 6c so as to extend through the SiO₂ layers 58, 56, and 54. Similarly, a contact hole 60b is formed on the N⁺ layer 8cc so as to extend through the SiO₂ layers 58, 56, and 54, the AlO layer 51, the SiN layer 35c, the SiO₂ layer 35b, the SiN layers 35a and 15, the SiO₂ layer 14a, the HfO₂ layer 11a, and the SiO₂ layers 10 and 7c. Then, silicide layers are formed. That is, an NiSi layer 67e is formed in a top portion of the Si pillar 6c, and an NiSi layer 67f is formed in an upper portion of the N⁺ layer 8cc at the bottom of the contact hole 60b. Then, a bit-line wiring metal layer BL that is connected to the N⁺ layer 38c through the contact hole 60a and extends in a line Y2-Y2' direction in plan view is formed. An inverted bit-line wiring metal layer BLR that is connected to the N⁺ layer 8cc through the contact hole 60b and extends parallel to the bit-line wiring metal layer BL in plan view is formed.

As illustrated in FIG. 2ZA to FIG. 2ZE, an SGT (corresponding to the P-channel SGT_Pc1 in FIG. 1B) including the P⁺ layer 33a as a drain, the P⁺ layer 38a as a source, the TiN layer 18c as a gate, and a portion of the Si pillar 6a between the P⁺ layers 33a and 38a as a channel is formed in the upper part of the Si pillar 6a. An SGT (corresponding to the P-channel SGT_Pc2 in FIG. 1B) including the P⁺ layer 8aa as a source, the P⁺ layer 31a as a drain, the TiN layer 18a as a gate, and a portion of the Si pillar 6a between the P⁺ layers 8aa and 31a as a channel is formed in the lower part of the Si pillar 6a.

An SGT (corresponding to the N-channel SGT_Nc1 in FIG. 1B) including the N⁺ layer 33b as a source, the N⁺ layer 38b as a drain, the TiN layer 18d as a gate, and a portion of the Si pillar 6b between the N⁺ layers 33b and 38b as a channel is formed in the upper part of the Si pillar 6b. An SGT (corresponding to the N-channel SGT_Nc2 in FIG. 1B) including the N⁺ layer 8bb as a source, the N⁺ layer 31b as a drain, the TiN layer 18a as a gate, and a portion of the Si pillar 6a between the N⁺ layers 8bb and 31b as a channel is formed in the lower part of the Si pillar 6b.

An SGT (corresponding to the N-channel SGT_SN1 in FIG. 1B) including the N⁺ layer 33c as a source, the N⁺ layer 38c as a drain, the TiN layer 18e as a gate, and a portion of the Si pillar 6c between the N⁺ layers 33c and 38c as a channel is formed in the upper part of the Si pillar 6c. An SGT (corresponding to the N-channel SGT_Nc2 in FIG. 1B) including the N⁺ layer 8cc as a source, the N⁺ layer 31c as a drain, the TiN layer 18b as a gate, and a portion of the Si pillar 6c between the N⁺ layers 8cc and 31c as a channel is formed in the lower part of the Si pillar 6c.

These SGTs (corresponding to the SGTs_Pc1, Pc2, Nc1, Nc2, SN1, and SN2 in FIG. 1B) are connected through wires to form an SRAM cell circuit. The SRAM cell circuit includes, as schematically illustrated in FIG. 1B, a circuit region (corresponding to the circuit region C1 in FIG. 1B) constituted by a P-channel SGT (corresponding to the P-channel SGT_Pc1 in FIG. 1B) and N-channel SGTs (corresponding to the N-channel SGTs_Nc1 and SN1 in FIG. 1B) formed in the upper parts of the Si pillars 6a, 6b, and 6c and a circuit region (corresponding to the circuit region C2 in FIG. 1B) constituted by a P-channel SGT (corresponding to the P-channel SGT_Pc2 in FIG. 1B) and N-channel SGTs (corresponding to the N-channel SGTs_Nc2 and SN2 in FIG. 1B) formed in the lower parts of the Si pillars 6a, 6b, and 6c.

In the above description, the P⁺ layer 31a, the N⁺ layers 31b and 31c, the P⁺ layer 33a, and the N⁺ layers 33b and 33c are entirely formed inside the Si pillars 6a, 6b, and 6c when viewed in plan, but may be formed on the side surfaces of the Si pillars 6a, 6b, and 6c. Alternatively, the P⁺ layer 31a and the N⁺ layers 31b and 31c may be formed by single crystal semiconductor layers that have been formed on the side surfaces of the Si pillars 6a, 6b, and 6c and contain a donor or acceptor atom in a high concentration. The same applies to the P⁺ layer 8aa and the N⁺ layers 8bb and 8cc at the bottoms.

The following features are provided according to the production method of the first embodiment.

1. As illustrated in FIG. 2NA to FIG. 2QE, the P⁺ layer 38a, N⁺ layers 38b and 38c each containing an acceptor or donor impurity in a high concentration are formed, by epitaxial crystal growth, on the Si pillars 6a, 6b, and 6c at the bottoms of the recesses 38AA, 38BB, and 38CC formed by etching the top portions of the Si pillars 6a, 6b, and 6c. In this method, the concentration of the acceptor or donor impurity can be further increased and the impurity concentration distribution can be sharply changed at the boundaries between the P⁺ layer 38a and the Si pillar 6a, between the N⁺ layer 38b and the Si pillar 6b, and between the N⁺ layer 38c and the Si pillar 6c compared with, for example, the case where the P⁺ layer 38a and the N⁺ layers 38b and 38c are formed by ion implantation. These two features can decrease the diode junction resistance of the P⁺ layer 38a and the N⁺ layers 38b and 38c. This can contribute to driving of an SGT circuit at lower voltage and higher speed.

2. Furthermore, as illustrated in FIG. 2ZA to FIG. 2ZE, the side surfaces of the P⁺ layer 38a and the N⁺ layers 38b and 38c are respectively surrounded by the W layers 52c, 52d, and 52e, which are low-resistance metal layers. The bottoms of the W layers 52c, 52d, and 52e (including barrier metal layers) are located close to the lower ends of the P⁺ layer 38a and the N⁺ layers 38b and 38c, respectively. Thus, the diode junction resistance of the P⁺ layer 38a and the N⁺ layers 38b and 38c can be decreased. This can contribute to driving of an SGT circuit at lower voltage and higher speed.

3. The P⁺ layer 38a and the N⁺ layers 38b and 38c are formed in a self-aligned manner for the Si pillars 6a, 6b, and 6c, respectively. The W layers 52a, 52b, 52c, 52d, and 52e are formed in a self-aligned manner for the W layers 43a and 43b, the P⁺ layer 38a, and the N⁺ layers 38b and 38c, respectively. Thus, the Si pillars 6a, 6b, and 6c, the P⁺ layer 38a and the N⁺ layers 38b and 38c, and the W layers 52c, 52d, and 52c are formed in a self-aligned manner, respectively. The W layers 43a and 43b and the W layers 52a and 52b are formed in a self-aligned manner, respectively. Thus, a further increase in the density of the SGT circuit can be achieved in addition to the driving at lower voltage and higher speed.

Second Embodiment

Figure 3C:
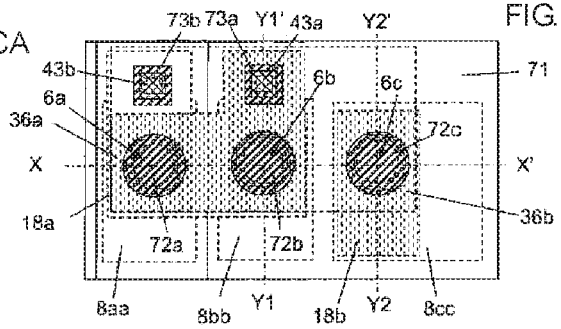
FIGS. 3CA to 3CD are a plan view and sectional views for describing a method for producing a pillar-shaped semiconductor device including an SGT according to the second embodiment.
Figure 3C:
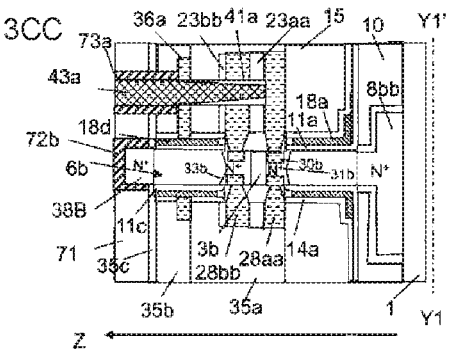
Figure 3C:
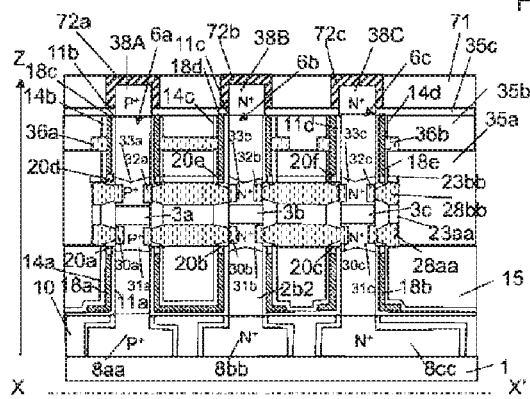
Figure 3C:
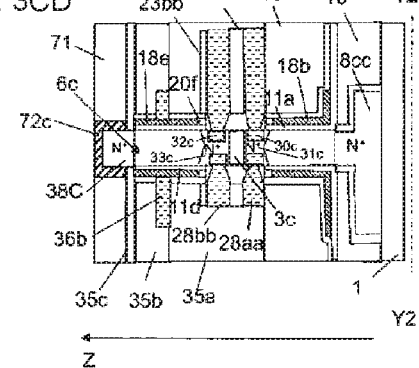

Hereafter, a method for producing a pillar-shaped semiconductor device including an SGT according to a second embodiment of the present invention will be described with reference to FIG. 3AA to FIG. 3CD. FIG. 3AA is a plan view, FIG. 3AB is a sectional view taken along line X-X' in FIG. 3AA, FIG. 3AC is a sectional view taken along line Y1-Y1' in FIG. 3AA, and FIG. 3AD is a sectional view taken along line Y2-Y2' in FIG. 3AA. The production method according to the second embodiment includes the same processes as those illustrated in FIG. 2AA to FIG. 2ZE of the first embodiment, except for the differences described below.

Before the process illustrated in FIG. 3AA to FIG. 3AD, the same processes as those illustrated in FIG. 2AA to FIG. 2TE are performed. Then, for example, an aluminum oxide (AlO) insulating layer (not illustrated) is entirely deposited by CVD. As illustrated in FIG. 3AA to FIG. 3AD, the AlO layer is polished by CMP to form a flat AlO layer 71 having an upper surface that is flush with the tops of the P⁺ layer 38a and the N⁺ layers 38b and 38c and the upper surfaces of the W layers 43a and 43b.

Next, as illustrated in FIG. 3BA to FIG. 3BD, the tops of the P$^+$ layer 38a and the N$^+$ layers 38b and 38c are etched using the AlO layer 71 and the SiO$_2$ layers 46a to 46e as etching masks to form a P$^+$ layer 38A and N$^+$ layers 38B and 38C.

Next, as illustrated in FIG. 3CA to 3CD, the SiO$_2$ layers 46a to 46e are removed, and then a W layer (not illustrated, including a thin buffer metal layer) is entirely formed such that the upper surface of the W layer is higher than the upper surface of the AlO layer 71. The W layer is polished by CMP until the upper surface of the W layer reaches the position of the upper surface of the AlO layer 71 to form W layers 72a, 72b, and 72c that respectively surround the side surfaces and tops of the P$^+$ layer 38A and the N$^+$ layers 38B and 38C. At the same time, W layers 73a and 73b that respectively surround the side surfaces of the tops of the W layers 43a and 43b are formed. Hereafter, by performing the same processes as those illustrated in FIG. 2XA to FIG. 2ZE, an SRAM cell similar to that in the first embodiment is formed. In this process, the NiSi layers 67a, 67b, and 67e in the first embodiment are not necessarily formed.

The method for producing a pillar-shaped semiconductor device including an SGT according to this embodiment provides the following feature.

In the first embodiment, the NiSi layers 67a, 67b, and 67c are formed in the top portions of the P$^+$ layer 38a and the N$^+$ layers 38b and 38c, respectively. These NiSi layers 67a, 67b, and 67c are formed by coating a Ni layer on the upper surfaces of the P$^+$ layer 38a and the N$^+$ layers 38b and 38c and then performing heat treatment to cause silicidation of the top portions of the P$^+$ layer 38a and the N$^+$ layers 38b and 38c. In the formation of the NiSi layers 67a, 67b, and 67c due to the silicidation, a silicide region having high resistance is formed in regions between the NiSi layer 67a and the P$^+$ layer 38a, between the NiSi layer 67b and the N$^+$ layer 38b, and between the NiSi layer 67c and the N$^+$ layer 38c, the regions having different ratios of Ni atoms and Si atoms. This is because the layer having low resistance among NiSi layers is an NiSi$_2$ layer formed at a ratio of two Si atoms to one Ni atom; however, a region in which the ratio shifts extends near the boundaries between the NiSi layer 67a and the P$^+$ layer 38a, between the NiSi layer 67b and the N$^+$ layer 38b, and between the NiSi layer 67c and the N$^+$ layer 38c. This does not pose a problem when a circuit including a typical SGT is formed, but poses a problem when the speed of an SGT circuit is further increased and the voltage of the SGT circuit is further decreased. In contrast, in this embodiment, the W layers 72a, 72b, and 72c (including buffer metal layers) having low resistance are directly formed so as to cover the entire side surfaces and upper surfaces of the P$^+$ layer 38A and the N$^+$ layers 38B and 38C, respectively. This can further decrease the diode PN junction resistance at the P$^+$ layer 38A and the N$^+$ layers 38B and 38C, which achieves the driving of an SGT circuit at lower voltage and higher speed.

Third Embodiment

Figure 4A:
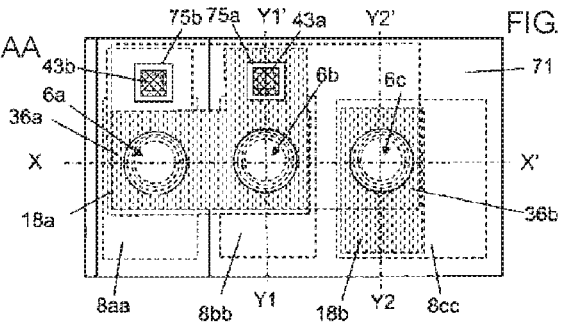
FIGS. 4AA to 4AD are a plan view and sectional views for describing a method for producing a pillar-shaped semiconductor device including an SGT according to a third embodiment of the present invention.
Figure 4A:
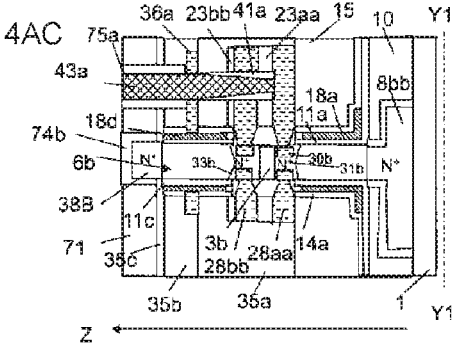
Figure 4A:
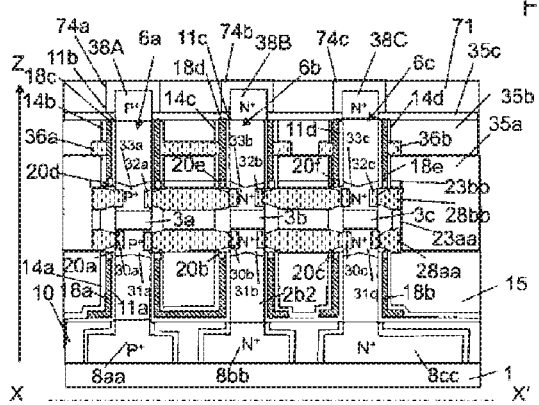
Figure 4A:
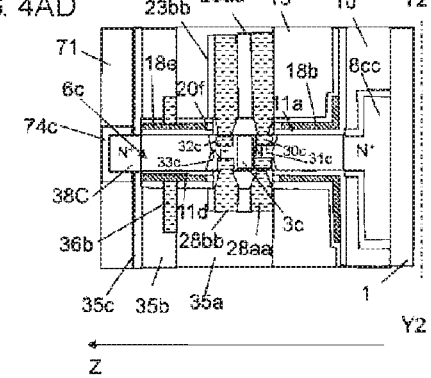

Hereafter, a method for producing a pillar-shaped semiconductor device including an SGT according to a third embodiment of the present invention will be described with reference to FIG. 4AA to FIG. 4BD. FIG. 4AA is a plan view, FIG. 4AB is a sectional view taken along line X-X' in FIG. 4AA, FIG. 4AC is a sectional view taken along line Y1-Y1' in FIG. 4AA, and FIG. 4AD is a sectional view taken along line Y2-Y2' in FIG. 4AA.

Before the process illustrated in FIG. 4AA to FIG. 4AD, the same process as that illustrated in FIG. 3BA to FIG. 3BD is performed. The SiO$_2$ layers 46a, 46b, 46c, 46d, and 46e that respectively surround the side surfaces of the P$^+$ layer 38A, the N$^+$ layers 38B and 38C, and the W layers 43a and 43b are removed by performing etching, and contact holes 50aa, 50bb, 50c, 50d, and 50e (not illustrated) are formed through the same processes as those illustrated in FIG. 2UA to FIG. 2VE. A buffer metal layer made of, for example, Ti or TiN is entirely formed. The buffer metal layer is polished by CMP so as to have an upper surface that is flush with the upper surface of the AlO layer 71. Thus, buffer metal layers 74a, 74b, and 74c are formed so as to cover the P$^+$ layer 38A and the N$^+$ layers 38B and 38C, respectively. At the same time, buffer metal layers 75a and 75b are also formed on the side surfaces of the W layers 43a and 43b, respectively.

Next, a W layer (not illustrated) is entirely formed. As illustrated in FIG. 4BA to FIG. 4BD, W layers 76a, 76b, 76c, 77a, and 77b are formed on the buffer metal layers 74a, 74b, 74c, 75a, and 75b and the W layers 43a and 43b by lithography and RIE. Then, by performing the same processes as those illustrated in FIG. 2XA to FIG. 2ZE as in the first embodiment, an SRAM cell similar to that in the first embodiment is formed.

The method for producing a pillar-shaped semiconductor device including an SGT according to this embodiment provides the following feature.

In the first embodiment, the W layers 52a, 52b, 52c, 52d, and 52e are formed so as to surround the side surfaces of the W layers 43a and 43b, the P$^+$ layer 38a, and the N$^+$ layers 38b and 38c, respectively. In this case, if a buffer metal layer made of, for example, Ti or TiN is disposed between the W layer 52c and the P$^+$ layer 38a, between the W layer 52d and the N$^+$ layer 38b, and between the W layer 52e and the N$^+$ layer 38c with certainty to decrease the contact resistance between the W layer 52c and the P$^+$ layer 38a, between the W layer 52d and the N$^+$ layer 38b, and between the W layer 52e and the N$^+$ layer 38c, the widths of the contact holes 50c, 50d, and 50e illustrated in FIG. 2UA to FIG. 2UE in plan view need to be increased. In contrast, in this embodiment, only the buffer metal layer is formed in the contact holes 50c, 50d, and 50e. Therefore, there is no need to form the W layer in the contact holes 50c, 50d, and 50e. This can decrease the widths of the contact holes 50c, 50d, and 50e in plan view. Thus, the density of an SGT circuit is increased.

Fourth Embodiment

Hereafter, a method for producing a pillar-shaped semiconductor device including an SGT according to a fourth embodiment of the present invention will be described with reference to FIG. 5A to FIG. 5D. FIG. 5A is a plan view, FIG. 5B is a sectional view taken along line X-X' in FIG. 5A, FIG. 5C is a sectional view taken along line Y1-Y1' in FIG. 5A, and FIG. 5D is a sectional view taken along line Y2-Y2' in FIG. 5A.

After the process illustrated in FIG. 4AA to FIG. 4AD in the third embodiment is performed, W layers 78a, 78b, 78c, 79a, and 79b are formed on the buffer metal layers 74a, 74b, 74c, 75a, and 75b and the W layers 43a and 43b by performing W selective growth. Then, by performing the same processes as those illustrated in FIG. 2XA to FIG. 2ZE as in the first embodiment, an SRAM cell similar to that in the first embodiment is formed.

The method for producing a pillar-shaped semiconductor device including an SGT in this embodiment provides the following feature.

1. In the third embodiment, a W layer (not illustrated) is entirely formed, and then the W layers 76a, 76b, 76c, 77a, and 77b are formed on the buffer metal layers 74a, 74b, 74c, 75a, and 75b and the W layers 43a and 43b by lithography and RIE as illustrated in FIG. 4BA to FIG. 4BD. In contrast, in this embodiment, the W layers 78a, 78b, 78c, 79a, and 79b can be formed in the same manner as in the W layers 76a, 76b, 76c, 77a, and 77b without performing lithography and RIE. Furthermore, the W layers 78a, 78b, 78c, 79a, and 79b are formed in a self-aligned manner for the buffer metal layers 74a, 74b, 74c, 75a, and 75b and the W layers 43a and 43b. This increases the density of an SGT circuit and also simplifies the production process of the SGT circuit.

Fifth Embodiment

Hereafter, a method for producing a pillar-shaped semiconductor device including an SGT according to a fifth embodiment of the present invention will be described with reference to FIG. 6A to FIG. 6D. FIG. 6A is a plan view, FIG. 6B is a sectional view taken along line X-X' in FIG. 6A, FIG. 6C is a sectional view taken along line Y1-Y1' in FIG. 6A, and FIG. 6D is a sectional view taken along line Y2-Y2' in FIG. 6A.

As illustrated in FIG. 2VA to FIG. 2VD, the contact holes 50aa, 50bb, 50c, 50d, and 50e are formed. Then, a buffer conductor layer (not illustrated) and a W layer (not illustrated) are entirely formed. In this case, the buffer conductor layer is formed such that the upper surface of the buffer conductor layer is higher than the upper surface of the AlO layer 51. The surface of the W layer is flattened by CMP. Then, the buffer conductor layer and the W layer are etched by lithography and RIE as illustrated in FIG. 6A to FIG. 6D to form buffer conductor layers 81a, 81b, 81c, 81d, and 81e and W layers 82a, 82b, 82c, 82d, and 82e. By performing the same processes as those illustrated in FIG. 2XA to FIG. 2ZE as in the first embodiment, an SRAM cell similar to that in the first embodiment is formed.

The method for producing a pillar-shaped semiconductor device including an SGT according to this embodiment provides the following feature.

In the third embodiment, the SiO$_2$ layers 46c, 46d, and 46e that are in contact with the side surfaces of the P$^+$ layer 38A and the N$^+$ layers 38B and 38C formed by etching the tops of the P$^+$ layer 38a and the N$^+$ layers 38b and 38c are removed by performing etching. Then, the buffer conductor layers 74a, 74b, and 74c are formed so as to surround the side surfaces and tops of the P$^+$ layer 38A and the N$^+$ layers 38B and 38C, respectively. In contrast, in this embodiment, the buffer conductor layers 81c, 81d, and 81e can be formed so as to surround the entire side surfaces and tops of the P$^+$ layer 38a and the N$^+$ layers 38b and 38c, without etching the tops of the P$^+$ layer 38a and the N$^+$ layers 38b and 38c, respectively. This increases the density of an SGT circuit and also simplifies the production process of the SGT circuit.

Sixth Embodiment

Figure 7B:
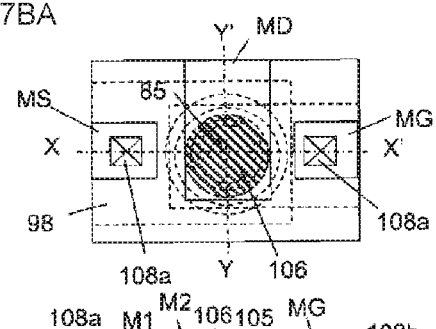
FIGS. 7BA to 7BC are a plan view and sectional views for describing a method for producing a pillar-shaped semiconductor device including an SGT according to the sixth embodiment.
Figure 7B:
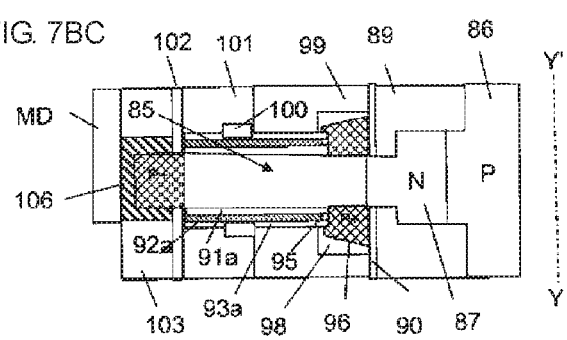
Figure 7B:
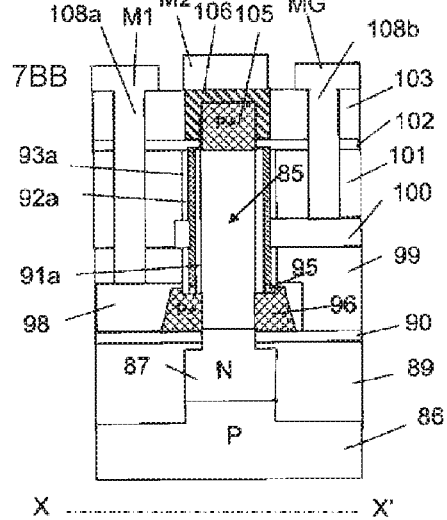

Hereafter, a method for producing a pillar-shaped semiconductor device including an SGT according to a sixth embodiment of the present invention will be described with reference to FIG. 7AA to FIG. 7BC. FIG. 7AA is a plan view, FIG. 7AB is a sectional view taken along line X-X' in FIG. 7AA, and FIG. 7AC is a sectional view taken along line Y-Y' in FIG. 7AA.

As illustrated in FIG. 7AA to FIG. 7AC, an Si pillar 85 is formed on an N layer 87 on a P layer 86. An SiN layer 89 is formed on the periphery of the N layer 87. An HfO$_2$ layer (not illustrated), a TiN layer (not illustrated), and an SiO$_2$ layer (not illustrated) are entirely formed by ALD. Portions of the SiO$_2$ layer, the TiN layer, and the HfO$_2$ layer on the SiN layer 89 and on the periphery of the lower portion of the Si pillar 85 are etched to form an opening 94, an HfO$_2$ layer 91, a TiN layer 92, and an SiO$_2$ layer 93. An insulating layer 95 is formed at the edge of the TiN layer 92 facing the opening 94. An SiO$_2$ layer 90 having an upper surface located in the lower part of the opening 94 is formed on the SiN layer 89 so as to surround the Si pillar 85. A P$^+$ layer 96 serving as a semiconductor layer containing an acceptor impurity in a high concentration is formed in the opening by selective epitaxial crystal growth so as to be in contact with the side surface of the Si pillar 85 and extend in the horizontal direction. The P$^+$ layer 96 serving as a semiconductor layer may be a Si layer or another semiconductor material layer. The periphery of the P$^+$ layer 96 protrudes more outward than the periphery of the SiO$_2$ layer 93 when viewed in plan, but may be dented inward as long as a wiring conductor layer connected to the P$^+$ layer 96 can be formed.

Subsequently, as illustrated in FIG. 7BA to FIG. 7BC, a wiring W layer 98 (including a buffer metal layer) is formed on the SiO$_2$ layer 90 so as to be connected to the P$^+$ layer 96 serving as a semiconductor layer containing an acceptor impurity in a high concentration. An SiN layer 99 is formed on the W layer 98 and the SiO$_2$ layer 90 such that the upper surface of the SiN layer 99 is in the middle of the TiN layer 92a in the vertical direction. A wiring W layer 100 is formed on the SiN layer 99 so as to be in contact with the TiN layer 92a and extend in the horizontal direction. An SiO$_2$ layer 101 is formed so as to surround the Si pillar 85 such that the upper surface of the SiO$_2$ layer 101 is located at an upper portion of the Si pillar 85. In the same manner as in the formation of the P$^+$ layer 38A and the W layer 72a in FIGS. 3AA to 3CD, a P$^+$ layer 105 is formed on the Si pillar 85 by performing epitaxial crystal growth of Si containing an acceptor impurity in a high concentration, a W layer 106 is formed in a self-aligned manner so as to cover the upper surface and periphery of the P$^+$ layer 105, and an AlO layer 103 is formed on the periphery of the W layer 106. A contact hole 108a is formed so as to extend through the AlO layer 103, the SiN layer 102, the SiO$_2$ layer 101, and the SiN layer 99 and reach the wiring W layer 98. A contact hole 108b is formed so as to extend through the AlO layer 103, the SiN layer 102, and the SiO$_2$ layer 101 and reach the wiring W layer 100. A wiring metal layer M1 connected to the wiring W layer 98 through the contact hole 108a, a wiring metal layer MG connected to the wiring W layer 100 through the contact hole 108b, and a wiring metal layer M2 connected to the W layer 106 are formed. Thus, an SGT including the P$^+$ layer 96 as a source, the P$^+$ layer 105 as a drain, the TiN layer 92a as a gate, and a portion of the Si pillar 85 between the P$^+$ layers 96 and 105 as a channel is formed. The W layer 106 may be another metal layer, an alloy layer, or a semiconductor layer containing an acceptor impurity atom in a high concentration, such as a Si or SiGe layer. When the semiconductor layer containing an acceptor impurity atom in a high concentration is used, this region also functions as a P$^+$ layer serving as a source or a drain. This is effective when the Si pillar 85 is narrow and an impurity region serving as a source or a drain does not have a sufficient volume.

The method for producing a pillar-shaped semiconductor device including an SGT according to this embodiment provides the following features.

1. The P+ layer 96 connected to the side surface of the lower portion of the Si pillar 85 is also formed by epitaxial crystal growth of Si containing an acceptor impurity in a high concentration as in the case of the P+ layer 105 formed in the upper portion of the Si pillar 85. Thus, the impurity regions serving as a source and a drain of the SGT contain acceptor and donor impurities in a high concentration and the impurity concentration distribution can be sharply changed at the boundary between the P+ layer 96 and the Si pillar 85 compared with the case where the P+ layer 96 is formed by ion implantation. Thus, the diode junction resistance between the P+ layers 96 and 105 can be decreased. This can contribute to the driving of an SGT circuit at lower voltage and higher speed.

2. The P+ layers 96 and 105 can be formed using, for example, silicon-germanium (SiGe) as a base instead of the P+ layers 96 and 105 that use Si as a base. When the P+ layers 96 and 105 are formed of SiGe, the hole mobility can be improved because of stress generated in the Si pillar 85 serving as a channel. This further increases the speed of driving of a circuit.

3. The P+ layers 96 and 105, which are semiconductor layers, can be each independently formed by epitaxial crystal growth. Therefore, the P+ layer 96 and the P+ layer 105 can be easily formed using different semiconductor atoms as bases. This can further improve the characteristics of an SGT.

Seventh Embodiment

Figure 8A:
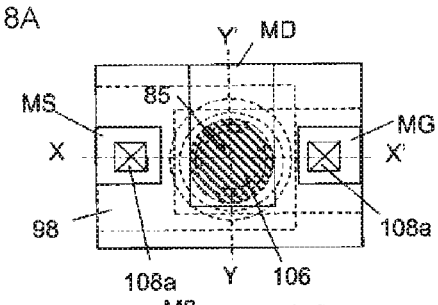
FIGS. 8A to 8C are a plan view and sectional views for describing a method for producing a pillar-shaped semiconductor device including an SGT according to a seventh embodiment of the present invention.

Hereafter, a method for producing a pillar-shaped semiconductor device including an SGT according to a seventh embodiment of the present invention will be described with reference to FIG. 8A to FIG. 8C. FIG. 8A is a plan view, FIG. 8B is a sectional view taken along line X-X' in FIG. 8A, and FIG. 8C is a sectional view taken along line Y-Y' in FIG. 8A.

Figure 8C:
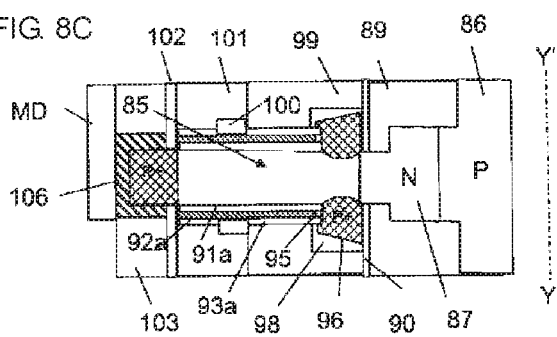
Figure 8B:
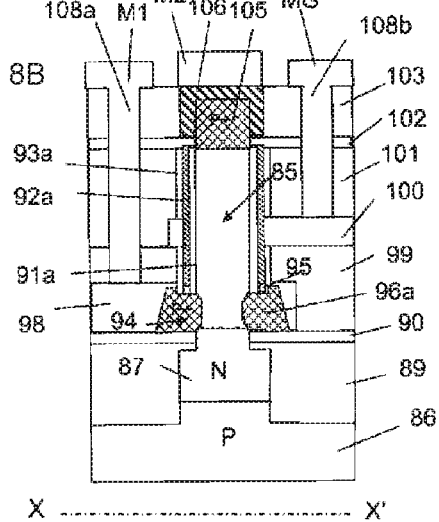

As illustrated in FIG. 8A to FIG. 8C, a portion of the Si pillar 85 whose side surface is in contact with the opening 94 is dented inward by performing etching or by oxidizing the side surface and then removing the resulting oxide film. A P+ layer 96 containing an acceptor impurity in a high concentration is formed by the epitaxial crystal growth of Si illustrated in FIG. 7AA to FIG. 7AC so as to be in contact with the side surface of the Si pillar 85 in the opening. Subsequently, an SGT is formed by performing the same processes as those illustrated in FIG. 7BA to FIG. 7BC.

The method for producing a pillar-shaped semiconductor device including an SGT according to this embodiment provides the following features.

1. Since the P+ layer 96a protrudes more inward than the periphery of the Si pillar 85 serving as a channel when viewed in plan, an electric field distribution is uniformly formed in the channel compared with the case illustrated in FIG. 7BA to FIG. 7BC. This is desirable for low-voltage driving of an SGT.

For example, when the P+ layers 96a and 105 are formed using SiGe as a base, stress for increasing hole mobility is easily generated in the Si pillar 85 serving as a channel. This improves the performance of an SGT. In this case, the P+ layer 105 is also desirably a SiGe layer.

Eighth Embodiment

Hereafter, a method for producing a pillar-shaped semiconductor device including an SGT according to an eighth embodiment of the present invention will be described with reference to FIGS. 9AA to 9DD. FIG. 9AA is a plan view, FIG. 9AB is a sectional view taken along line X-X' in FIG. 9AA, FIG. 9AC is a sectional view taken along line Y-Y' in FIG. 9AA, and FIG. 9AD is a sectional view taken along line Y2-Y2' in FIG. 9AA.

In the first embodiment, as illustrated in FIG. 2TA to FIG. 2TE, after the P+ layer 38a and the N+ layers 38b and 38c are formed, the SiO$_2$ layers 46a, 46b, 46c, 46d, and 46e are formed with an equal width in plan view so as to surround the side surfaces of the W layers 43a and 43b, the P+ layer 38a, and the N+ layers 38b and 38c, respectively. Then, as illustrated in FIG. 2UA to FIG. 2UE, the AlO layer 51 is formed so as to surround the side surfaces of the SiO$_2$ layers 46a, 46b, 46c, 46d, and 46e. In this embodiment, as illustrated in FIG. 9AA to FIG. 9AD, an SiN layer 35c is formed as in the first embodiment so as to surround the bottoms of the top portions of the W layers 43a and 43b whose W surfaces are exposed and the bottoms of the top portions of the Si pillars 6a, 6b, and 6c whose Si surfaces are exposed. Then, SiO$_2$ layers 111a, 111b, 111c, 111d, and 111e are formed with an equal width in plan view so as to surround the side surfaces of the top portions of the W layers 43a and 43b and the side surfaces of the top portions of the Si pillars 6a, 6b, and 6c. Then, an AlO layer 110 is formed on the peripheries of the SiO$_2$ layers 111a, 111b, 111c, 111d, and 111e.

Subsequently, as illustrated in FIG. 9BA to FIG. 9BD, an SiN/SiO$_2$ layer 113a and a resist layer 114a are formed so as to cover the Si pillars 6b and 6c when viewed in plan. The top portion of the Si pillar 6a is etched using the SiO$_2$ layer 111c, the AlO layer 110, the SiN/SiO$_2$ layer 113a, and the resist layer 114a as masks to form a recess 115a. The resist layer 114a is then removed.

Subsequently, as illustrated in FIG. 9CA to FIG. 9CD, a p+ layer (not illustrated) containing an acceptor impurity in a high concentration is formed on the Si pillar 6a at the bottom of the recess 115a by epitaxial crystal growth until the top of the P+ layer is positioned higher than the upper surface of the AlO layer 110. The top portion of the P+ layer and the SiN/SiO$_2$ layer 113a are removed by CMP to form a P+ layer 116a having an upper surface that is flush with the upper surface of the AlO layer 110. Thus, the P+ layer 116a is formed in a self-aligned manner for the Si pillar 6a. Then, an SiN/SiO$_2$ layer 113b and a resist layer 114b are formed so as to cover the Si pillar 6a when viewed in plan. The top portions of the Si pillars 6b and 6c are etched using the SiO$_2$ layers 111b and 111c, the AlO layer 110, the SiN/SiO$_2$ layer 113b, and the resist layer 114b as masks to form recesses 115b and 115c. The resist layer 114b is then removed.

Subsequently, as illustrated in FIG. 9DA to FIG. 9DD, an N+ layer (not illustrated) containing a donor impurity in a high concentration is formed on the Si pillars 6b and 6c at the bottoms of the recesses 115b and 115c by epitaxial crystal growth until the tops of the N+ layers are positioned higher than the upper surface of the AlO layer 110. The top portions of the N+ layers and the SiN/SiO$_2$ layer 113b are removed by CMP to form N+ layers 116b and 116c each having an upper surface that is flush with the upper surface of the AlO layer 110. Thus, the N+ layers 116b and 116c are formed in a self-aligned manner for the Si pillars 6b and 6c. Then, by performing the same processes as those illustrated in FIG. 2UA to FIG. 2ZE, a high-density SRAM cell circuit similar to that in the first embodiment is formed.

The method for producing a pillar-shaped semiconductor device including an SGT according to this embodiment provides the following features.

1. In the first embodiment, in order to form self-aligned contact holes 50a to 50e after the P$^+$ layer 38a and the N$^+$ layers 38b and 38c are formed by epitaxial crystal growth, the SiO$_2$ layers 46a to 46e are formed with an equal width so as to surround the side surfaces of the P$^+$ layer 38a and the N$^+$ layers 38b and 38c and the side surfaces of the top portions of the W layers 43a and 43b and then the AlO layer 51 is formed so as to surround the SiO$_2$ layers 46a to 46e. In this embodiment, before the P$^+$ layer 116a and the N$^+$ layers 116b and 116c are formed by epitaxial crystal growth, the SiO$_2$ layers 111a to 111e are formed with an equal width so as to surround the side surfaces of the top portions of the Si pillars 6a, 6b, and 6c not doped with a donor or acceptor impurity and the W layers 43a and 43b, and the AlO layer 110 is formed so as to surround the SiO$_2$ layers 111a to 111e. Then, the SiO$_2$ layers 111a to 111e are etched to form self-aligned contact holes (not illustrated). As described above, the SiO$_2$ layers 111a to 111e formed with an equal width so as to surround the side surfaces of the top portions of the Si pillars 6a, 6b, and 6c and the W layers 43a and 43b are used as etching masks for forming the recesses 115a, 115b, and 115c and also used for forming the self-aligned contact holes. Thus, the processes in this embodiment are simpler than those in the first embodiment.

2. In this embodiment, the P$^+$ layer 116a, the N$^+$ layers 116b and 116c, and the self-aligned contact holes (not illustrated) are formed so as to have the same shapes as those of the P$^+$ layer 38a, the N$^+$ layers 38b and 38c, and the self-aligned contact holes 50a to 50e in the first embodiment. This embodiment can be directly applied to the second to fifth embodiments that show the production method after the formation of the P$^+$ layer 38a, the N$^+$ layers 38b and 38c, and the self-aligned contact holes 50a to 50e and the sixth and seventh embodiments that show the production method before the formation of the P$^+$ layer 38a, the N$^+$ layers 38b and 38c, and the self-aligned contact holes 50a to 50e. This simplifies the circuit formation processes in the second to seventh embodiments.

3. In this embodiment, in FIG. 9AA to FIG. 9AD, SiO$_2$ layers 111c, 111d, and 111e and an AlO layer 110 can be formed so as to surround the side surfaces of the top portions of the Si pillars 6a, 6b, and 6c and the SiO$_2$ layers 5a, 5b, and 5c illustrated in FIG. 2LA to FIG. 2LD while the SiO$_2$ layers 5a, 5b, and 5c are left in the tops of the Si pillars 6a, 6b, and 6c. Then, by removing the SiO$_2$ layers 5a, 5b, and 5c and the SiO$_2$ layers 111c, 111d, and 111e by performing etching, the upper surfaces of the P$^+$ layer 116a and the N$^+$ layers 116b and 116c can be positioned lower than the upper surface of the AlO layer 110 as in the second embodiment. Thus, the diode PN junction resistance of the P$^+$ layer 116a and the N$^+$ layers 116b and 116c can be further reduced, which contributes to driving of an SGT circuit at lower voltage and higher speed.

In the embodiments according to the present invention, the SRAM cell circuit including an SGT has been described as an example, but the present invention can be applied to formation of other circuits including an SGT.

In the first to fifth embodiments and the eighth embodiment, two SGTs have been formed for each of the Si pillars 6a, 6b, and 6c, but the present invention can also be applied to formation of circuits including one or three or more SGTs. In the sixth and seventh embodiments, one SGT has been formed for the Si pillar 85, but the present invention can also be applied to the case where two or more SGTs are formed.

In the first embodiment, as illustrated in FIG. 2UA to FIG. 2UE, the contact holes 50a, 50b, 50c, 50d, and 50e have been formed using the AlO layer 51 as an etching mask while the tops of the Si pillars 6a, 6b, and 6c and the tops of the W layers 43a and 43b are left. However, the material for the etching mask (the AlO layer 51 is used in the first embodiment), the material for the semiconductor pillars (the Si pillars 6a, 6b, and 6c in the first embodiment), the material for other layers to be removed to form contact holes (the SiO$_2$ layers 46a, 46b, 46c, 46d, 46e, and 37 and the SiN layer 35c are used in the first embodiment), and the etching method may be freely selected as long as each purpose is accomplished. The same also applies to other embodiments of the present invention.

In the first embodiment, the SiN layer 35c has been formed on the SiO$_2$ layer 35b located on the peripheries of the Si pillars 6a, 6b, and 6c and the W layers 40a and 40b. Another material layer may be used as long as the material layer serves as an etching stop layer when the SiO$_2$ layers 46a, 46b, 46c, 46d, and 46e are etched using the AlO layer 51, the Si pillars 6a, 6b, and 6c, and the W layers 43a and 43b as masks instead of the SiN layer 35c. Instead of the SiN layer 35c, an insulating layer may be formed by oxidizing the upper ends of the TiN layers 18c, 18d, and 18e. Alternatively, the upper ends of the TiN layers 18c, 18d, and 18e are partly etched and an insulating layer may be embedded. The SiN layer 35c may be omitted as long as at least a material layer serving as an etching stop layer for etching of the SiO$_2$ layers 46c, 46d, and 46e is present below the SiO$_2$ layers 46c, 46d, and 46e. The materials for the SiN layer 35c, the SiO$_2$ layers 46a, 46b, 46c, 46d, and 46e, and the AlO layer 51 may be freely selected as long as each purpose is accomplished. The same also applies to other embodiments of the present invention.

In the first embodiment, the SiN layer 35c formed on the peripheries of the tops of the Si pillars 6a, 6b, and 6c may be another material layer having a single-layer structure or a multilayer structure as long as the purpose of the SiN layer 35c can be achieved. Instead of the SiN layer 35c that covers the entire surfaces of the peripheries of the tops of the Si pillars 6a, 6b, and 6c in the first embodiment, an insulating material layer may be used that covers at least the upper ends of the gate TiN layers 18c, 18d, and 18e serving as conductor layers, that serves as an etching stopper in the formation of the contact holes 50a to 50e by etching of the SiO$_2$ layers 46a to 46e in FIG. 2UA to FIG. 2UE, and that has a single-layer structure or a multilayer structure. The same also applies to other embodiments of the present invention.

In the first embodiment, the SiO$_2$ layer 35b and the SiN layer 35c have been separately formed. However, for example, after the HfO$_2$ layers 11b, 11c, and 11d, the TiN layers 18b, 18c, and 18d, and the SiO$_2$ layers 14b, 14c, and 14d on the tops of the Si pillars 6a, 6b, and 6c in a vertical direction are removed, an SiN layer that serves as both the SiO$_2$ layer 35b and the SiN layer 35c may be formed. The same also applies to other embodiments of the present invention.

In the first embodiment, as illustrated in FIG. 2NA to FIG. 2QE, first, the recess 38AA has been formed on the Si pillar 6a and then the P$^+$ layer 38a has been formed in the recess 38AA by epitaxial crystal growth. Subsequently, the recesses 38BB and 38CC have been formed on the Si pillars 6b and 6c, respectively, and then the N$^+$ layers 38b and 38c have been formed in the recesses 38BB and 38CC by epitaxial crystal growth. Alternatively, the recesses 38AA, 38BB, and 38CC are simultaneously formed, and then one of the recess 38AA and the recesses 38BB and 38CC is filled with an $SiO_2$ layer by, for example, flowable CVD (Flowable Chemical Vapor Deposition) and the $P^+$ layer 38a or the $N^+$ layers 38b and 38c may be formed. Since the flowable CVD-$SiO_2$ layer has a higher etching rate than typical CVD-$SiO_2$ layers, recesses serving as portions subjected to epitaxial crystal growth can be easily formed. As described above, the formation of the recesses 38AA, 38BB, and 38CC by etching the tops of the Si pillars 6a, 6b, and 6c and the formation of the $P^+$ layer 38a and the $N^+$ layers 38b and 38c on the Si pillars 6a, 6b, and 6c may be performed by another method. The same also applies to other embodiments of the present invention.

In the first embodiment, the $P^+$ layer 38a and the $N^+$ layers 38b and 38c have been formed by epitaxial crystal growth. The method for forming the $P^+$ layer 38a and the $N^+$ layers 38b and 38c is not limited to CVD, but may be, for example, molecular beam deposition, ALD, or liquid phase epitaxial growth. The same also applies to other embodiments of the present invention.

In the first embodiment, as illustrated in FIG. 2QA to FIG. 2QE, the $P^+$ layer 38a and the $N^+$ layers 38b and 38c have been formed such that the bottoms of the $P^+$ layer 38a and the $N^+$ layers 38b and 38c are flush with the upper end of the gate $HfO_2$ layer in the vertical direction. The bottoms of the $P^+$ layer 38a and the $N^+$ layers 38b and 38c may be positioned higher or lower than the upper end of the gate $HfO_2$ layer as long as the SGTs are operated without problems. The same also applies to other embodiments of the present invention.

In the first embodiment, an insulating layer may be formed at least on the tops of the gate TiN layers 18c, 18d, and 18e before formation of the SiN layer 35c in FIG. 2NA to FIG. 2ND to achieve insulation between the $P^+$ layer 38a, the $N^+$ layers 38b and 38c, and the W layers 52c, 52d, and 52e and the gate TiN layers 18c, 18d, and 18e with more certainty. The insulating layer may be formed by oxidizing the upper ends of the gate TiN layers 18c, 18d, and 18e. Alternatively, the upper ends of the gate TiN layers 18c, 18d, and 18e are etched to form recesses and the recesses may be filled with an insulating layer. The same also applies to other embodiments of the present invention.

In the first embodiment, as illustrated in FIG. 2NA to FIG. 2ND, the SiN layer 35c is formed on the $SiO_2$ layer 35b on the peripheries of the Si pillars 6a, 6b, and 6c. An $SiO_2$ film (not illustrated) is entirely formed, and then an $SiO_2$ layer 35d which has a flat surface and whose upper surface is flush with the tops of the Si pillars 6a, 6b, and 6c is formed by CMP. An SiN/$SiO_2$ layer (not illustrated) including an SiN layer as a lower layer and an $SiO_2$ layer as an upper layer is entirely formed. An SiN/$SiO_2$ layer 35e is formed below a resist layer 37a by lithography and RIE. The SiN/$SiO_2$ layer 35e is an etching mask for forming the recess 38AA by etching the top of the Si pillar 6a. This etching mask may be formed by another method as long as the purpose of the etching mask is achieved. For example, the following method may be employed. The $SiO_2$ layer 35d having a flat surface is formed so as to have an upper surface positioned higher than the tops of the Si pillars 6a, 6b, and 6c. Then, the resist layer 37a is formed and the $SiO_2$ layer 35d is etched using the resist layer 37a as a mask until the upper surface reaches the upper surfaces of the Si pillars 6a, 6b, and 6c. The same also applies to other embodiments of the present invention.

In the first embodiment, the $P^+$ layer 33a and the $N^+$ layers 33b and 33c may be formed by another method. For example, in FIG. 2AA to FIG. 2AD, a $P^+$ impurity region containing an acceptor impurity and an $N^+$ impurity region containing a donor impurity may be formed on the $SiO_2$ layer 3 in plan view by epitaxial growth or ion implantation. Alternatively, another semiconductor material such as SiGe may be used instead of Si for the $P^+$ impurity region and the $N^+$ impurity region. The same also applies to other embodiments of the present invention.

In the first embodiment, as illustrated in FIG. 2TA to FIG. 2TD, the $SiO_2$ layer (not illustrated) entirely formed by CVD has been etched by RIE to the upper surface of the SiN layer 35c. Thus, the $SiO_2$ layers 46a and 46b have been left on the side surfaces of the W layers 43a and 43b. At the same time, the $SiO_2$ layers 46c, 46d, and 46e have been left on the side surfaces of the $P^+$ layer 38a and the $N^+$ layers 38b and 38c. The method for entirely forming the $SiO_2$ layer (not illustrated) is not limited to CVD, but may be another method such as ALD. The method for forming the $SiO_2$ layers 46c, 46d, and 46e is not limited to RIE, but may be another method as long as the $SiO_2$ layers 46c, 46d, and 46e can be formed with an equal width so as to surround the side surfaces of the $P^+$ layer 38a and the $N^+$ layers 38b and 38c.

In the first embodiment, the source impurity regions at the bottoms of the Si pillars 6a, 6b, and 6c that constitute the source $P^+$ layer 8aa and the source $N^+$ layers 8bb and 8cc for the lower SGT and the wiring conductor layers connected to each other in the horizontal direction have been formed of the same material layer. However, for example, the wiring conductor layers may be formed of another material layer having a single-layer structure or a multilayer structure, such as a silicide layer, a metal layer, or a semiconductor layer containing an impurity atom in a high concentration. The same also applies to other embodiments of the present invention.

In the first embodiment, the contact holes 40a and 40b have been formed in a region in which the NiSi layer 28aa serving as a lower wiring conductor layer, the NiSi layer 28bb serving as an intermediate wiring conductor layer, and the NiSi layer 36a serving as an upper wiring conductor layer overlap each other when viewed in plan. In this case, the NiSi layer 28aa is connected to the drain $N^+$ layer 31b of the lower SGT, the NiSi layer 28bb is connected to the drain $N^+$ layer 33b of the upper SGT, and the NiSi layer 36a is connected to the gate TiN layer 18d of the upper SGT. The combination of a source impurity region, a drain impurity region, and a gate conductor layer, of an SGT, that are connected to the upper wiring conductor layer, the intermediate wiring conductor layer, and the lower wiring conductor layer can be appropriately changed in accordance with the design of a circuit including an SGT. The same also applies to other embodiments of the present invention.

In the first embodiment, the shape of the side surface of the NiSi layer 28bb insulated by the $SiO_2$ layer 41a has matched that of the periphery of the contact hole 40a when viewed in plan. However, the side surface of the NiSi layer 28bb may be present outside the contact hole 40a. This can decrease the capacitance between the NiSi layers 28aa and 28bb. Similarly, the shape of the side surface of the NiSi layer 28aa insulated by the $SiO_2$ layer 41b has matched that of the periphery of the contact hole 40b when viewed in plan. However, the side surface of the NiSi layer 28aa may be present outside the contact hole 40b. This can decrease the capacitance between the NiSi layer 28aa and the TiN layer 18a. This is also effective for formation of circuits other than the SRAM cell circuit. The same also applies to other embodiments of the present invention.

In the first embodiment, the contact hole 40a is formed so as to extend from the SiO₂ layer 35d serving as an uppermost layer to the upper surface of the NiSi layer 28aa and the contact hole 40b is formed so as to extend from the SiO₂ layer 35d to the upper surface of the TiN layer 18a. However, it is obvious that the contact hole 40a may be overetched to the inside of the NiSi layer 28aa and the contact hole 40b may be overetched to the inside of the TiN layer 18a. The same also applies to other embodiments of the present invention.

In the first embodiment, as a result of the silicidation of the P-type poly-Si layers 22a and 22b and the N⁺-type poly-Si layers 26a and 26b using Ni atoms in the Ni layers 21a and 21b, the NiSi layers 28a and 28b are caused to expand into the spaces 25a, 25b, and 25c so as to be connected to the side surfaces of the Si pillars 6a, 6b, and 6c. Then, donor and acceptor impurities are diffused into the Si pillars 6a, 6b, and 6c by performing heat treatment to form the N⁺ layers 31b, 31c, 32b, and 32c and the P⁺ layers 31a and 33a. At the same time, the NiSi layers 28aa and 28bb serving as wiring conductor layers are formed by silicidation of the P-type poly-Si layers 22a and 22b and the N⁺-type poly-Si layers 26a and 26b. The N⁺ layers 31b, 31c, 32b, and 32c, the P⁺ layers 31a and 33a, and the NiSi layers 28aa and 28bb serving as wiring conductor layers may be formed by another method. For example, a material layer used may be changed. This is also applicable to the NiSi layers 36a and 36b connected to the TiN layers 18c, 18d, and 18e and serving as wiring conductor layers. The same also applies to other embodiments of the present invention.

In the first embodiment, the SiO₂ layer 41a is formed on the side surface of the NiSi layer 36a that serves as an upper wiring conductor layer and faces the side surface of the contact hole 40a and the SiO₂ layer 41b is formed on the side surface of the NiSi layer 28bb that serves as an upper wiring conductor layer and faces the side surface of the contact hole 40b. However, the SiO₂ layers 41a and 41b may be removed from the side surfaces of the NiSi layers 36a and 28bb by overetching of RIE, respectively. The same also applies to other embodiments of the present invention.

In the first to fifth embodiments, the SRAM cell circuit has been formed by forming the Si pillars 6a, 6b, and 6c on the SiO₂ layer substrate 1. However, another substrate such as an SOI (Silicon on Insulator) substrate or a Si substrate may be used instead of the SiO₂ layer substrate 1. In the case of a Si substrate, a well structure corresponding to a source/drain N⁺ layer or P⁺ layer at the bottoms of the Si pillars 6a, 6b, and 6c may be formed in a surface layer of the Si substrate. In the sixth embodiment, the description has been made using a well structure, but an SiO₂ layer substrate or an SOI substrate may be used.

Each of the SiO₂ layers 46a, 46b, 46c, 46d, and 46e and the W layers 52a, 52b, 52c, 52d, and 52e in the first embodiment, each of the NiSi layers 62a, 62b, 62c, 62d, and 62e in the second embodiment, and each of the Si layers 67a, 67b, 67c, 67d, and 67e in the third embodiment is formed so as to surround one of the Si pillars 6a, 6b, and 6c and the W layers 43a and 43b in a tubular shape when viewed in plan. However, the shapes of these layers are not limited to a tubular shape. The external form of the sectional shape of each of the above structures in plan view may be dependent on (e.g., may be similar to) the sectional shape of the corresponding Si pillars 6a, 6b, and 6c and W layers 43a and 43b. For example, if the sectional shape of the Si pillars 6a, 6b, and 6c and the W layers 43a and 43b is a square, the external form may be a square or a rectangle. If the sectional shape of the Si pillars 6a, 6b, and 6c and the W layers 43a and 43b is an ellipse, the external form may be an ellipse, a circle, or an oval. Alternatively, the sectional shape of each of the above structures in plan view may be any shape that surrounds the corresponding Si pillars 6a, 6b, and 6c and W layers 43a and 43b. The same also applies to other embodiments of the present invention.

In the first embodiment, the connection between the side surfaces of the Si pillars 6a, 6b, and 6c and the NiSi layers 28aa and 28bb, the formation of the NiSi layers 30a, 30b, 30c, 32a, 32b, and 32c in the Si pillars 6a, 6b, and 6c, and the formation of the P⁺ layers 31a and 33a and the N⁺ layers 31b, 31c, 33b, and 33c have been performed by heat treatment illustrated in FIG. 2KA to FIG. 2KD. The formation of these structures by heat treatment may be delayed relative to the timing in the first embodiment, and may be performed by the final production process for SGTs. The same also applies to other embodiments of the present invention.

The method for forming the openings 19a, 19b, and 19c described in the first embodiment may be performed by another method. For example, the material layer and process for forming the openings 19a, 19b, and 19c may be changed. The same also applies to other embodiments of the present invention.

In the first embodiment, the W layers (including a buffer metal layer) 52a to 52e have been formed so as to surround the W layers 43a and 43b, the P⁺ layer 38a, and the N⁺ layers 38b and 38c, respectively. Instead of the W layers 52a to 52e, a conductor layer having a single-layer structure or a multilayer structure, such as a metal layer other than the W layer, an alloy layer, or a semiconductor layer containing a donor or acceptor impurity atom, may be used. The same also applies to other embodiments of the present invention. The W layers 52a to 52e have been formed by depositing a W layer (not illustrated) inside the contact holes 50c, 50d, 50e, 50aa, and 50bb and on the AlO layer 51 by ALD and polishing the W layer by CMP so that the upper surface of the W layer is flush with the tops of the P⁺ layer 38a and the N⁺ layers 38b and 38c and the W layers 43a and 43b as illustrated in FIG. 2WA to FIG. 2WE. Alternatively, a metal layer such as a W layer, an alloy layer, or a semiconductor layer containing a donor or acceptor impurity in a high concentration may be formed by another method such as chemical dry etching (CDE) that causes less damage. The same also applies to other embodiments according to the present invention.

In the second embodiment, as illustrated in FIG. 3CA to FIG. 3CD, after the removal of the SiO₂ layers 46a to 46e, the W layer (not illustrated, including a thin buffer metal layer) has been entirely formed such that the upper surface of the W layer is positioned higher than the upper surface of the AlO layer 71. The two-layer metal layer including the buffer metal layer and the W layer does not necessarily cover the side surfaces and tops of the P⁺ layer 38A and the N⁺ layers 38B and 38C in a uniform manner. For example, only the buffer metal layer may be formed on the side surfaces of the P⁺ layer 38A and the N⁺ layers 38B and 38C.

In the third embodiment, before the formation of the W layers 76a, 76b, 76c, 77a, and 77b, the Ti layer or the TiN layer serving as a buffer conductor layer and entirely formed has been planarized by CMP or CDE so as to have an upper surface that is flush with the upper surface of the AlO layer 71. Alternatively, the Ti layer or the TiN layer is formed such that the upper surface of the Ti layer or the TiN layer on the Si pillars 6a, 6b, and 6c is positioned lower than the upper surface of the AlO layer 71 and then a W layer is continuously formed. The Ti layer or the TiN layer and the W layer are planarized by CMP to the position corresponding to the upper surface of the AlO layer 71. Thus, the W layer can be formed between the buffer conductor layer 74a and the W layer 76a, between the buffer conductor layer 74b and the W layer 76b, and between the buffer conductor layer 74c and the W layer 76c. The contact resistance between the buffer conductor layer 74a and the W layer 76a, between the buffer conductor layer 74b and the W layer 76b, and between the buffer conductor layer 74c and the W layer 76c can also be decreased by this method. The same also applies to the fourth embodiment.

In the sixth and seventh embodiments, the P$^+$ layer 96 containing an acceptor impurity has been formed so as to be in contact with the side surface of the Si pillar 85. In this case, the acceptor impurity in the P$^+$ layer 96 is diffused into the surface layer of the Si pillar 85 by heat treatment performed later. The diffusion of the impurity poses no problem as long as the diffusion is controlled such that the characteristics of the SGT are not impaired.

In the sixth and seventh embodiments, the P$^+$ layers 96 and 96a containing an acceptor impurity have been formed so as to be in contact with the side surface of the Si pillar 85. An N$^+$ layer may be formed instead of the P$^+$ layers 96 and 96a. Alternatively, a plurality of semiconductor pillars are formed on a substrate, and the P$^+$ layers 96 and 96a and the N$^+$ layer made of different semiconductor bases may be formed.

In the sixth and seventh embodiments, the N layer 87 serving as a barrier layer for preventing the leakage of an electric current flowing between the P$^+$ layers 105 and 96 to the P layer 86 is formed at the bottom of the Si pillar 85. However, another structure may be employed as long as the barrier effect can be provided. For example, an SiO$_2$ layer may be formed instead of the N layer 87. In this case, the SiO$_2$ layer may extend to the inside of the P layer 86 or may extend to a surface layer of the P layer 86 on the periphery of the Si pillar 85 when viewed in plan. Alternatively, an SOI substrate may be used instead of the N layer and the P layer substrate 86.

In the sixth embodiment, the opening 94, the HfO$_2$ layer 91, the TiN layer 92, and the SiO$_2$ layer 93 have been formed by etching the SiO$_2$ layer, the TiN layer, and the HfO$_2$ layer on the periphery of the lower portion of the Si pillar 85. Then, the insulating layer 95 has been formed at the edge of the TiN layer 92 facing the opening 94. The insulating layer 95 is a layer for electrically insulating the TiN layer 92 and the P$^+$ layer 96. This electric insulation may be achieved by employing another structure. For example, before formation of the opening 94, an SiO$_2$ layer and an SiN layer may be formed in a layered manner so as to surround the periphery of the Si pillar 85 and then etched so as to surround the Si pillar 85 with an equal width when viewed in plan. Then, the SiO$_2$ layer may be etched to form the opening 94. In this case, the SiN layer serves as an insulating layer between the TiN layer 92a and the P$^+$ layer 96. The HfO$_2$ layer 91, the TiN layer 92, and the SiO$_2$ layer 93 are formed so as to surround the Si pillar 85 after the SiO$_2$ layer and the SiN layer are formed in a layered manner. Alternatively, another method may be employed. The same also applies to the seventh embodiment.

In the eighth embodiment, as illustrated in FIG. 9AA to FIG. 9AD, the SiO$_2$ layers 111c, 111d, and 111e and the AlO layer 110 can be formed so as to surround the side surfaces of the tops of the Si pillars 6a, 6b, and 6c and the SiO$_2$ layers 5a, 5b, and 5c illustrated in FIG. 2LA to FIG. 2LD while the SiO$_2$ layers 5a, 5b, and 5c are left on the tops of the Si pillars 6a, 6b, and 6c. Then, by removing the SiO$_2$ layers 5a, 5b, and 5c and the SiO$_2$ layers 111c, 111d, and 111e by performing etching, the upper surfaces of the P$^+$ layer 116a and the N$^+$ layers 116b and 116c can be positioned lower than the upper surface of the AlO layer 110 as in the second embodiment. The same also applies to other embodiments of the present invention.

In the eighth embodiment, unlike the first embodiment, the recesses 115a, 115b, and 115c have been formed by etching the tops of the Si pillars 6a, 6b, and 6c using the SiO$_2$ layers 111a, 111b, and 111c and the AlO layer 110 as masks. The same also applies to other embodiments of the present invention.

In each of the above embodiments, the case where Si (silicon) is used for semiconductor regions such as a channel, a source, and a drain in the semiconductor pillar has been described. However, the technical idea of the present invention can also be applied to semiconductor devices including an SGT that uses a semiconductor material containing Si, such as SiGe, or a semiconductor material other than Si.

In the first embodiment, the gate conductor layer has been constituted by the TiN layers 18a, 18b, 18c, and 18d. However, the gate conductor layer may be formed of another metal material. Alternatively, the gate conductor layer may have a multilayer structure including a metal layer and, for example, a poly-Si layer. The same also applies to other embodiments of the present invention.

The vertical NAND-type flash memory circuit includes a plurality of memory cells stacked in the vertical direction, the memory cells each including a semiconductor pillar as a channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source, and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention can also be applied to NAND-type flash memory circuits.

In the first embodiment, the source and drain of the SGT are formed in impurity regions of the same polarity, but the SGT may be formed as a tunnel effect SGT including impurity regions of different conductivity types. The same also applies to other embodiments of the present invention.

In the present invention, various embodiments and modifications can be made without departing from the broad spirit and scope of the present invention. The above-described embodiments are provided to describe examples of the present invention, and thus do not limit the scope of the present invention. The above-described embodiments and modifications can be freely combined with each other. The above-described embodiments from which some elements are omitted as necessary still fall within the technical idea of the present invention.

The method for producing a pillar-shaped semiconductor device according to the present invention provides a high-performance pillar-shaped semiconductor device.

What is claimed is:
1. A method for producing a pillar-shaped semiconductor device including a substrate, the method comprising:
   a step of forming a first semiconductor pillar that extends in a direction vertical to the substrate;

a step of forming a first gate insulating layer that surrounds a periphery of the first semiconductor pillar;

a step of forming a first gate conductor layer that surrounds the first gate insulating layer;

a step of forming a first impurity region that is in contact with an inside or a side surface of the first semiconductor pillar, the first impurity region having an upper end positioned at a lower end of the first gate insulating layer in the vertical direction;

a step of forming a first insulating layer having an upper surface positioned higher than an upper end of the first gate conductor layer and lower than a top of the first semiconductor pillar in the vertical direction;

a step of forming a first material layer that surrounds a side surface of an upper portion of the first semiconductor pillar, the upper portion being exposed at a position higher than an upper surface of the first insulating layer;

a step of forming a recess by etching a top portion of the first semiconductor pillar using the first material layer as a mask;

a step of forming, in the recess, a second impurity region containing a donor or acceptor impurity by epitaxial crystal growth;

a step of removing the first material layer;

a step of forming a second material layer that surrounds a side surface of the second impurity region positioned higher than the first insulating layer;

a step of forming a third material layer on a periphery of the second material layer;

a step of forming a first contact hole having a bottom on the first insulating layer by etching the second material layer using the third material layer and the second impurity region as etching masks; and a step of filling the first contact hole with a first conductor material layer having electrical conductivity and having a single-layer structure or a multilayer structure.

2. The method for producing a pillar-shaped semiconductor device according to claim 1, the method comprising:

a step of forming the second impurity region such that an upper surface of the second impurity region is positioned lower than an upper surface of the second material layer; and a step of forming a second conductor material layer having electrical conductivity and having a single-layer structure or a multilayer structure such that the second conductor material layer fills the first contact hole and covers a side surface and an upper surface of the second impurity region.

3. The method for producing a pillar-shaped semiconductor device according to claim 1, the method comprising:

a step of forming a third conductor material layer having electrical conductivity and having a single-layer structure or a multilayer structure such that the third conductor material layer fills the first contact hole and covers a side surface and an upper surface of the second impurity region and an upper surface of the third material layer;

a step of polishing the third conductor material layer such that an upper surface of the third conductor material layer is flush with an upper surface of the second material layer; and a step of forming a first wiring conductor layer connected to the third conductor material layer.

4. The method for producing a pillar-shaped semiconductor device according to claim 2, the method comprising:

a step of forming a fourth conductor material layer on the second conductor material layer by performing selective growth.

5. The method for producing a pillar-shaped semiconductor device according to claim 2, the method comprising:

a step of forming the second conductor material layer by performing selective growth.

6. The method for producing a pillar-shaped semiconductor device according to claim 1, the method comprising:

a step of forming a fifth conductor material layer having electrical conductivity and having a single-layer structure or a multilayer structure such that the fifth conductor material layer fills the first contact hole, covers a side surface and an upper surface of the second impurity region, and has an upper surface positioned higher than an upper surface of the third material layer; and a step of forming a second wiring conductor layer on the fifth conductor material layer.

7. The method for producing a pillar-shaped semiconductor device according to claim 1, the method comprising:

a step of forming a second insulating layer that surrounds the first gate conductor layer;

a step of forming an opening that extends through the second insulating layer, the gate conductor layer, and the gate insulating layer at a lower part of the first semiconductor pillar;

a step of forming a third insulating layer that covers at least an end face of the gate conductor layer, the end face facing the opening, before or after the opening is formed; and a step of forming, by selective epitaxial crystal growth, a first impurity region that contains a donor or acceptor impurity and extends in a horizontal direction so as to be in contact with a side surface of the first semiconductor pillar in the opening.

8. The method for producing a pillar-shaped semiconductor device according to claim 7, the method further comprising:

a step of forming the first impurity region such that a periphery of the first impurity region protrudes more outward than a periphery of the second insulating layer when viewed in plan.

9. The method for producing a pillar-shaped semiconductor device according to claim 7, wherein at least one of the first impurity region and the second impurity region is formed of a semiconductor base different from a semiconductor base for the first semiconductor pillar.

10. The method for producing a pillar-shaped semiconductor device according to claim 1, the method further comprising:

a step of forming a second semiconductor pillar that stands next to the first semiconductor pillar on the substrate, a second gate insulating layer that surrounds a periphery of the second semiconductor pillar, and a second gate conductor layer that surrounds the second gate insulating layer;

a step of forming, on the second semiconductor pillar, a third impurity region containing a donor or acceptor impurity by performing epitaxial crystal growth using the same step as the step of forming a second impurity region;

a step of forming, at a lower part of the first semiconductor pillar, a fourth impurity region inside the first semiconductor pillar or a fourth impurity region connected to a side surface of the first semiconductor pillar;

a step of forming, at a lower part of the second semiconductor pillar, a fifth impurity region inside the second semiconductor pillar or a fifth impurity region connected to a side surface of the second semiconductor pillar;

a step of providing a stacked structure including a second wiring conductor layer, a third wiring conductor layer, and a fourth wiring conductor layer that are each connected to different parts selected from the first gate conductor layer, the second gate conductor layer, the first impurity region, the third impurity region, the fourth impurity region, and the fifth impurity region, that extend in a direction horizontal to the substrate, that at least partly overlap each other when viewed in plan, and that are present in this order from above;

a step of forming a second contact hole that extends from an upper surface of the third material layer to an upper surface or an inside of the fourth wiring conductor layer through the second wiring conductor layer and the third wiring conductor layer;

a step of forming a first tubular insulating layer on a side surface of the third wiring conductor layer, the side surface being exposed in the second contact hole;

a step of filling the second contact hole with a sixth conductive material layer having electrical conductivity;

a step of exposing a side surface of an upper portion of the sixth conductive material layer, wherein the step of forming a second material layer includes a step of forming a fourth material layer that surrounds a side surface of the sixth conductive material layer, and the step of forming a third material layer includes a step of forming a fifth material layer that surrounds the fourth material layer;

a step of forming a third contact hole that extends to an upper surface of the second conductor material layer by etching the fourth material layer using the fifth material layer as an etching mask; and a step of forming a seventh conductor material layer having electrical conductivity in the third contact hole.

11. The method for producing a pillar-shaped semiconductor device according to claim 10, the method further comprising:

a step of forming a fourth contact hole that is present at a place where the first contact hole, the second contact hole, and the third contact hole are not formed when viewed in plan, that is connected to a fifth wiring conductor layer extending in a horizontal direction so as to be connected to any one of the first gate conductor layer, the second gate conductor layer, the fourth impurity region, and the fifth impurity region, and that extends downward from a surface of the third material layer; and a step of filling the fourth contact hole with an eighth conductive material layer.

12. The method for producing a pillar-shaped semiconductor device according to claim 10, wherein a side surface of the third wiring conductor layer facing the second contact hole protrudes more outward than a side surface of the second wiring conductor layer when viewed in plan.

13. A method for producing a pillar-shaped semiconductor device, the method comprising:

a step of forming a first semiconductor pillar that extends in a direction vertical to the substrate;

a step of forming a first gate insulating layer that surrounds a periphery of the first semiconductor pillar;

a step of forming a first gate conductor layer that surrounds the first gate insulating layer;

a step of forming a first impurity region that is in contact with an inside or a side surface of the first semiconductor pillar, the first impurity region having an upper end positioned at a lower end of the first gate insulating layer in the direction vertical to the substrate;

a step of forming a first insulating layer having an upper surface positioned higher than an upper end of the first gate conductor layer and lower than a top of the first semiconductor pillar in the vertical direction;

a step of forming a first material layer that surrounds a side surface of an upper portion of the semiconductor pillar with an equal width when viewed in plan, the upper portion being exposed at a position higher than an upper surface of the first insulating layer;

a step of forming a second material layer that surrounds the first material layer;

a step of forming a recess by etching a top portion of the semiconductor pillar using the first material layer and the second material layer as masks;

a step of forming, in the recess, a second impurity region containing a donor or acceptor impurity by epitaxial crystal growth;

a step of forming a first contact hole that is present between the second material layer and the second impurity region and has a bottom on the first insulating layer by etching the first material layer; and a step of filling the first contact hole with a first conductor material layer having electrical conductivity and having a single-layer structure or a multilayer structure.

14. The method for producing a pillar-shaped semiconductor device according to claim 13, the method comprising:

a step of forming the second impurity region such that an upper surface of the second impurity region is positioned lower than an upper surface of the first material layer; and a step of forming a second conductor material layer having electrical conductivity and having a single-layer structure or a multilayer structure such that the second conductor material layer fills the first contact hole and covers a side surface and an upper surface of the second impurity region.

15. The method for producing a pillar-shaped semiconductor device according to claim 13, the method comprising:

a step of forming a third conductor material layer having electrical conductivity and having a single-layer structure or a multilayer structure such that the third conductor material layer fills the first contact hole and covers a side surface and an upper surface of the second impurity region and an upper surface of the second material layer;

a step of polishing the third conductor material layer such that an upper surface of the third conductor material layer is flush with an upper surface of the second material layer; and a step of forming a first wiring conductor layer connected to the third conductor material layer.

16. The method for producing a pillar-shaped semiconductor device according to claim 14, the method comprising:

a step of forming a fourth conductor material layer on the second conductor material layer by performing selective growth.

17. The method for producing a pillar-shaped semiconductor device according to claim 14, the method comprising:
a step of forming the second conductor material layer by performing selective growth.

18. The method for producing a pillar-shaped semiconductor device according to claim 13, the method comprising:
a step of forming a fifth conductor material layer having electrical conductivity and having a single-layer structure or a multilayer structure such that the fifth conductor material layer fills the first contact hole, covers a side surface and an upper surface of the second impurity region, and has an upper surface positioned higher than an upper surface of the second material layer; and
a step of forming a second wiring conductor layer on the fifth conductor material layer.

19. The method for producing a pillar-shaped semiconductor device according to claim 13, the method comprising:
a step of forming a second insulating layer that surrounds the first gate conductor layer;
a step of forming an opening that extends through the second insulating layer, the gate conductor layer, and the gate insulating layer at a lower part of the first semiconductor pillar;
a step of forming a third insulating layer that covers at least an end face of the gate conductor layer before or after the opening is formed; and
a step of forming, by selective epitaxial crystal growth, a first impurity region that contains a donor or acceptor impurity and extends in a horizontal direction so as to be in contact with a side surface of the first semiconductor pillar in the opening.

20. The method for producing a pillar-shaped semiconductor device according to claim 19, the method further comprising:
a step of forming the first impurity region such that a periphery of the first impurity region protrudes more outward than a periphery of the second insulating layer when viewed in plan.

21. The method for producing a pillar-shaped semiconductor device according to claim 19,
wherein at least one of the first impurity region and the second impurity region is formed of a semiconductor base different from a semiconductor base for the first semiconductor pillar.

22. The method for producing a pillar-shaped semiconductor device according to claim 13, the method further comprising:
a step of forming a second semiconductor pillar that stands next to the first semiconductor pillar on the substrate, a second gate insulating layer that surrounds a periphery of the second semiconductor pillar, and a second gate conductor layer that surrounds the second gate insulating layer;
a step of forming, on the second semiconductor pillar, a third impurity region containing a donor or acceptor impurity by performing epitaxial crystal growth using the same step as the step of forming a second impurity region;
a step of forming, at a lower part of the first semiconductor pillar, a fourth impurity region inside the first semiconductor pillar or a fourth impurity region connected to a side surface of the first semiconductor pillar;
a step of forming, at a lower part of the second semiconductor pillar, a fifth impurity region inside the second semiconductor pillar or a fifth impurity region connected to a side surface of the second semiconductor pillar;
a step of providing a stacked structure including a second wiring conductor layer, a third wiring conductor layer, and a fourth wiring conductor layer that are each connected to different parts selected from the first gate conductor layer, the second gate conductor layer, the second impurity region, the third impurity region, the fourth impurity region, and the fifth impurity region, that extend in a direction horizontal to the substrate, that at least partly overlap each other when viewed in plan, and that are present in this order from above;
a step of forming a second contact hole that extends from an upper surface of the second material layer to an upper surface or an inside of the fourth wiring conductor layer through the second wiring conductor layer and the third wiring conductor layer;
a step of forming a first tubular insulating layer on a side surface of the third wiring conductor layer, the side surface being exposed in the second contact hole;
a step of filling the second contact hole with a sixth conductor material layer having electrical conductivity;
a step of exposing a side surface of an upper portion of the sixth conductor material layer,
wherein the step of forming a first material layer includes a step of forming a third material layer that surrounds a side surface of the sixth conductor material layer, and
the step of forming a second material layer includes a step of forming a fourth material layer that surrounds the third material layer;
a step of forming a third contact hole that extends to an upper surface of the second wiring conductor layer and an upper surface of the sixth conductor material layer by etching the third material layer using the fourth material layer as an etching mask; and
a step of forming a seventh conductor material layer having electrical conductivity in the third contact hole.

23. The method for producing a pillar-shaped semiconductor device according to claim 22, the method further comprising:
a step of forming a fourth contact hole that is present at a place where the first contact hole, the second contact hole, and the third contact hole are not formed when viewed in plan, that is connected to a fifth wiring conductor layer extending in a horizontal direction so as to be connected to any one of the first gate conductor layer, the second gate conductor layer, the fourth impurity region, and the fifth impurity region, and that extends downward from a surface of the second material layer; and
a step of filling the fourth contact hole with an eighth conductor material layer.

24. The method for producing a pillar-shaped semiconductor device according to claim 22,
wherein a side surface of the third wiring conductor layer facing the second contact hole protrudes more outward than a side surface of the second wiring conductor layer when viewed in plan.

* * * * *